United States Patent [19]
Mitani et al.

[11] Patent Number: 5,864,161
[45] Date of Patent: Jan. 26, 1999

[54] SEMICONDUCTOR DEVICE AND MANUFACTURING METHOD THEREOF

[75] Inventors: Yuichiro Mitani; Ichiro Mizushima, both of Yokohama; Shigeru Kambayashi, Kawasaki, all of Japan; Hirotaka Nishino, Pittsburgh, Pa.; Masahiro Kashiwagi, Yokohama, Japan

[73] Assignee: Kabushiki Kaisha Toshiba, Kawasaki, Japan

[21] Appl. No.: 526,696

[22] Filed: Sep. 11, 1995

[30] Foreign Application Priority Data

Sep. 13, 1994 [JP] Japan .................................. 6-218502
Sep. 29, 1994 [JP] Japan .................................. 6-233934
Mar. 17, 1995 [JP] Japan .................................. 7-084501

[51] Int. Cl.$^6$ .......................... H01L 27/01; H01L 27/12; H01L 29/76
[52] U.S. Cl. ......................... 257/347; 257/348; 257/384
[58] Field of Search ..................................... 257/347, 348, 257/349, 350, 351

[56] References Cited

U.S. PATENT DOCUMENTS 5,496,744  3/1996  Ishimaru .................................. 438/309
5,567,966  10/1996  Hwang .................................... 257/347

*Primary Examiner*—Wael Fahmy
*Attorney, Agent, or Firm*—Oblon, Spivak, McClelland, Maier & Neustadt, P.C.

[57] ABSTRACT

A method of manufacturing a semiconductor device includes the steps of forming an insulating film on a silicon region of a substrate having the silicon region on a surface the insulating film having an opening for forming an exposed region of the silicon region, supplying a gas containing a halogen onto the silicon region, and supplying a source gas of silicon onto the silicon region, thereby selectively depositing the silicon on the exposed region of the silicon region.

5 Claims, 33 Drawing Sheets

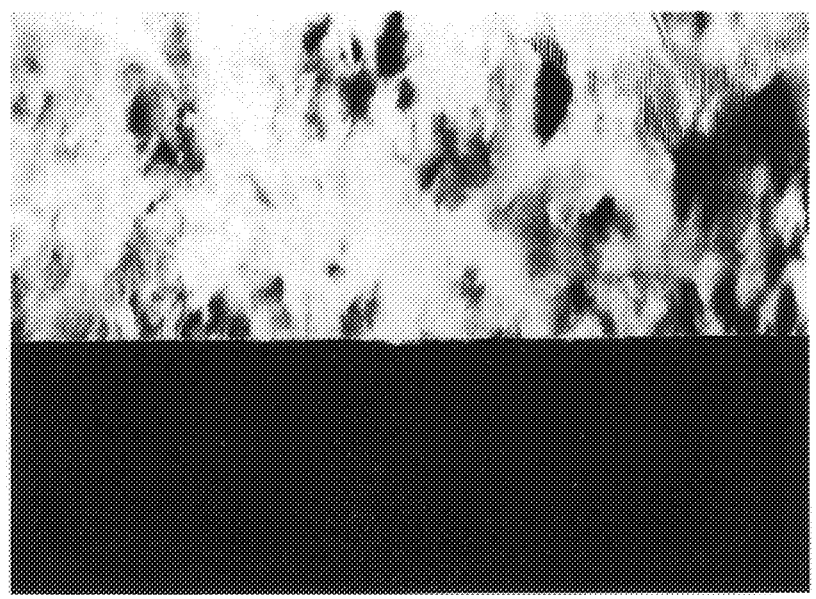
FIG.10  50nm
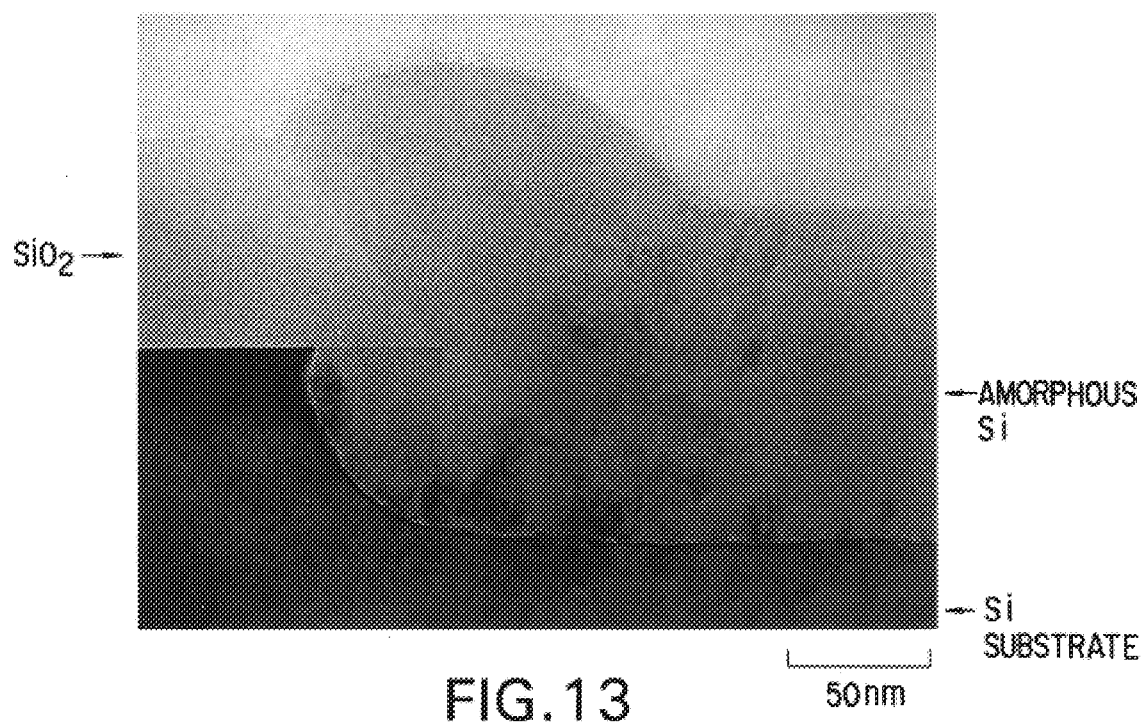
FIG.13  50nm

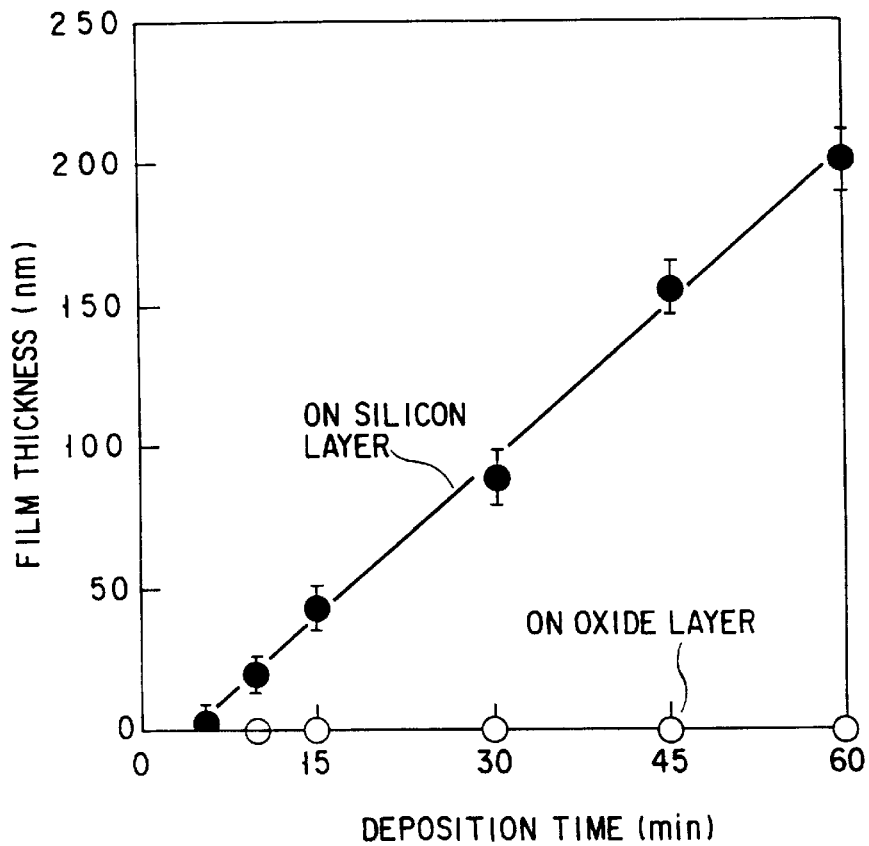
F I G. 20
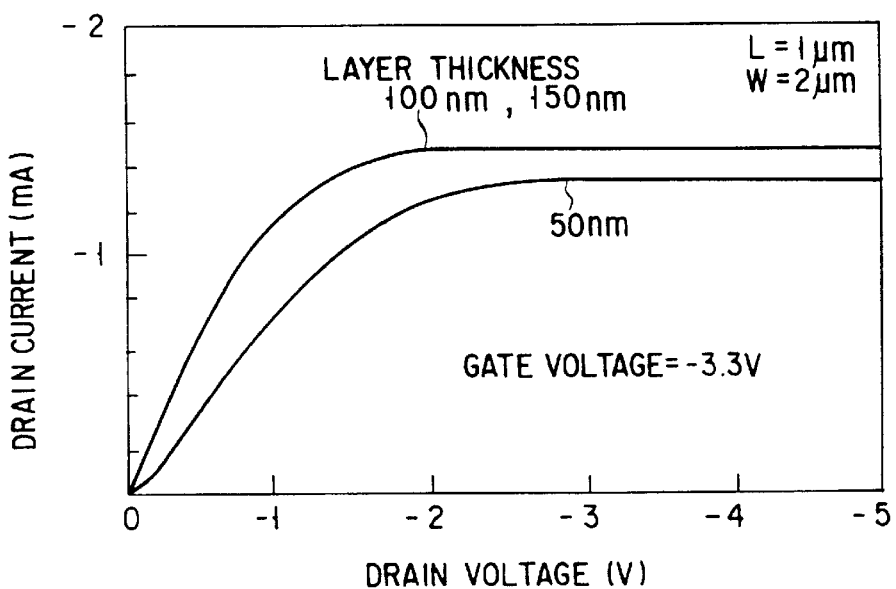
F I G. 22

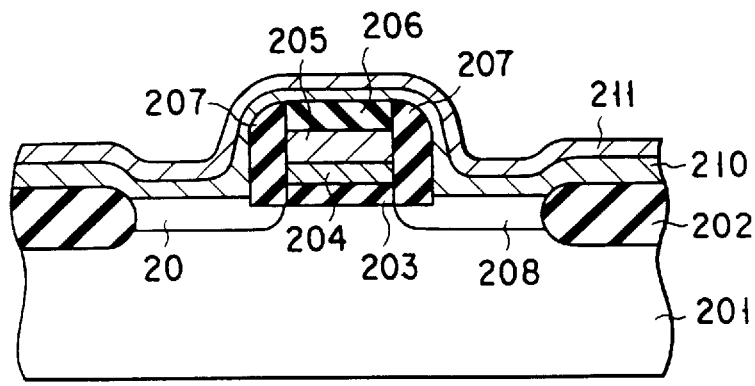
F I G. 23A
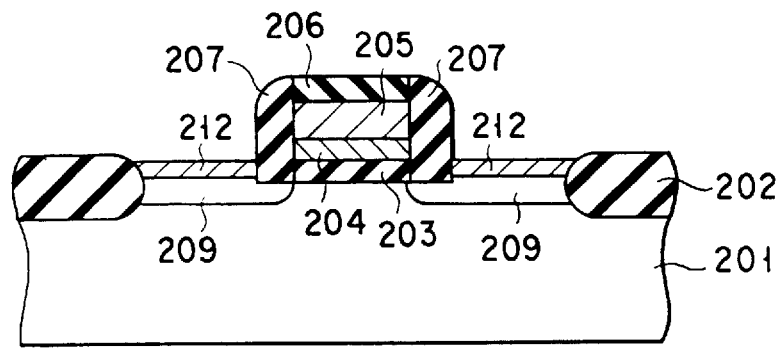
F I G. 23B
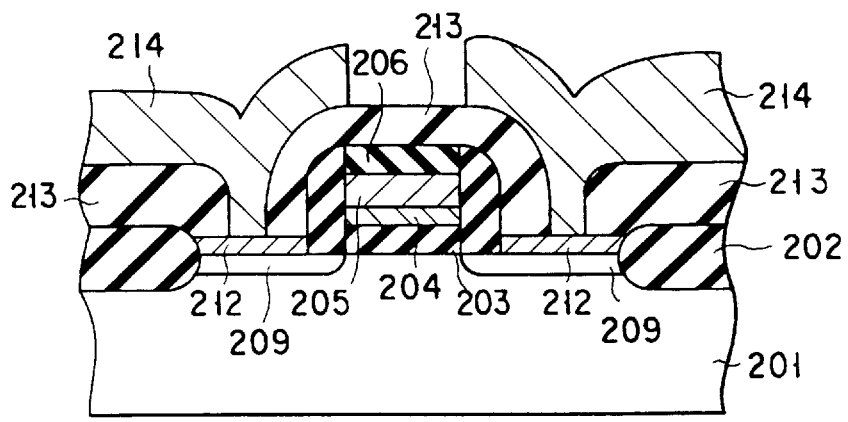
F I G. 23C

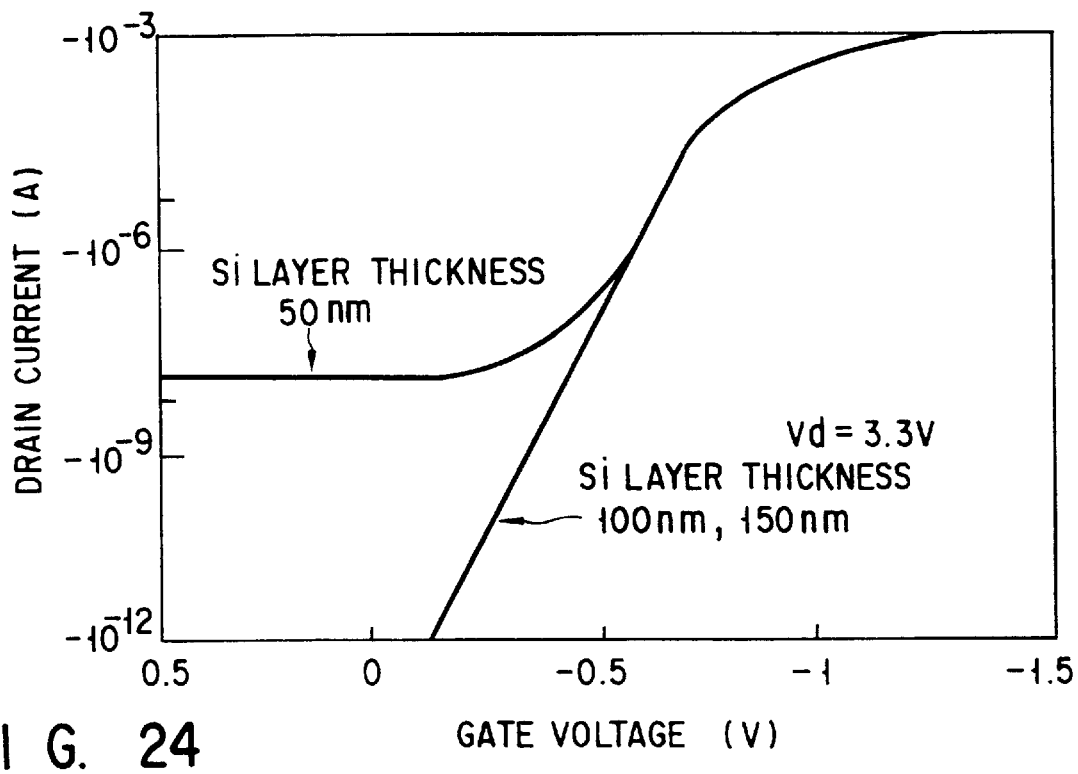
F I G. 24
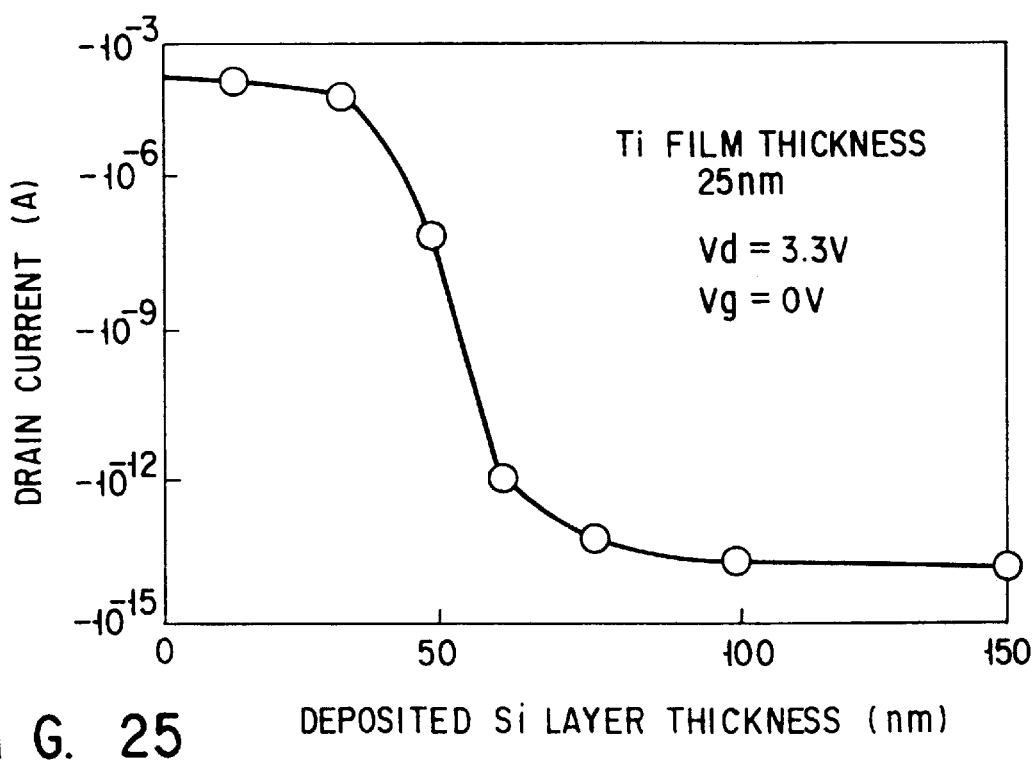
F I G. 25

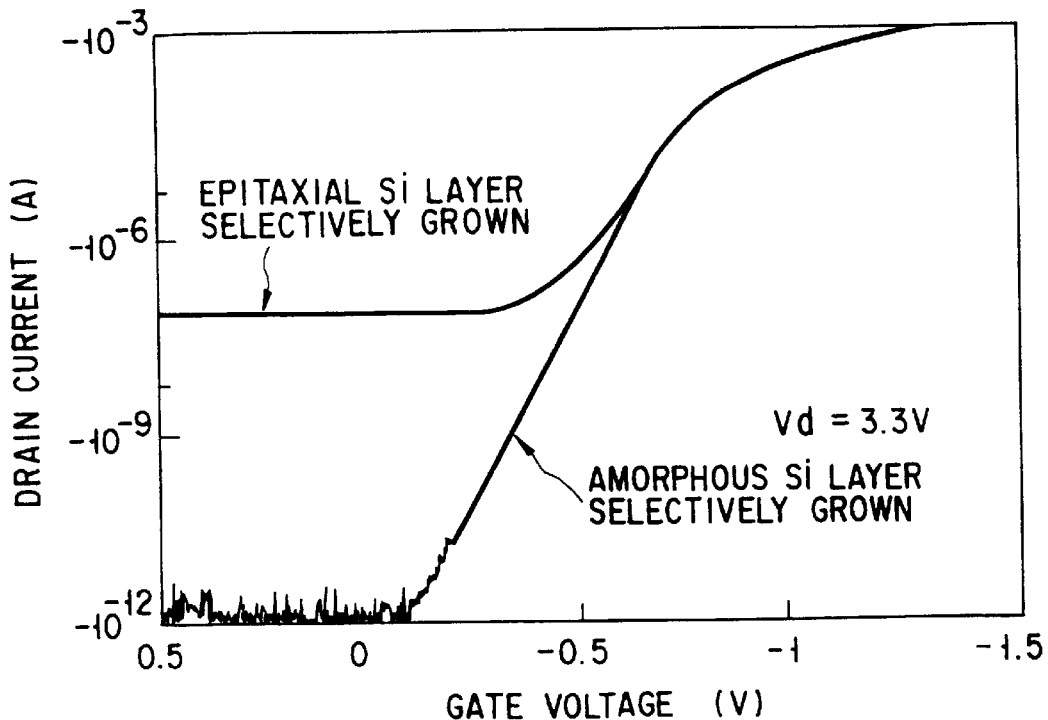
F I G. 27
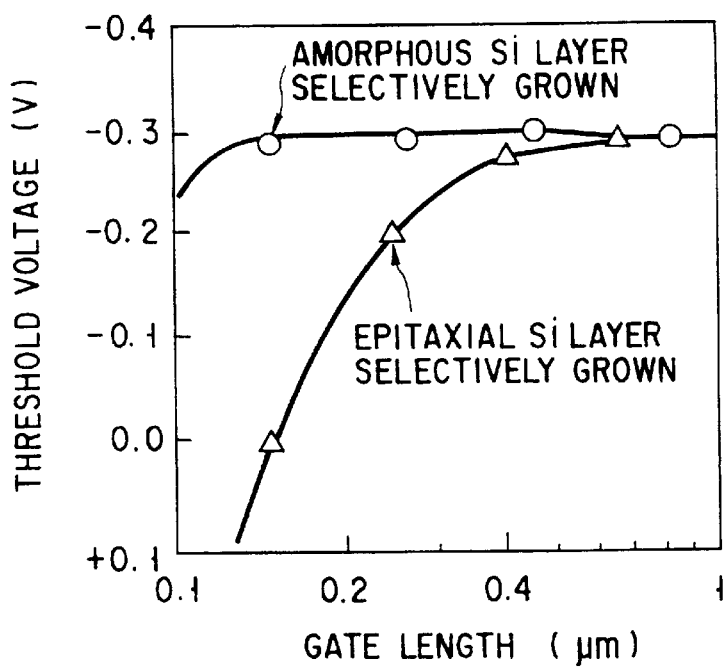
F I G. 28

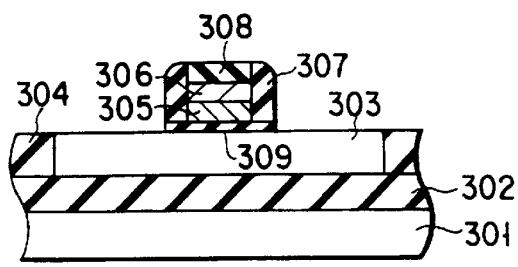
F I G. 31A
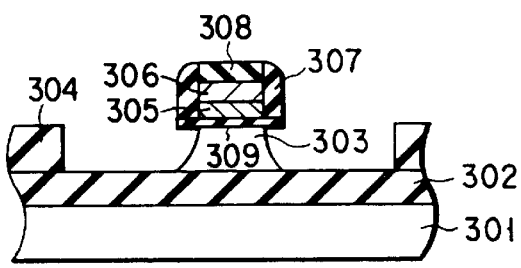
F I G. 31B
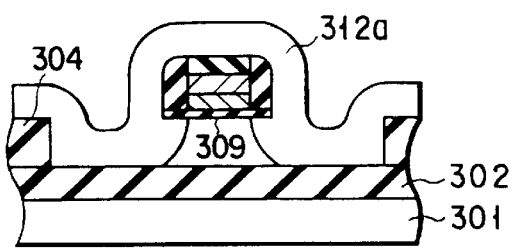
F I G. 31C
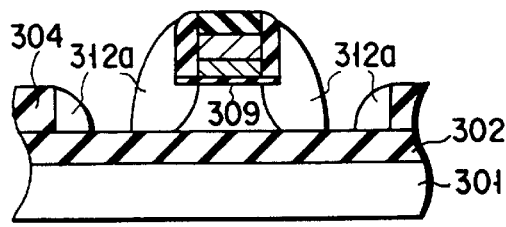
F I G. 31D
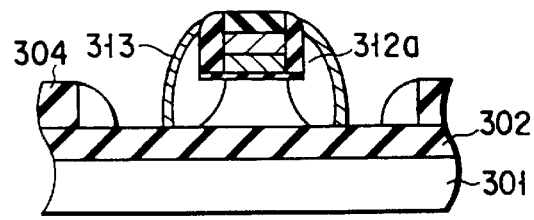
F I G. 31E
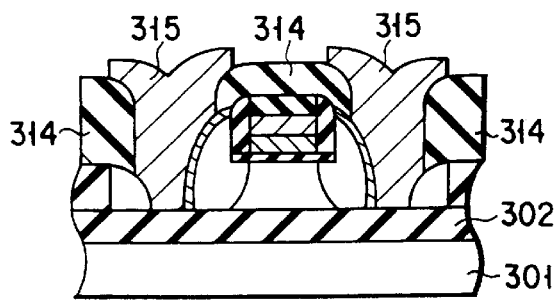
F I G. 31F

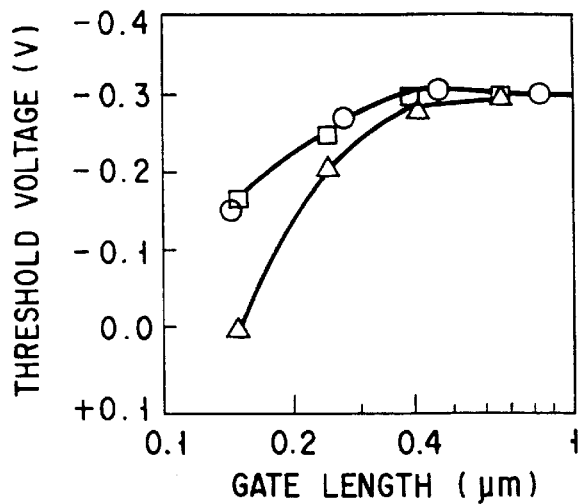
F I G. 43
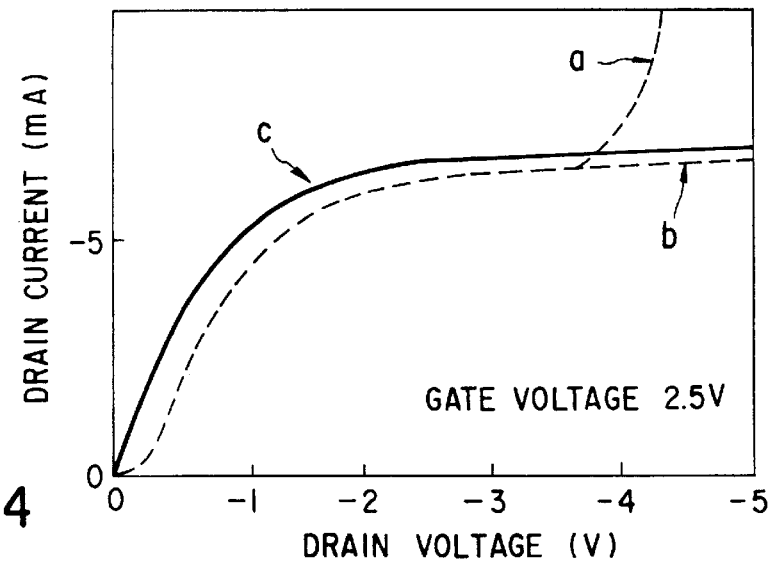
F I G. 44
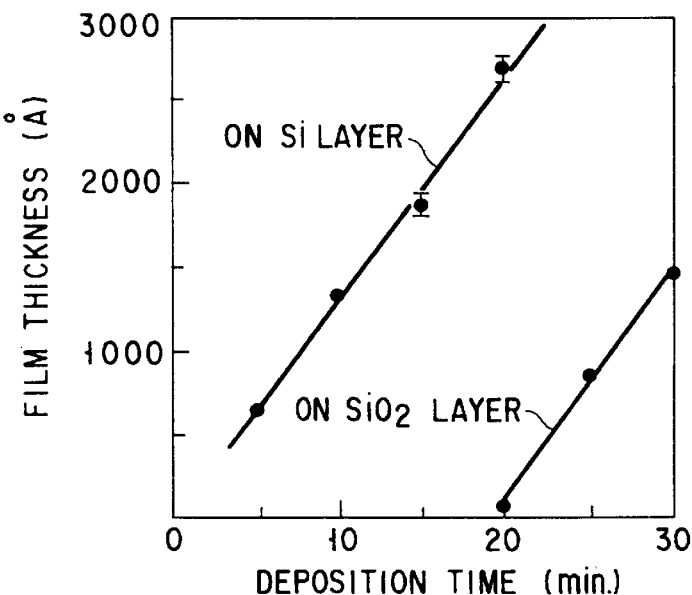
F I G. 46

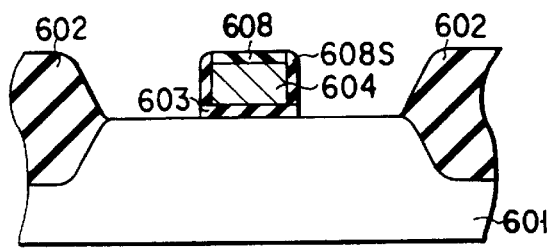
F I G. 45A
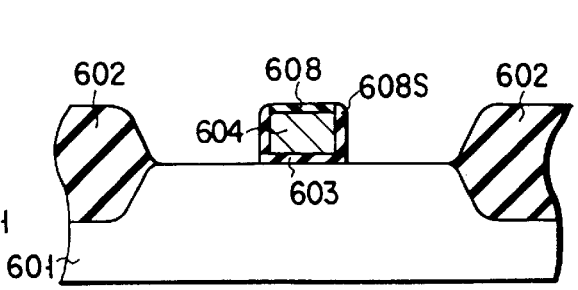
F I G. 47A
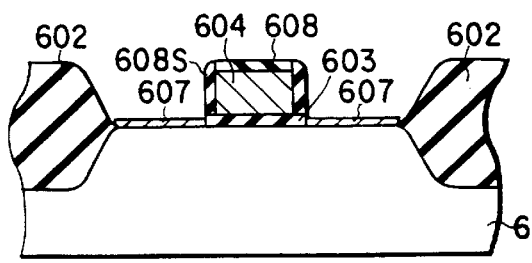
F I G. 45B
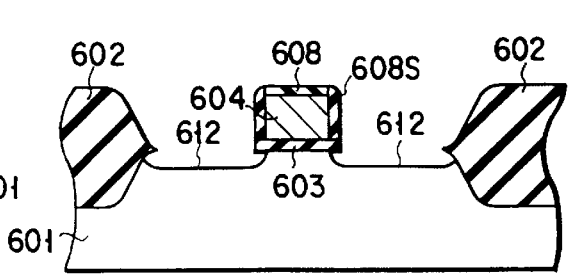
F I G. 47B
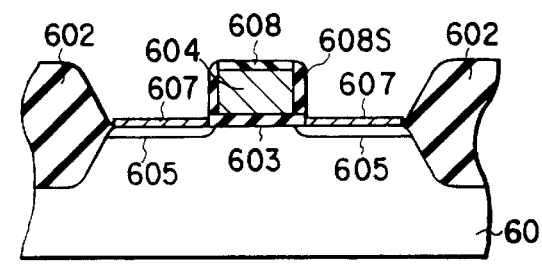
F I G. 45C
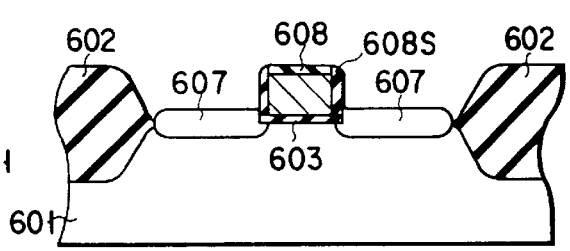
F I G. 47C
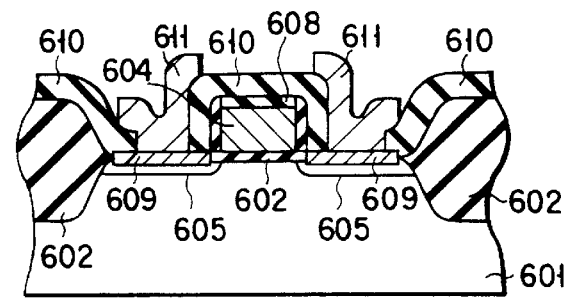
F I G. 45D
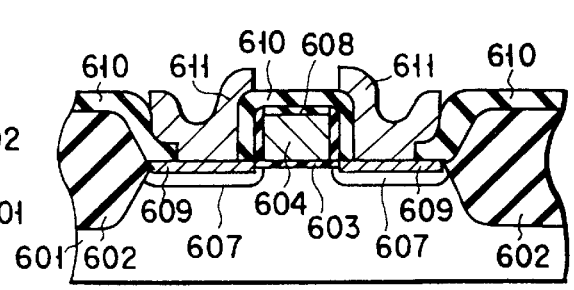
F I G. 47D

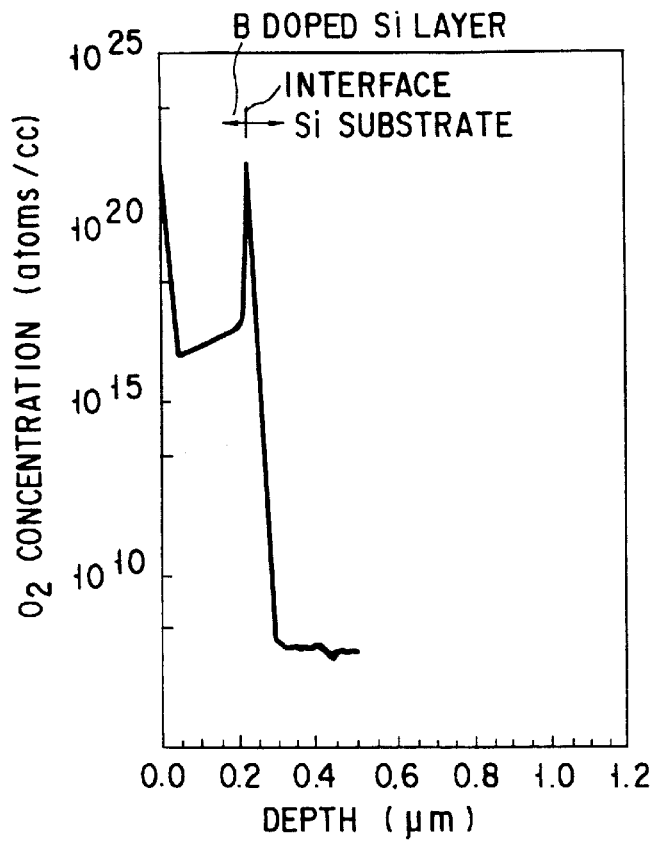
F I G. 48
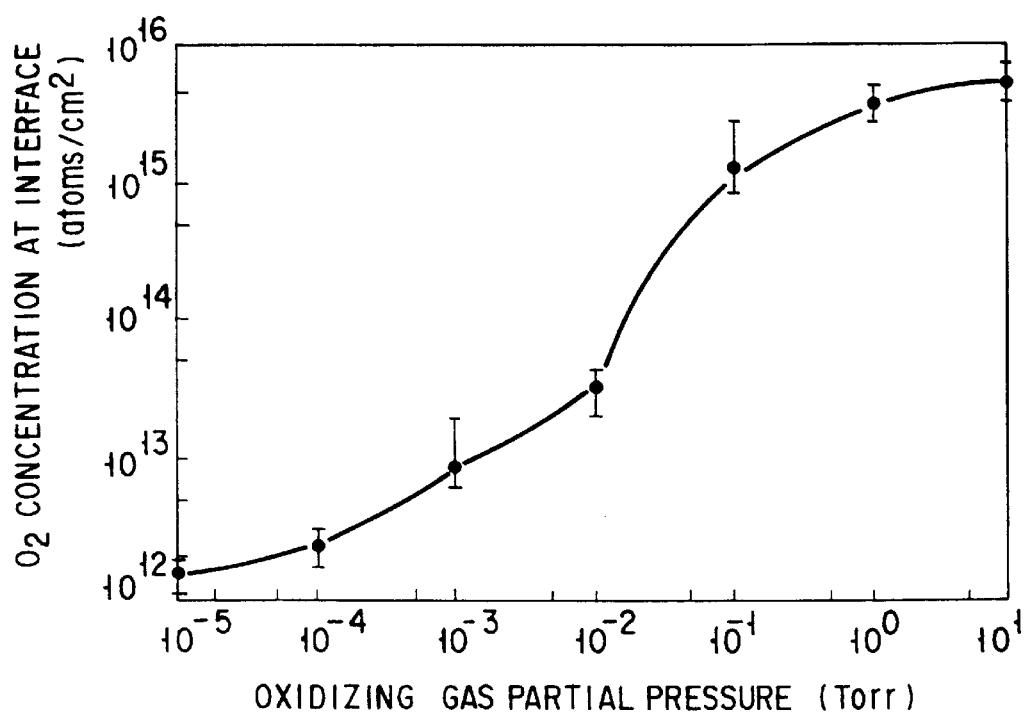
F I G. 49

SEMICONDUCTOR DEVICE AND MANUFACTURING METHOD THEREOF

BACKGROUND OF THE INVENTION

1. Field of the Invention

The present invention relates to a semiconductor device and a manufacturing method thereof and, more particularly, to a semiconductor device having a shallow, heavily doped source/drain layer, which is formed by applying selective deposition of a silicon layer, and a manufacturing method thereof.

2. Description of the Related Art

In recent years, a large-scaled integrated circuit (LSI) in which a large number of transistors and resistors are coupled to constitute an electric circuit and integrated on one chip is often used in the important portion of a computer or communication equipment.

Selective chemical vapor deposition (selective CVD) has been recently examined as an LSI technology. Selective CVD is applied to, e.g., an elevated source/drain or self-aligned contact technique. With this technique, a silicon layer serving as a source/drain impurity diffused layer or a direct contact layer having excellent characteristics can be formed in one selective growth.

Typical selective CVD for a silicon layer as shown in FIGS. 1A and 1B is conventionally known, in which CVD using an $Si/Cl/H_2$ reduction reactive gas, particularly, dichlorosilane ($SiH_2Cl_2$) source gas added with hydrochloric acid (HCl) gas and $H_2$ gas is used, and an insulating film 2 such as a silicon oxide film ($SiO_2$) and a silicon nitride film ($Si_3N_4$) is used as a mask to selectively grow a silicon layer 3 on the exposed surface of a silicon substrate 1 in the opening portion of the insulating film. Impurity doping into the selectively grown silicon layer 3 is performed by mixing a gasified compound containing impurity atoms with a reactive gas.

In the selective CVD method of this type, however, gas species capable of obtaining a satisfactory selectivity are limited, and the silicon layer 3 is normally epitaxially grown. Therefore, as shown in FIG. 1B, a facet 4 having a (111) plane is normally formed in the silicon layer 3.

In addition, when a shallow impurity diffused layer is to be formed, a silicide film is normally formed to decrease the resistance of the impurity diffused layer. More specifically, a titanium film is formed on the impurity diffused layer by sputtering, and annealing is performed by RTA (Rapid Thermal Annealing) at 700° C. for 30 seconds, thereby forming a titanium silicide film.

Since the silicide film is formed upon reaction between a refractory metal film as a silicide film and silicon in the impurity diffused layer, the silicon in the impurity diffused layer is consumed. For this reason, if the depth of the impurity diffused layer is small, the effective thickness of the impurity diffused layer must be increased by selectively growing a silicon layer on the impurity diffused layer.

However, if the silicon layer is obtained as an epitaxially grown film, the facet 4 is formed as in the silicon layer 3 in FIG. 1B. Therefore, the end portion of the silicon layer becomes thinner to degrade the effect of deposition of the silicon layer.

To avoid this problem, an amorphous silicon layer may be selectively deposited. In this case, however, the deposition temperature or the substrate temperature must be decreased, so a satisfactory deposition rate cannot be ensured.

The conventional direct contact technique has another problem caused by facet formation. This will be described below with reference to the manufacturing steps shown in FIGS. 2A to 2C.

As shown in FIG. 2A, $BF_2^+$ is ion-implanted in the surface of a p-type silicon substrate 11, thereby selectively forming an n-type impurity diffused region 13. After an insulating film 12 is deposited on the p-type silicon substrate 11, an opening portion (contact hole) is formed in this insulating film 12.

As shown in FIG. 2B, a single-crystal silicon layer 14 serving as an electrode containing an impurity is buried in the opening portion by selective epitaxy.

As shown in FIG. 2C, a polysilicon layer is deposited on the entire surface and patterned to form a wiring layer 15.

When this method is used, it becomes difficult to smoothly bury the opening portion because a facet 16 having a (111) plane is formed in the single-crystal silicon layer 14 as an epitaxially grown layer.

In addition, to deposit the polysilicon layer serving as the wiring layer 15, the resultant structure is conveyed from the selective deposition apparatus to the polysilicon layer deposition apparatus while being exposed to air. For this reason, a native oxide film is formed on the upper portion of the single-crystal silicon layer 14, resulting in an increase in contact resistance with respect to the wiring layer 15. When the resultant structure is exposed to air, no satisfactory selectivity can be obtained because of a contaminant such as dust, and a short circuit may occur in wiring layer because silicon is deposited on the insulating film 12 in some cases.

Elements become finer as the degree of integration of a semiconductor device is increased. Therefore, when the gate length of a MOS transistor is decreased, the so-called short channel effect such as a decrease in threshold voltage poses a serious problem. To prevent this short channel effect in the MOS transistor, it is conventionally required to decrease the diffusion depth of a source/drain diffused layer. In addition, to maintain a low resistance, it is required to increase the concentration of the source/drain layer.

These requirements are particularly needed at the end portion of a source/drain diffused layer. More specifically, as the elements become finer, it becomes more preferable that the end portion of the source/drain layer have a high concentration and a small diffusion depth. To cope with these requirements, an LDD (Lightly Doped Drain) structure is conventionally adopted as a source/drain diffusion layer structure.

The LDD structure is obtained by the following method. After a gate electrode is formed, ion implantation is performed at a low acceleration voltage and a low dose to form a shallow, lightly doped source/drain layer. Subsequently, a side-wall gate oxide film is formed. Thereafter, ion implantation is performed at a high acceleration voltage and a high dose to form a deep, heavily doped source/drain diffused layer. To further decrease the resistance, a silicide film is normally formed on the source/drain diffused layer.

To make the elements finer by using the LDD structure, the acceleration voltage of ion implantation of the impurity into the gate electrode end portion must be decreased, or the dose amount must be decreased.

However, when the acceleration voltage of ion implantation is decreased to form a shallow, lightly doped source/drain layer, the beam current in ion implantation decreases, resulting in a degradation in throughput.

When the acceleration voltage is low, the influence of channeling in the profile of ion implantation becomes conspicuous, so no shallow diffused layer can be formed even by decreasing the acceleration voltage. When the acceleration voltage is lower, the surface of the substrate is undesirably sputtered.

As described above, ion implantation has a limit in formation of shallow junction in principle. More specifically, the distribution of the implanted impurity largely depends on the acceleration energy in ion implantation. To obtain a shallow junction, a shallow ion implantation distribution must be obtained.

The implantation depth is almost inversely proportional to the mass of ions. For this reason, in formation of a p$^+$-layer, for which no appropriate impurity is present except for boron, it becomes more difficult to obtain a shallow ion implantation distribution. Conventionally, to effectively decrease the acceleration energy, $BF_2^+$ ions are used.

In this method, a source/drain layer is formed by known ion implantation. More specifically, a silicon oxide film and a polysilicon film are sequentially formed on an element region isolated by an element isolation insulating film formed on a silicon substrate. A resist pattern is used as a mask to perform patterning, thereby forming a gate oxide film and a gate electrode.

The gate electrode is used as a mask to implant $BF_2^+$ ions. The implanted $BF_2^+$ ions repeat collision in the silicon substrate and are distributed around the peak depth depending on the acceleration energy. Thereafter, annealing is performed in a nitrogen atmosphere at 850° C. for 30 minutes to diffuse boron in the silicon substrate and activated, thereby forming a diffused layer serving as a source/drain region.

Even with this method, however, it is difficult to form a diffused layer having a depth of 0.1 $\mu$m or less. For example, when $BF_2^+$ ions are implanted at an acceleration voltage of 20 keV and a dose of $5 \times 10^{15}$ cm$^{-2}$, a diffusion layer depth x (width of a region having a boron concentration of $1 \times 10^{17}$ cm$^{-3}$ or more) is 0.125 $\mu$m immediately after ion implantation, or 0.175 $\mu$m after annealing in the nitrogen atmosphere at 850° C. for 30 minutes.

To form a fine element of 1 G-bit DRAM, which has a channel length of about 0.1 $\mu$m, a shallow diffused layer having a depth of 0.1 $\mu$m or less is required. However, such a diffused layer can be hardly realized by the conventional method. Additionally, when the dose for ion implantation is decreased, the parasitic resistance of the MOS transistor undesirably increases.

To form a shallow end portion of the source/drain diffused layer having a high concentration, another method is used in which, after a side-wall gate oxide film is formed, a thin film containing an impurity is deposited, and this thin film is used as a diffusion source to perform solid phase diffusion, thereby forming a source/drain diffused layer.

More specifically, a method is proposed in which, from a gas containing an impurity, the impurity is absorbed or diffused in the surface of a silicon substrate, or an impurity-doped silicon film containing an impurity is deposited, and the impurity is diffused into the silicon substrate by a heat energy or the like. For example, diborane ($B_2H_6$) is thermally decomposed and absorbed by the silicon surface, and diffused into the silicon substrate.

With this method, the boron concentration in the diffused layer can be increased by performing annealing at a higher temperature. The depth of the diffused layer is determined by two factors, i.e., the annealing temperature and time after adsorption. More specifically, an increase in depth of the diffused layer, which is caused by an increase in annealing temperature, can be prevented by shortening the annealing time. Therefore, this method can be effectively used to form a shallow diffused layer having a high concentration.

With the method using thermal decomposition of an impurity, however, the impurity is also adsorbed by regions other than the silicon surface. This impurity layer adsorbed by the regions other than the silicon surface must be removed in post-processing.

In thermal decomposition of diborane or a method of diffusing an impurity from a material as a diffusion source using a B-doped silicon film using diborane and silane ($SiH_4$) or disilane ($Si_2H_6$), a native oxide film is formed when the silicon surface on which the diffused layer is to be formed is exposed to air, which impedes diffusion of the impurity. For this reason, the surface of the silicon substrate must be cleaned before the material serving as a diffusion source is formed.

Since the distribution of boron after annealing is determined in accordance with the complementary error function, the boron concentration near the junction boundary becomes lower than the surface concentration, resulting in an increase in resistance of the diffused layer. For example, under conditions for realizing a diffusion layer depth of 0.075 $\mu$m, the sheet resistance value becomes 450 $\Omega$/□.

In this method, the impurity concentration immediately below the side-wall gate oxide film particularly becomes low at the end portion of the gate electrode, and the region having the low impurity concentration serves as the series resistance for the transistor. For this reason, the parasitic resistance increases.

When a method of forming a silicide film on the source/drain diffused layer is used, a certain diffusion layer depth must be ensured before formation of the silicide film. The reason for this is as follows. Generally, to form a silicide film, a method is used in which a refractory metal film is formed on a silicon substrate by sputtering, and the refractory metal film is caused to react with silicon in the source/drain diffused layer. This is because the silicon in the source/drain diffused layer is consumed during formation of the silicide film to decrease the diffusion layer depth.

In addition, another reason can also be considered. That is, three-dimensional patterns are formed at the boundary between the metal layer and the source/drain diffused layer. Because of these three-dimensional patterns, point defects are diffused into the substrate beyond the source/drain diffused layer upon reaction during formation of the silicide film, resulting in a degradation in junction characteristics.

To solve these problems, a method called an elevated source/drain method is proposed. In this method, after a source/drain diffused layer is formed by ion implantation, a silicon layer is selectively grown to elevate the level of the source/drain diffused layer. According to this method, the silicide technique can be applied without increasing the diffusion layer depth. However, since silicon selective growth is additionally performed, the number of manufacturing steps is undesirably increased.

If the selectively grown silicon film is an epitaxially grown film, a facet different from that of the central portion is formed at the end portion, as shown in FIG. 1B. In this case, the effective thickness at the end portion becomes smaller to cause a degradation in junction characteristics. If the silicon film to be elevated is undoped, an impurity of the same type as that for the diffused layer is ion-implanted to decrease the resistance of the silicon film. In this case, the amount of impurity implanted from the thin end portion increases to cause a degradation in reliability of the transistor.

To form a shallow diffused layer, a silicon film on an SOI substrate can be made thinner. In this case, the entire silicon film is converted into a depletion layer. Therefore, the short channel effect of a MOSFET can be prevented, and the current driving capability can be improved.

In the conventional method of forming a MOS transistor using an SOI substrate, an element isolation insulating film is formed on the SOI silicon film of the SOI substrate (an SOI silicon film is formed on a silicon support base interposing an SOI insulating film therebetween). A gate electrode consisting of an impurity-doped polysilicon film and a tungsten silicide film is formed, with a gate oxide film intervening therebetween, on an element formation region surrounded by the element isolation insulating film. The side wall and the upper surface of this gate electrode is covered with a silicon nitride film, thereby forming a gate portion.

After the gate portion is used as a mask to implant impurity ions, annealing is performed to activate the impurity ions, thereby forming a source/drain diffused layer.

However, this MOS transistor forming method has the following problems. In this forming method, ion implantation is performed to form the source/drain diffused layer. Therefore, a concentration profile representing that the impurity concentration gradually decreases in the lateral direction is formed in the source/drain diffused layer from the lower portion of the side-wall silicon nitride film to the gate edge.

For this reason, the resistance of the source/drain diffused layer increases as a whole, and the parasitic resistance between two source/drain diffused layers increases, resulting in a degradation in current driving capability. This problem becomes more serious as the thickness of the SOI silicon film becomes smaller.

In addition, assume that the semiconductor film of the SOI substrate is formed of silicon, as in the above MOS transistor. In this case, particularly, in an n-channel MOS transistor, when the drain voltage is increased in a state wherein the gate voltage is zero or the MOS transistor is kept off, a small leak current is generated to flow a subthreshold current.

As a result, impact ionization is caused by the subthreshold current to generate holes. The holes are accumulated below the channel to increase the potential. This causes a phenomenon for inducing electron injection from the source. Such a phenomenon causes a decrease in source/drain breakdown voltage when the transistor is in an OFF state. In addition, the subthreshold characteristics are also degraded.

As described above, in the conventional technique for selectively forming a silicon layer, a facet is formed to adversely affect post-processing.

In addition, in the conventional MOS transistor technology, when elements are made finer using the LDD structure, the resistance of the source/drain diffused layer increases to cause an increase in parasitic resistance.

Furthermore, when a source/drain diffused layer is formed by solid phase diffusion, the concentration in the source/drain diffused layer at the end portion of the gate electrode is decreased, resulting in an increase in parasitic resistance.

SUMMARY OF THE INVENTION

It is the first object of the present invention to provide a new method of selectively depositing a silicon film without generating a difference in film thickness based on a difference in crystal face.

It is the second object of the present invention to provide a semiconductor device having a shallow, heavily doped source/drain layer obtained by selective deposition of a silicon film, and a manufacturing method thereof.

In order to achieve the above objects, according to the present invention, there is provided a method of selectively depositing a silicon layer, comprising the steps of forming an insulating film on a silicon region of a substrate having the silicon region on a surface, the insulating film having an opening for forming an exposed region of the silicon region, supplying a gas containing a halogen onto the silicon region, and supplying a source gas of silicon onto the silicon region, thereby selectively depositing the silicon on the exposed region of the silicon region.

The substrate is, e.g., a silicon substrate or an SOI substrate. The silicon region is constituted by the silicon substrate itself, or a silicon film constituting the SOI substrate.

The present invention has the first and second aspects. In the silicon layer selective deposition method according to the first aspect, a halogen element is left on the insulating film when a gas containing a halogen is supplied, thereby suppressing silicon growth on an insulating film and selectively growing silicon on only a silicon region. In the silicon layer selective deposition method according to the second aspect, a gas containing a halide of a Group III or V element is supplied, and silicon is selectively deposited on a silicon region by an interaction between a silicon source gas and the silicon region.

In the silicon selective deposition method of the first aspect, the halogen element in an amount of at least $7 \times 10^{14}$ atoms/cm$^2$ is left on the surface of the insulating film in the process using the gas containing the halogen.

The process using the gas containing the halogen and the process of selectively forming the silicon film are performed in a single vacuum reaction chamber. Alternatively, these processes are continuously performed in different vacuum reaction chambers which are hermetically connected to each other. At this time, the oxidizing gas partial pressure in the vacuum reaction chamber is preferably set to $1 \times 10^{-3}$ Torr or less.

In the above process, an amorphous silicon film can be formed by temperature control. The temperature control means that the substrate temperature is controlled to a low temperature not to cause epitaxial growth.

A MOS semiconductor device of the present invention, which can be manufactured by the above processes, comprises a gate oxide film formed on a silicon region of a substrate having the silicon region on a surface, a gate electrode formed on the gate oxide film, and, source/drain regions formed by deposited layers in grooves formed on both sides of the gate electrode on the silicon region.

A method of manufacturing the above MOS semiconductor device comprises the steps of forming a gate oxide film on a surface of a silicon region of a substrate having the silicon region on a surface, forming a gate electrode on the gate oxide film, etching the silicon region on both sides of the gate electrode to form grooves, and burying a semiconductor layer containing an impurity in the grooves as source/drain regions.

In the above manufacturing method, it is preferable that an insulating film be formed on a side wall of the gate electrode, and thereafter, the insulating film and the gate electrode be used as a mask to etch the silicon region and form the grooves, and the semiconductor layer containing the impurity be buried in the grooves as source/drain layers such that the film thickness becomes larger than a depth of the grooves.

The buried semiconductor layer may be an epitaxially grown Si layer, or a deposited amorphous silicon layer. Alternatively, the semiconductor layer may be formed of SiGe.

A method using a combination of isotropic etching and anisotropic etching wherein the etching direction has a dependency on plane orientation is preferably used as a method of forming the groove.

Anisotropic etching is preferably performed using a gas containing chlorine, and particularly, $ClF_3$ gas. When the groove is to be formed by anisotropic etching, a desired etching shape can be easily obtained by controlling the plane orientation of the substrate.

After the step of forming the groove in the source/drain region, reactive ion etching can be continuously performed in this groove.

Boron, phosphorus, or arsenic is preferably used as the impurity.

The semiconductor device manufacturing method of the second aspect of the present invention, comprises the step of supplying a first gas containing a halide of one of a Group III element and a Group V element and a second gas containing hydrogen and silicon onto a sample having an insulating region and a conductive region on a surface, thereby selectively growing a film containing one of the Group III element and the Group V element on only the conductive region.

When at least one condition of a temperature, a gas source, and a flow rate is changed when the first and second gases are supplied onto the sample, the concentration of one of the Group III element and the Group V element in the film selectively grown on only the conductive region can be controlled. For example, after the step of supplying the first and second gases onto the sample, when only the second gas is supplied, only silicon is deposited in the latter process, and entire concentration control is enabled.

When annealing is performed after the film containing one of the Group III element and the Group V element is selectively deposited on the surface of a silicon substrate, a diffused layer of the Group III or V element can be formed in the silicon substrate.

Chloride gas, and particularly, boron trichloride gas is preferably used as a first gas containing the halide of the Group III or V element. A silane-based gas, and particularly monosilane gas is preferably used as the second has containing hydrogen and silicon.

A MOS semiconductor device manufacturing method based on the above processes comprises the step of forming an element isolation insulating film on a silicon substrate, selectively forming a gate electrode in an element region isolated by the element isolation insulating film, with a gate oxide film interposing therebetween, forming a side-wall insulating film on a side wall of the gate electrode, removing the gate oxide film on both sides of the gate electrode to expose the silicon substrate, and supplying a first gas containing a halide of one of a Group III element and a Group V element and a second gas containing at least hydrogen and silicon onto the substrate, thereby selectively growing a film containing one of the Group III element and the Group V element on only the exposed silicon substrate.

The step of selectively etching the substrate on both the sides of the gate electrode to form grooves may be added after the step of removing the gate oxide film on both the sides of the gate electrode to expose the silicon substrate.

The step of selectively etching the silicon substrate and the step of supplying the first and second gases are continuously performed in vacuum apparatuses connected to each other. The oxidizing gas partial pressure in the vacuum apparatus is preferably kept below 0.1 Torr.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 10 is a photomicrograph showing the crystal structure of a silicon deposition film formed on the substrate;

FIG. 13 is a photomicrograph showing an amorphous film selectively formed on the silicon surface;

FIG. 20 is a graph showing the relationship between the deposition time and the film thickness under still another condition for each underlayer for deposition;

FIG. 22 is a graph showing the relationship between a drain voltage and a drain current in the transistor in FIG. 21E while changing the thickness of a source/drain layer;

FIGS. 23A to 23C are sectional views of a p-channel MOS transistor, which sequentially show a method of manufacturing this transistor according to the fourth embodiment of the present invention;

FIG. 24 is a graph showing the relationship between a gate voltage and the drain current in the transistor in FIG. 23C while changing the thickness of the source/drain layer;

FIG. 25 is a graph showing the relationship between the thickness of the source/drain layer and the drain current;

FIG. 27 is a graph showing gate voltage vs. drain current characteristics so as to explain the effect of the present invention;

FIG. 28 is a graph showing gate length vs. threshold voltage characteristics so as to explain the effect of the present invention;

FIGS. 29A and 29B are views showing an impurity profile in the elevated source/drain layer, in which FIG. 29A shows an amorphous silicon layer, and FIG. 29B shows an epitaxially grown silicon layer;

FIGS. 31A to 31F are sectional views of a MOS transistor, which sequentially show a method of manufacturing this transistor using an SOI substrate according to the seventh embodiment of the present invention;

FIG. 43 is a graph showing the relationship between the gate length and the threshold voltage so as to explain the effect of the present invention;

FIG. 44 is a graph showing the relationship between the gate length and the drain current so as to explain the effect of the present invention;

FIGS. 45A to 45D are sectional views of a MOS transistor, which sequentially show a method of manufacturing this transistor according to the 14th embodiment of the present invention;

FIG. 46 is a graph showing the relationship between the deposition time and the film thickness for each underlayer;

FIGS. 47A to 47D are sectional views of a MOS transistor, which sequentially show a method of manufacturing this transistor according to the 15th embodiment of the present invention;

FIG. 48 is a graph showing the distribution state of the oxygen concentration of the substrate surface;

FIG. 49 is a graph showing the relationship between the oxidizing gas partial pressure and the oxygen concentration at the interface between the silicon substrate and the B-doped silicon film;

FIGS. 50A and 50B are graphs each showing the relationship between the deposition time and the deposition thickness for each underlayer, in which FIG. 50A shows a case wherein the oxygen partial pressure is 0.1 Torr or more, and FIG. 50B shows a case wherein the oxygen partial pressure is 0.1 Torr or less.

DETAILED DESCRIPTION OF THE PREFERRED EMBODIMENTS

Figure 1A:
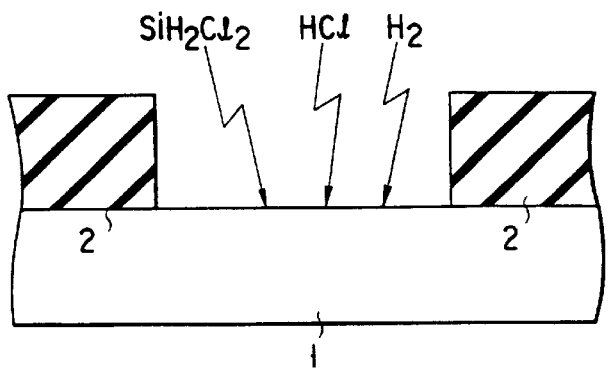
FIGS. 1A and 1B are sectional views showing a semiconductor device so as to explain the problems of conventional selective CVD.
Figure 1B:
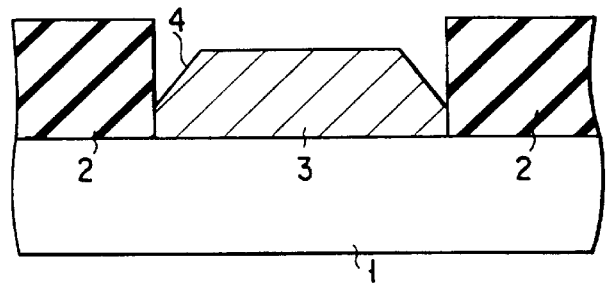
Figures 2A, 2B:
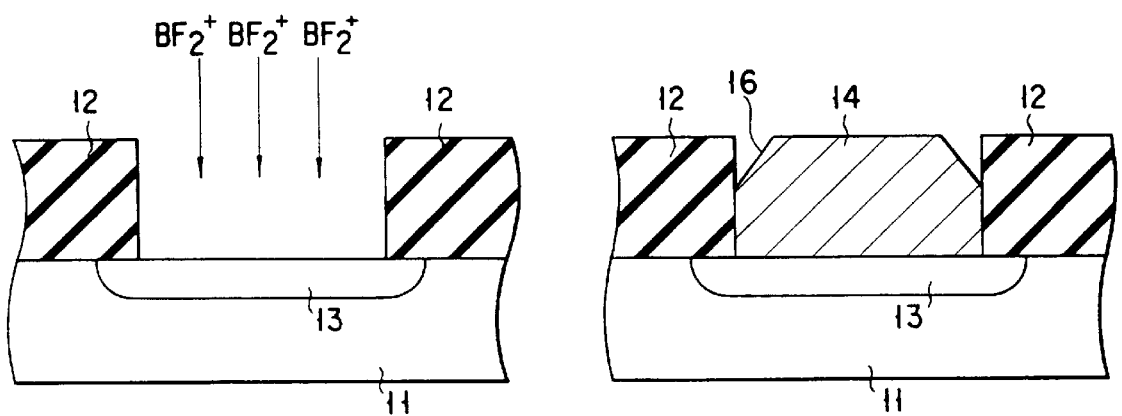
FIGS. 2A to 2C are sectional views showing a semiconductor device so as to explain the problems of a conventional direct contact technique.
Figure 2C:
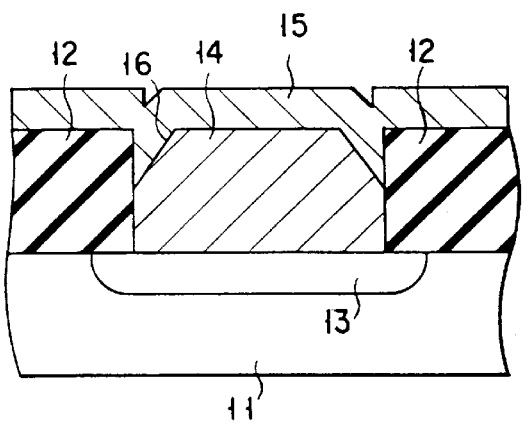

The gist of the present invention will be described prior to a description of embodiments.

According to studies by the present inventors, it is found that, when the surface of a target silicon substrate partially covered with an insulating film is processed by a gas containing a halogen such as fluorine in advance, a silicon film can be selectively formed on the exposed surface of the silicon substrate which is not covered with the insulating film, regardless of the basic method of depositing a silicon film (except for physical deposition methods such as sputtering). Particularly, the manufacturing method according to the present invention could be effectively applied to CVD of any type.

Therefore, according to a method of manufacturing a semiconductor device according to the first aspect of the present invention based on the above finding, a flat silicon film can be selectively formed on the exposed surface of a silicon region (silicon substrate or silicon film of SOI substrate).

It is also found that, when deposition is performed at a low temperature, an amorphous silicon film can be formed, and a silicon film without any facet can be formed accordingly. Even at a low temperature, the deposition rate could be increased by using a highly reactive source gas. The reason why a source gas highly reactive even at a low temperature can be used is that the types of usable source gases are increased because of the process using a gas containing a halogen.

Therefore, according to the present invention based on the above finding, a silicon film having no plane orientation can be selectively formed without reducing the deposition rate.

The above finding will be described below in detail.

A contact hole is formed in an insulating film, e.g., an oxide film on a silicon substrate by hydrofluoric acid treatment or the like to expose the chemically active silicon surface. When a halide gas used for etching of silicon, e.g., carbon tetrafluoride ($CF_4$) is activated by microwave discharge, an active species, e.g., fluorine radicals are generated and supplied to the silicon substrate. The fluorine radicals react with the silicon surface and the silicon oxide film surface. Particularly, on the silicon surface, silicon fluoride ($SiF_x$) is generated and eliminated from the silicon surface. With this process, etching progresses.

Thereafter, the sample is moved into a vacuum reaction chamber continuous with the etching chamber, without being exposed to air. The sample is heated to a deposition temperature in the vacuum or a non-oxidizing gas, e.g., argon (Ar) atmosphere of the vacuum reaction chamber.

At this time, the silicon fluoride ($SiF_x$) generated on the silicon surface upon reaction with fluorine radicals is eliminated from the silicon surface because of its low vapor pressure, so the fluorine rarely remains on the silicon surface. On the silicon oxide film, the fluorine radicals react with the oxide film surface to form $SiO_xF_y$ having a high vapor pressure, and a large amount of fluorine remains on the silicon oxide film.

When disilane gas ($Si_2H_6$) is supplied into the reaction chamber, the disilane gas ($Si_2H_6$) is decomposed on the silicon substrate surface, and a silicon film is grown. On the silicon oxide film, defects (nuclei) for inducing decomposition of disilane ($Si_2H_6$) are decreased by absorption of the large amount of fluorine. In addition, when $SiO_2$ is converted into $SiO_xF_y$, the electrons in silicon are further separated to weaken interaction between the silicon oxide film and the disilane molecules, which makes it difficult to decompose the disilane molecules on the oxide film. For this reason, no silicon film is grown on the silicon oxide film. When the substrate temperature is equal to or lower than a predetermined value, the silicon film is deposited not as a single-crystal silicon film but as an amorphous silicon film.

In this case, carbon tetrafluoride ($CF_4$) is used as a gas containing fluorine, and fluorine radicals are generated by microwave discharge. However, this method can also use another fluoride gas including chlorine tetrafluoride gas ($ClF_3$).

In addition, disilane gas ($Si_2H_6$) is used as a gas for depositing an amorphous silicon film. However, the gas species is not limited to this, and any other gas can be used as far as it allows decomposition at 700° C. or less to form a silicon film. For example, silane ($SiH_4$) or dichlorosilane ($SiH_2Cl_2$) can also be used. When an impurity-doped silicon film is to be deposited, these gases can be mixed with diborane ($B_2H_6$), boron trichloride ($BCl_3$), boron trifluoride ($BF_3$), phosphine ($PH_3$), or arsine ($AsH_3$).

A source/drain layer according to the present invention is formed not by introducing an impurity to the surface of the semiconductor region by ion implantation or solid phase diffusion but by burying a semiconductor layer containing an impurity, which is different from the semiconductor layer of this semiconductor region, in the surface of the semiconductor region.

Such a semiconductor layer can be formed by, e.g., CVD. In addition, a thin semiconductor layer having a uniform, high impurity concentration can be formed. Unlike ion implantation and solid phase diffusion, a shallow, heavily doped source/drain layer can be formed even when elements become finer. Therefore, even when elements become finer, the channel effect can be effectively prevented, thereby realizing a highly reliable semiconductor device.

The source/drain layer formed on an SOI substrate is formed not by introducing, by ion implantation, an impurity into the surface of an SOI semiconductor film on the substrate (SOI substrate) constituted by a semiconductor film (SOI semiconductor film) formed on an insulating film (SOI insulating film), but by burying a semiconductor layer containing an impurity, which is different from the semiconductor layer, in the surface of the SOI semiconductor film.

Therefore, even when elements become finer, a shallow, heavily doped source/drain layer can also be formed on an SOI substrate. For this reason, the short channel effect can be effectively prevented, thereby realizing a highly reliable semiconductor device.

The first aspect of the present invention has been generally described above, and a detailed example thereof will be described later as the first to 12th embodiments.

To apply the above selectively deposited layer to a MOS semiconductor device, the present inventors have also examined a method of forming a groove in which the source/drain layer is buried. More specifically, the present inventors checked how the etching shape could be controlled by a combination of a process of isotropically etching silicon and a process of anisotropically etching silicon to proceed etching in different plane orientations. For this purpose, the following experiment was executed.

In this experiment, isotropic etching was performed such that a gas mixture of $CF_4$ gas and oxygen was caused for microwave discharge and supplied onto the sample. Anisotropic etching for proceeding etching while forming a facet was performed such that a gas containing Cl which was considered to mainly act on this etching, e.g., $ClF_3$ gas was supplied onto the sample.

In this case, with the method using $ClF_3$ gas, etching can be performed in different plane orientations, e.g., in the direction of a plane parallel to the silicon substrate and in the direction of the (111) plane of the silicon substrate. In other words, etching can be performed while forming a tapered portion.

An example of a combination of anisotropic etching using $ClF_3$ gas and isotropic etching using a gas mixture of $CF_4$ and oxygen will be described.

A thermal oxide film was formed on a silicon substrate having a (100) plane orientation and patterned. A process of anisotropically etching silicon in different plane orientations and a process of isotropically etching silicon were performed. Thereafter, the etching shape was observed with a scanning electron microscope.

Figure 3A:
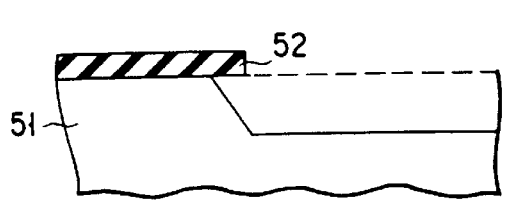
FIGS. 3A to 3F are sectional views showing a semiconductor device so as to explain a method of changing an etching shape by a combination of isotropic etching and anisotropic etching.
Figure 3B:
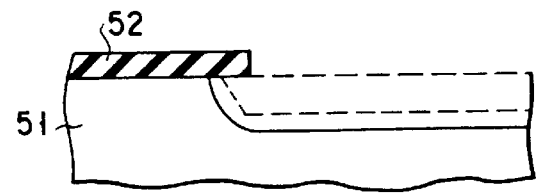
Figure 3C:
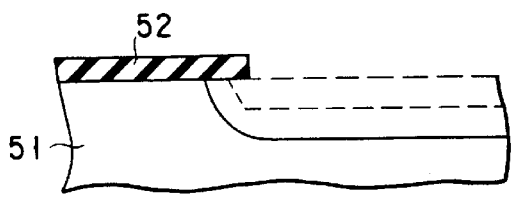
Figure 3D:
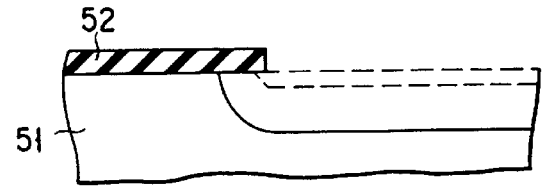
Figure 3E:
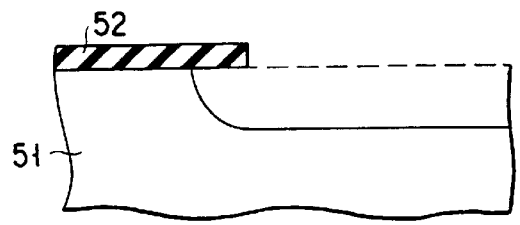

FIGS. 3A to 3E are sectional views showing the etching shapes observed when the etching depth in anisotropic etching was changed. Etching was performed such that the total depth became 100 nm. FIG. 3A shows an example wherein only anisotropic etching was performed to a depth of 100 nm. FIGS. 3B to 3E respectively show examples wherein anisotropic etching was performed to depths of 75 nm, 50 nm, 25 nm, and 0 nm (indicated by dotted lines), and thereafter isotropic etching was performed to a total depth of 100 nm. As is apparent from this result, the etching shape can be freely controlled by a combination of isotropic etching and anisotropic etching.

Figure 4A:
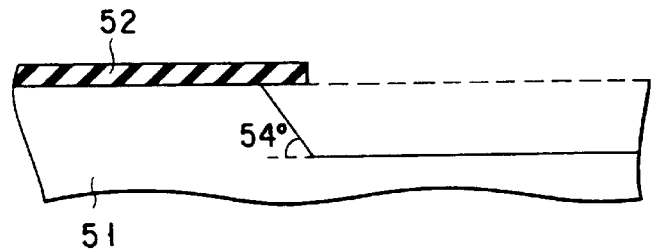
FIGS. 4A to 4C are sectional views showing a semiconductor device so as to explain the relationship between the plane orientation of a silicon substrate and the etching shape of anisotropic etching.
Figure 4B:
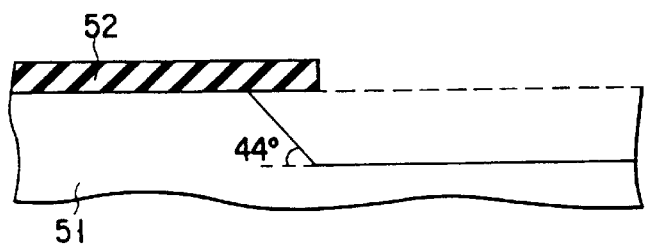
Figure 4C:
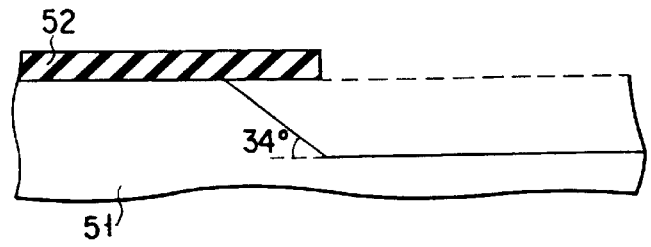

In addition, the etching shape by anisotropic etching observed when the plane orientation on the silicon substrate was gradually changed from the (100) plane orientation was checked. FIGS. 4A to 4C are sectional views respectively showing etching shapes obtained when the substrate is inclined at angles 10°, 20°, and 30° from the (100) plane in the (110) plane orientation.

In all cases, since etching progresses in the (111) plane orientation, the etching angle can be changed depending on the plane orientation on the substrate.

As described above, according to the present invention, the etching shape can be freely changed by a combination of a process of isotropically etching silicon and a process of anisotropically etching silicon in different plane orientations, or changing the plane orientation of the substrate. When this technique is applied, a portion immediately below the insulating film of a gate electrode can be etched while forming a tapered portion. As a result, the impurity profile in the lateral direction of the source/drain region can be controlled in accordance with the etching shape.

An example of a combination of the above etching technique and RIE (Reactive Ion Etching) using a gas mixture of HBr and oxygen will be described below.

Figure 3F:
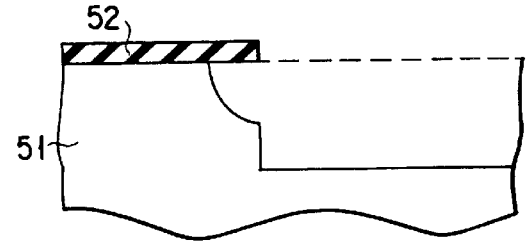

In RIE using the gas mixture of HBr and oxygen, etching can be vertically performed while using a silicon oxide film as a mask. Therefore, when RIE is performed using the gas mixture of HBr and oxygen after formation of a shape shown in FIG. 3C, an etching shape shown in FIG. 3F can be obtained. As is apparent from FIG. 3F, only the region of a substrate 51 which is not covered with an insulating film 52 can be vertically etched, and the shape under the insulating film and the shape of the region which is not covered with the insulating film can be independently controlled.

The gist of the method of forming a source/drain layer burying groove of the present invention has been described above, and a detailed example will be described later as the 13th embodiment.

A selective deposition method according to the second aspect of the present invention and the principle of a method of manufacturing a semiconductor device using selective deposition will be described below in detail. In the present invention, a first gas containing a halide of a Group III element or a group V element is reduced by a second gas containing hydrogen and silicon, thereby selectively growing a doped silicon film on a conductive region.

First of all, hydrofluoric acid treatment or the like is performed for a sample such as a silicon substrate, thereby exposing the chemically active silicon surface on the region where boron or a B-doped silicon film is to be grown.

Subsequently, the sample is exposed to a gas mixture atmosphere of a halide gas of boron, e.g., boron trichloride gas ($BCl_3$), and a silane-based gas, e.g., silane gas ($SiH_4$).

At this time, boron trichloride receives electrons on the silicon surface and is reduced. Since chlorine generated upon reduction is chemically active, it reacts with the silane gas, and is converted into silicon tetrachloride and eliminated from the silicon surface. This reaction is represented by the following formula:

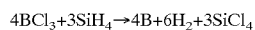

$$4BCl_3 + 3SiH_4 \rightarrow 4B + 6H_2 + 3SiCl_4$$

Reduction of boron trichloride occurs not on an insulating film such as a silicon film but on only the silicon surface having conduction electrons. For this reason, boron is selectively grown on only the silicon surface.

Assume that the temperature is increased to a certain value or more, and the silane gas is supplied exceeding the number of moles represented the above formula. In this case, the silane gas is attracted by boron atoms adsorbed by the silicon surface because electrons in the silane gas are localized and polarized on the H side in the Si-H bond. The boron promotes decomposition of the Si-H bond. Therefore, hydrogen atoms are eliminated. As a result, the B-doped silicon film is selectively grown on only the silicon surface.

At this time, when the mixing ratio of the boron trichloride gas to silane in the gas phase is changed, a B-doped silicon film having a desired boron concentration can be formed.

More specifically, boron or a B-doped silicon film is selectively grown on only the silicon surface by supplying the boron trichloride gas and the silane gas. Thereafter, a silicon film is selectively grown on only the boron or B-doped silicon film by stopping supplying the boron trichloride gas. By alternately performing these processes, a film having a desired boron concentration and a desired thickness can be formed.

Thereafter, when annealing is performed, the boron atoms are accepted from the deposited film into silicon, thereby forming a shallow, heavily doped p-type diffused layer on the substrate surface.

In the present invention, a portion serving as a diffused layer of the substrate can be removed by etching or the like in advance, and a deposition on the removed portion can be used as a diffused layer.

A halide gas such as carbon tetrafluoride ($CF_4$) which selectively reacts with silicon and etches the silicon is activated by microwave discharge and supplied to the silicon substrate. In this case, generated fluorine radicals react with the silicon surface, and silicon atoms are converted into silicon tetrafluoride and eliminated from the silicon substrate surface.

Thereafter, the sample is set in a vacuum apparatus coupled to the etching apparatus without being exposed to air, and heated to a deposition temperature in a non-oxidizing gas, e.g., in an argon (Ar) atmosphere while suppressing the oxidizing gas partial pressure in the vacuum apparatus, e.g., the oxygen ($O_2$) or water ($H_2O$) partial pressure to 0.1 Torr or less. With this process, silicon can be prevented from being oxidized upon absorption of oxygen molecules or water molecules by the active silicon surface exposed by etching during heating.

Subsequently, a silane-based gas, e.g., dichlorosilane ($SiH_2Cl_2$) gas and a halide gas of boron, e.g., boron trichloride ($BCl_3$) are supplied into the reaction chamber. At this time, the dichlorosilane gas and the boron trichloride gas are thermally decomposed on the etched silicon surface. Therefore, a B-doped silicon film can be grown on the etched silicon surface at a high selectivity.

As for the impurity diffused layer formed in this manner, the diffusion layer depth is determined by the etching depth. Therefore, an impurity diffused layer having a predetermined boron concentration can be formed in accordance with the mixing ratio of the dichlorosilane gas to boron trichloride.

The above second aspect will be described later in detail as the 14th and 15th embodiments.

The embodiments of the present invention will be described below with reference to the accompanying drawings.

(First Embodiment)

FIGS. 5A to 5E are sectional views of a MOS transistor, which sequentially show a method of manufacturing this transistor according to the first embodiment of the present invention.

Figure 5A:
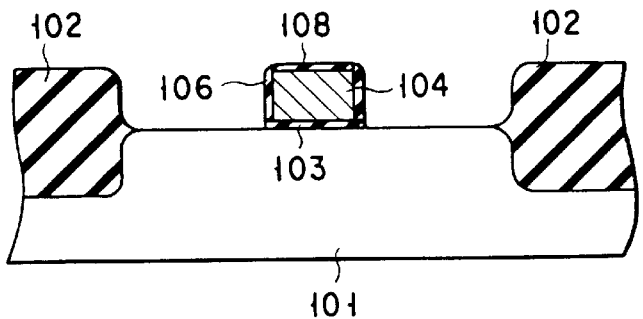
FIGS. 5A to 5E are sectional views of a semiconductor device, which sequentially show a method of manufacturing a semiconductor device according to the first embodiment of the present invention.

As shown in FIG. 5A, on an element region isolated by forming an element isolation insulating film 102 on the surface of an n-type silicon substrate 101 having a resistivity of 4 to 5 Ωcm, a silicon oxide film serving as a gate oxide film 103 is formed by a known method.

Referring to FIG. 5A, a polysilicon film 104 serving as a gate electrode is formed on the gate oxide film 103. The polysilicon film 104 is doped with an impurity by thermal diffusion or the like. After a silicon oxide film 108 is deposited on the entire surface, the silicon oxide film 108 and the polysilicon film 104 are patterned by RIE, thereby forming a gate portion.

Subsequently, a silicon oxide film serving as a side-wall gate oxide film 106 is deposited on the entire surface and etched back by RIE. The silicon oxide film is selectively left on the side wall of the gate portion, thereby forming the side-wall gate oxide film 106.

After the gate oxide film 103 on a region (source/drain region) other than the gate portion is removed, the sample is dipped in an HF solution. A chemically active silicon surface is exposed by rinsing the substrate in pure water with a dissolved oxygen amount of 10 ppm or less. The above processes are shown in FIG. 5A.

If pure water with a large dissolved oxygen amount is used, a native oxide film is undesirably formed on the silicon surface during the rinsing and subsequent drying processes. This disables uniform etching, so no smooth etching surface can be obtained. Therefore, pure water with a small dissolved oxygen amount of 10 ppm or less is preferably used.

The substrate is set in the etching chamber of a vacuum reaction apparatus constituted by the etching chamber and a deposition chamber, which are connected to each other to allow to continuously perform etching and deposition.

The substrate is cooled or heated in the etching chamber to a predetermined temperature of 0° C. to 700° C. Carbon tetrafluoride ($CF_4$) is supplied into the etching chamber at a flow rate of 1 to 500 cc/min. After the flow rate and the pressure are stabilized, an active species generated upon microwave discharge is supplied to the substrate.

Figure 5B:
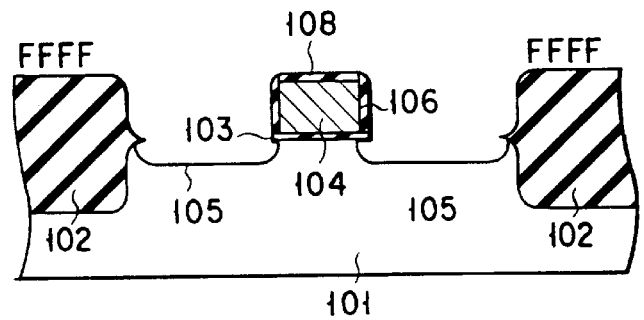
Figure 5C:
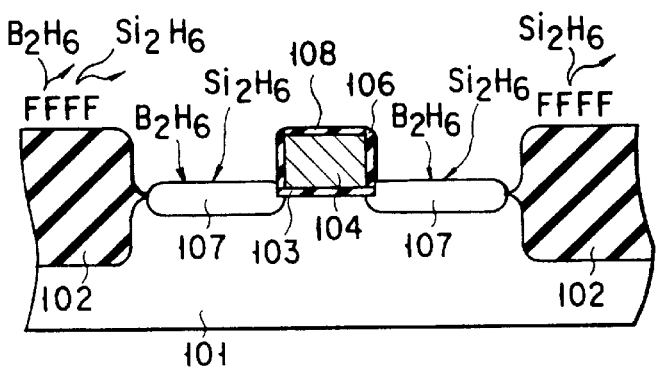

With this process, silicon and fluorine radicals mainly react with each other on the silicon surface and are eliminated, in a form of silicon tetrafluoride ($SiF_4$), from the silicon surface, and etching progresses. As a result, as shown in FIG. 5B, the surface of the silicon substrate 101 on the source/drain regions are etched to a predetermined depth, thereby forming grooves 105 in the substrate surface. Note that etching is performed at a rate of 1 to 20 nm/min.

The substrate is conveyed to the deposition chamber in the vacuum or in a non-oxidizing gas and heated to a predetermined deposition temperature of 300° C. to 550° C. Disilane gas ($Si_2H_6$) is supplied at a flow rate of 10 to 100 cc/min, and diborane gas ($B_2H_6$) is supplied at a flow rate of 0.1 to 100 cc/min. $Si_2H_6$ and $B_2H_6$ are thermally decomposed on only the silicon surface, and amorphous B-doped silicon films 107 are selectively deposited on the exposed surfaces of the silicon substrate 101.

The deposition rate at this time is 1 to 10 nm/min. The boron concentration in the deposited amorphous B-doped silicon film can be controlled to a desired concentration of $1 \times 10^{19}$ to $1 \times 10^{22}$ atoms/cm$^3$ in accordance with the flow rate ratio of $Si_2H_6$ to $B_2H_6$. When the diborane gas is diluted to a desired concentration by an inert gas such as helium, the boron concentration can be determined at a high controllability.

Figure 5D:
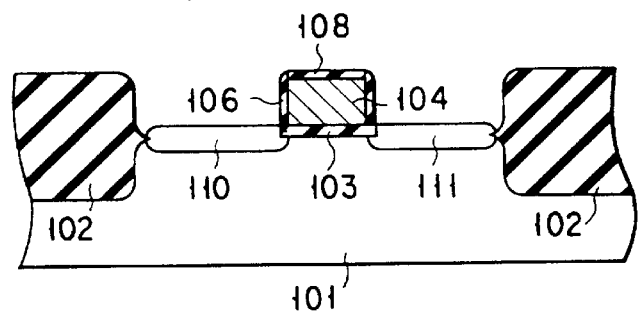

When the amorphous B-doped silicon films 107 deposited in this manner are grown at 600° C. for two hours by solid phase epitaxial growth, p-type source/drain layers 110 and 111 consisting of the amorphous B-doped silicon films are formed, as shown in FIG. 5D. Since these p-type source/drain layers 110 and 111 have no facet, post processing including source/drain electrode formation is not adversely affected. Note that, in an actual use, one of the p-type source/drain layers 110 and 111 is used as a source while the other is used as a drain although they are not distinguished here. This can also be applied to the remaining embodiments.

When the etching depth was 50 nm, and an amorphous B-doped silicon film containing boron at a concentration of $3 \times 10^{20}$ atoms/cm$^3$ was grown to a thickness of 50 nm, the sheet resistance of the source/drain layer was 120 Ω/□.

For this sample, the depth direction of boron was analyzed by SIMS (Secondary-Ion Mass Spectroscopy). As a result, the junction depth and the etching depth coincided with each other. In addition, it was confirmed that the boron concentration abruptly decreased at the p-n junction boundary to exhibit a steep concentration profile.

In this manner, the shallow, heavily dope p-type source/drain layers 110 and 111 can be formed at high controllability and selectivity.

Figure 5E:
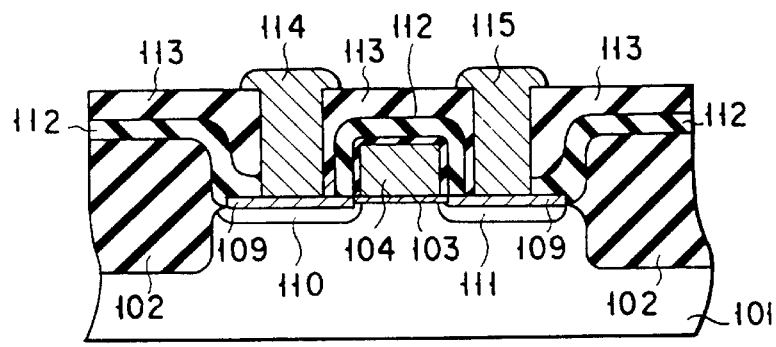

As shown in FIG. 5E, after titanium films are sputtered on the p-type source/drain layers 110 and 111, annealing is performed by RTA at 700° C. for 30 seconds, thereby forming titanium silicide films 109.

Similarly, as shown in FIG. 5E, silicon oxide films 112 and 113 are sequentially deposited by CVD. Thereafter, contact holes are formed by RIE, and B-doped silicon films serving as source/drain electrodes 114 and 115 are deposited in the contact holes.

The B-doped silicon films serving as the source/drain electrodes 114 and 115 can also be selectively deposited in the contact holes by treating the surface thereof with active species generated from $CF_4$ upon microwave discharge.

In this case, the titanium silicide film is used as a silicide film. However, the present invention is not limited to this. Even when a nickel silicide film or a cobalt silicide film is used, the same effect as described above can be obtained.

(Second Embodiment)

Figure 6A:
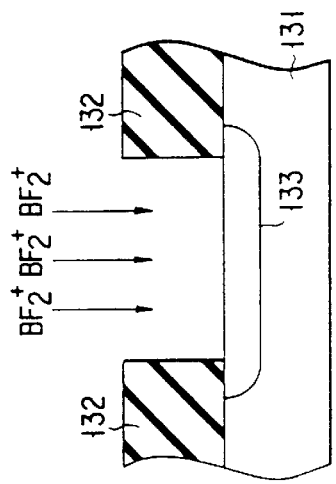
FIGS. 6A to 6C are sectional views of a semiconductor device, which sequentially show a method of manufacturing a semiconductor device according to the second embodiment of the present invention.
Figure 6B:
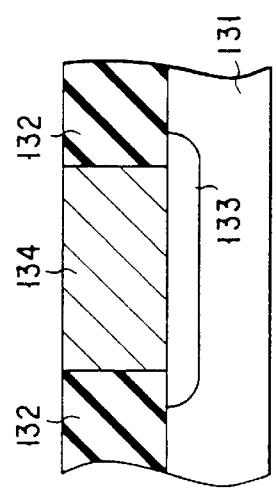
Figure 6C:
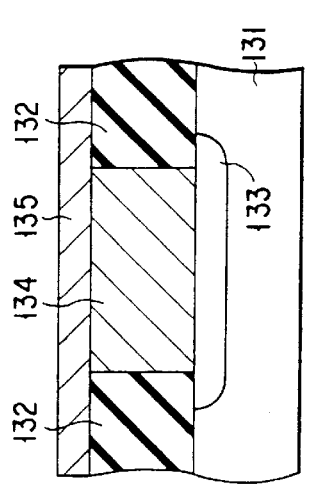

FIGS. 6A to 6C are partial sectional views of a semiconductor device, which sequentially show a method of manufacturing a semiconductor device according to the second embodiment of the present invention. In this embodiment, the present invention is applied to a direct contact portion. More specifically, an example of selective deposition of a B-doped silicon layer will be described.

At first, a resist pattern (not shown) is formed on an n-type silicon substrate 131. This resist pattern is used as a mask to perform ion implantation of $BF_2^+$ into the n-type silicon substrate 131, thereby forming a p-type impurity diffused layer 133. After the resist pattern is removed, a silicon oxide film 132 having a thickness of 600 nm is deposited on the entire surface by CVD. Part of the silicon oxide film 132 on the p-type impurity diffused layer 133 is etched and removed by RIE, thereby forming a groove as a contact hole, as shown in FIG. 6A.

Thereafter, the substrate is set in the etching chamber of a vacuum reaction apparatus constituted by the etching chamber and a deposition chamber, which are connected to each other to allow to continuously perform etching and deposition.

Fluorine radicals generated upon microwave discharge under conditions such as a $CF_4$ flow rate of 25 cc/min and a pressure of 0.3 Torr are supplied onto the substrate surface for about one minute. At this time, the p-type impurity diffused layer 133 in the contact hole is etched to a depth of about 10 nm.

The substrate is carried to the deposition chamber while being kept in the vacuum or in a non-oxidizing atmosphere and heated to a predetermined temperature of 300° C. to 550° C.

Disilane gas ($Si_2H_6$) is supplied into the reaction chamber at a flow rate of 10 to 100 cc/min, and diborane gas ($B_2H_6$) is supplied at a flow rate of 0.1 to 100 cc/min. $Si_2H_6$ and $B_2H_6$ are thermally decomposed on only the surface of the p-type impurity diffused layer 133 in the contact hole, thereby selectively depositing an amorphous B-doped silicon film as a contact electrode 134 on the surface, as shown in FIG. 6B.

The boron concentration of the deposited amorphous B-doped silicon film 134 can be controlled to a desired concentration of $1 \times 10^{19}$ to $1 \times 10^{22}$ atoms/cm$^3$ in accordance with the flow rate ratio of $Si_2H_6$ to $B_2H_6$. In addition, since no facet is formed, the deposited film obtains a smooth surface.

When the amorphous B-doped silicon film obtained in this manner is grown by solid phase epitaxial growth at 600° C. for two hours and used in place of the B-doped silicon films 114 and 115 shown in FIG. 5E, the amorphous B-doped silicon film can be used as source and drain electrodes.

Finally, as shown in FIG. 6C, a CVD polysilicon film serving as a wiring layer 135 is formed on the contact electrode 134.

In the prior art, when the sample is conveyed from the apparatus for performing selective growth to the CVD apparatus for forming the CVD polysilicon film, the sample is exposed to air. For this reason, a native oxide film is formed at the upper portion of the electrode, resulting in an increase in contact resistance between the contact electrode and the wiring layer.

In this embodiment, after the amorphous B-doped silicon film serving as the contact electrode 134 is deposited, the substrate temperature is continuously increased to 700° C. or more without exposing the substrate to air. With this process, a non-selective CVD polysilicon film serving as the wiring layer 135 is formed, and an increase in contact resistance caused by a native oxide film can be prevented.

In this embodiment, ion implantation of $BF_2^+$ is used to form the p-type impurity diffused layer 133 in the contact hole. However, even when a silicon film doped with boron in advance is used, the same effect can be obtained.

For example, a silicon oxide film having a thickness of 600 nm is deposited on an n-type semiconductor substrate by CVD. The silicon oxide film on a region where a p-type impurity diffused layer is to be formed is removed by RIE.

The substrate is set in the vacuum reaction apparatus capable of continuously performing etching and deposition. The bottom portion of the contact hole is etched by a $CF_4$ downflow, and an amorphous B-doped silicon film is selectively deposited on this region, thereby forming a contact region having a desired boron concentration in the p-type impurity diffused layer region on the substrate side. Since these processes are continuously performed, an increase in contact resistance caused by formation of a native oxide film can be prevented.

Various modifications are available as a method of using the impurity-doped silicon film. For example, after a contact hole is formed in a silicon oxide film following the same procedures as described above, the substrate surface is exposed to fluorine radicals generated by a $CF_4$ downflow.

After an amorphous B-doped silicon film is deposited, the sample is annealed in the vacuum or in a non-oxidizing atmosphere at 950° C. for 30 minutes. With this process, the amorphous B-doped silicon film is grown by solid phase epitaxial growth. At the same time, boron is diffused into the substrate, and a p-type impurity diffused layer can be formed without performing ion implantation of $BF_2^+$. Even when the direct contact is formed in this manner, the same effect as described above can be obtained.

Figure 7:
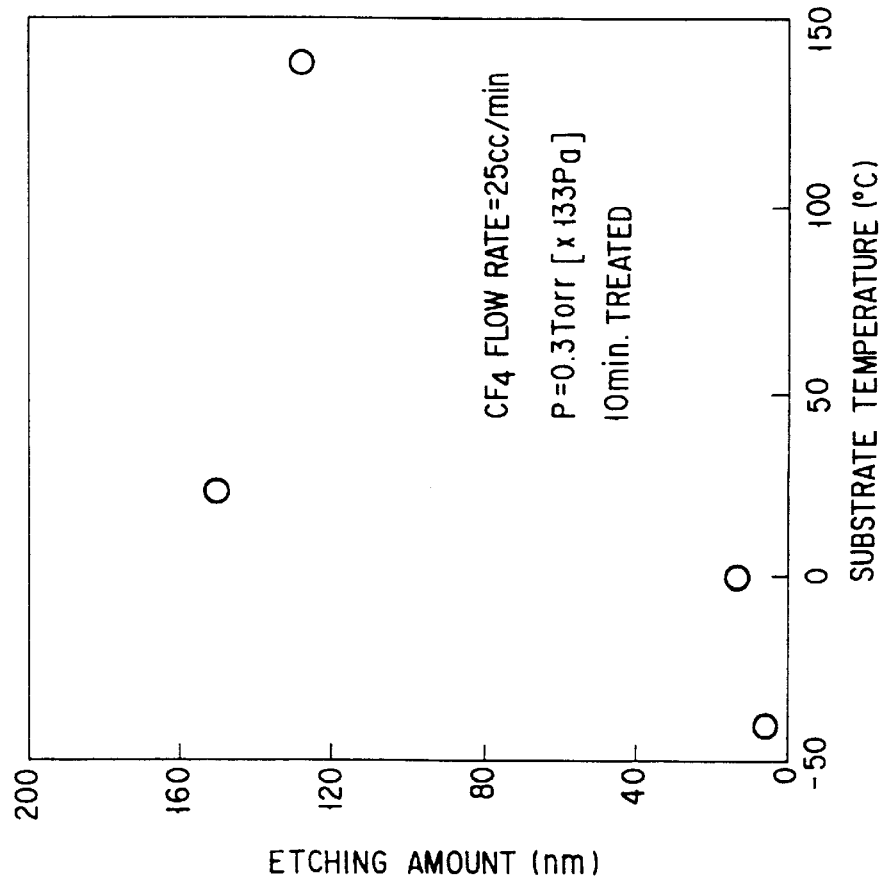
FIG. 7 is a graph showing the relationship between an etching amount and a substrate temperature.

FIG. 7 is a graph showing the relationship between the etching rate and the substrate temperature under conditions such as a $CF_4$ flow rate of 25 cc/min and a pressure of 0.3 Torr. As is apparent from FIG. 7, when the substrate temperature is 0° C. or less, the etching rate is too small for practical use. On the other hand, when the temperature is 700° C. or more, the selective deposition properties cannot be maintained because a large amount of fluorine cannot be left on the oxide film, as will be described later. For this reason, the substrate temperature is preferably 0° C. to 700° C. when fluorine radicals are supplied to the substrate.

To prevent formation of a native oxide film on the silicon substrate during heating, the pressure in the vacuum apparatus must be set to $1 \times 10^{-3}$ Torr, or argon must be supplied at a flow rate of 100 to 5,000 cc/min. This is to decrease the oxidizing gas partial pressure in the vacuum reaction apparatus (deposition chamber). Note that, even when a non-oxidizing gas other than argon is used, the same effect as described above can be obtained.

Figure 8:
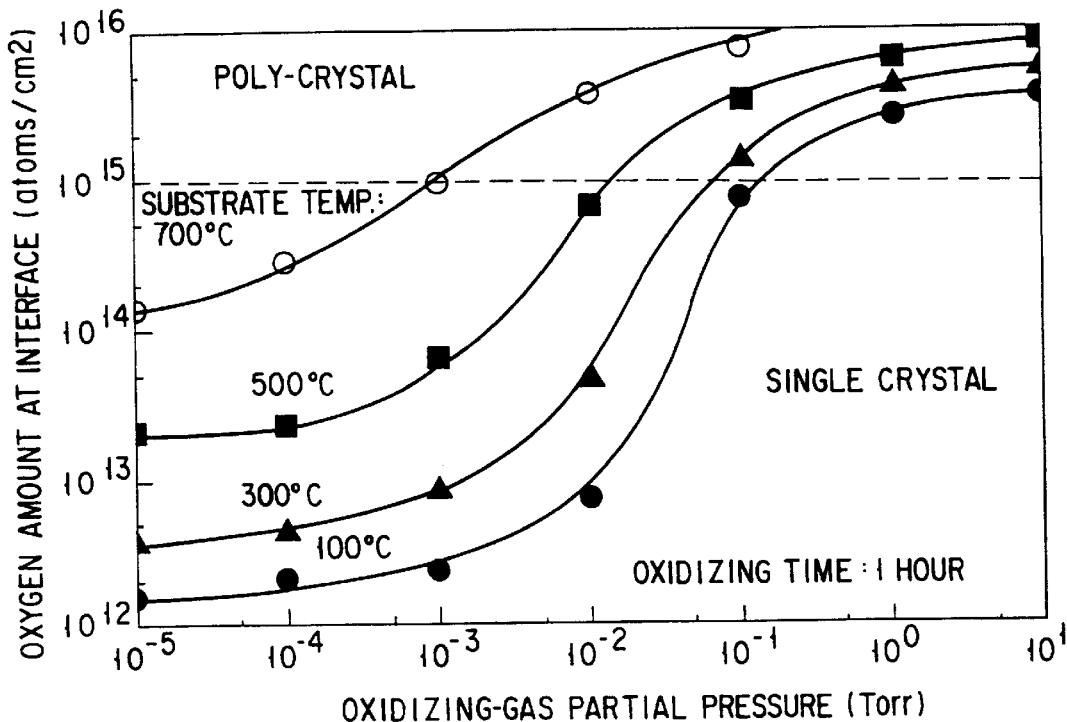
FIG. 8 is a graph showing the relationship between an oxidizing gas partial pressure and an oxygen amount at an interface.

FIG. 8 is a graph showing the relationship between the oxidizing gas partial pressure in the vacuum apparatus (deposition chamber) and the oxygen amount at the interface between the deposited film (silicon film) and the silicon substrate.

As is apparent from FIG. 8, when an amorphous silicon film is deposited and grown by solid phase epitaxial growth, the upper limit of the substrate temperature must be set to 700° C., and the oxidizing gas partial pressure must be set to $1 \times 10^{-3}$ Torr or less in order to obtain a single-crystal silicon film.

Figure 9:
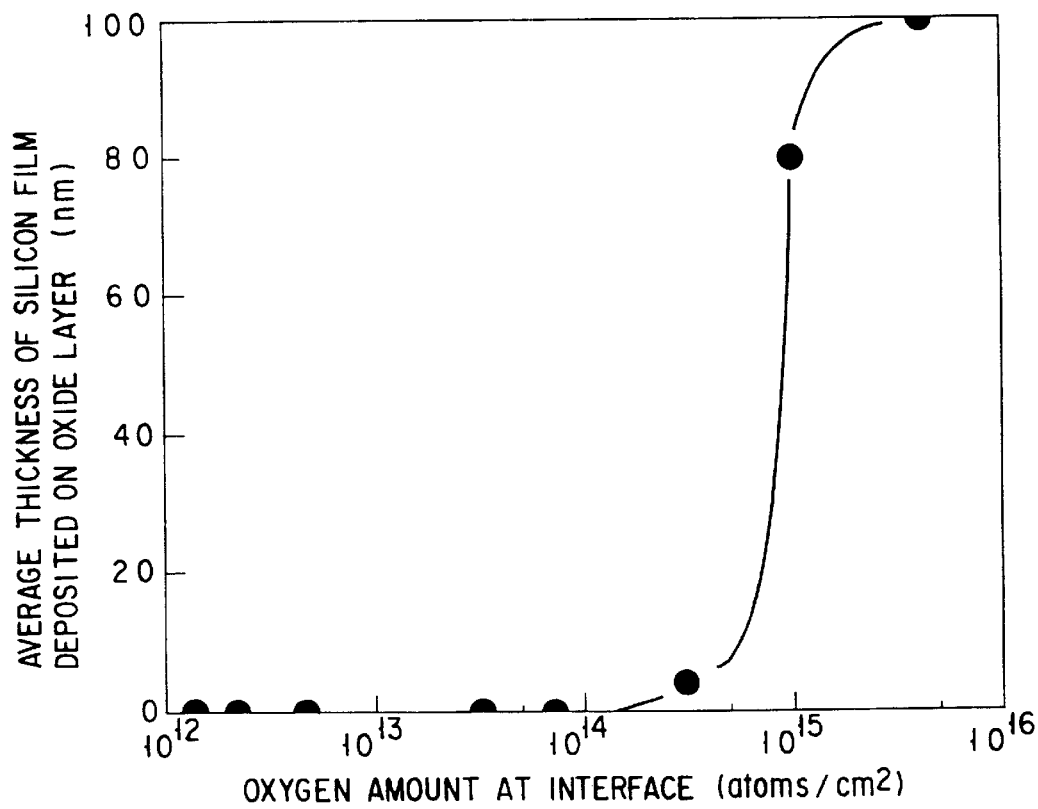
FIG. 9 is a graph showing the relationship between the oxygen amount at the interface and the average thickness of a silicon film deposited on an oxide film.

FIG. 9 is a graph showing the relationship between the oxygen amount at the interface between the deposited film (silicon film) and the silicon substrate, and the thickness of the deposited film on the oxide film. More specifically, the graph shows the average thickness of a silicon film deposited on the silicon oxide film when silicon is deposited on a base having an $SiO_2$ film with an opening portion formed on the silicon substrate. As is apparent from FIG. 9, when the oxygen amount at the interface is suppressed, a satisfactory selectivity for deposition of silicon can be obtained. That is, to suppress deposition of a silicon film on the oxide film, the oxygen amount on the silicon surface must be suppressed to $1 \times 10^{15}$ atoms/cm$^2$ or less.

In this embodiment, the vacuum reaction apparatus constituted by the etching chamber and the deposition chamber, which are connected to each other, is used to keep the process atmosphere to a vacuum or non-oxidizing atmosphere. As shown in FIG. 9, this is to suppress oxidation of the etched and exposed silicon surface and ensure a satisfactory selectivity.

Figure 11:
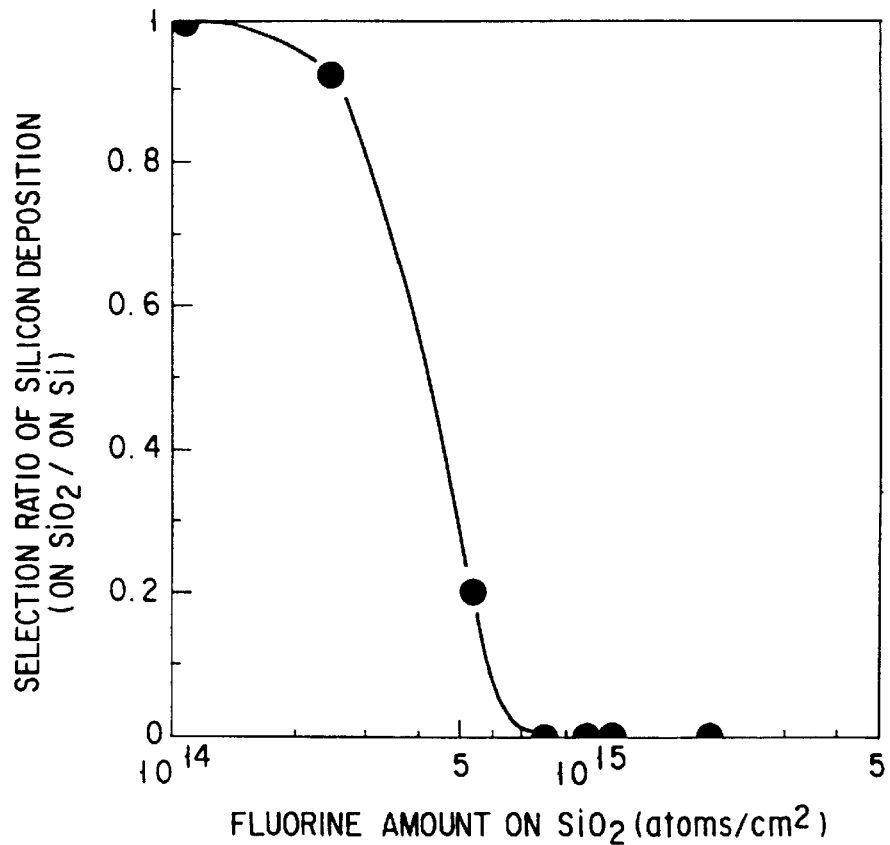
FIG. 11 is a graph showing the relationship between a fluorine amount on a silicon oxide film and the selection ratio of silicon deposition.

When the oxygen amount at the interface exceeds $1 \times 10^{15}$ atoms/cm$^2$, the deposited film grown by solid phase epitaxial growth is crystallized as shown in the photomicrograph of FIG. 10. In addition, diffusion of boron from the B-doped silicon film is impeded to make it difficult to diffuse the impurity at a high controllability. FIG. 11 is a graph showing the result of consideration about the fluorine amount on the silicon oxide film and the selection ratio of silicon deposition. In FIG. 11, the selection ratio means the ratio of silicon deposition amount on the silicon oxide film to the silicon deposition amount on the silicon substrate. As is apparent from FIG. 11, to obtain a satisfactory selection ratio (close to zero), the fluorine amount on the silicon oxide film must be set to $7 \times 10^{14}$ atoms/cm$^2$ or more.

Figure 12:
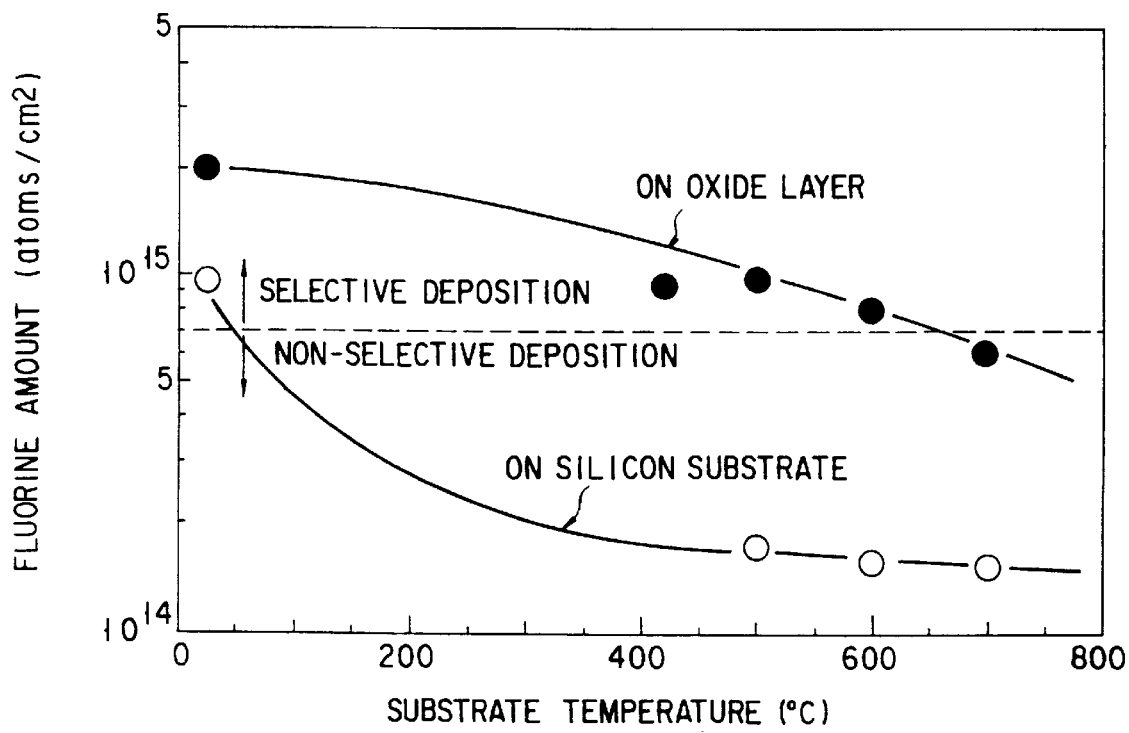
FIG. 12 is a graph showing the dependency of the fluorine amount of the silicon surface and the oxide film surface on the substrate temperature.

FIG. 12 is a graph showing the result of analysis of a change in fluorine amount, in accordance with the temperature, on the silicon surface and the oxide film surface of a sample obtained by $CF_4$ downflow etching (treatment with fluorine radicals) at a $CF_4$ flow rate of 25 cc/min, a pressure of 0.3 Torr, and a substrate temperature of 25° C., which analysis was performed by XPS (X-ray Photoelectron Spectroscopy).

As is apparent from FIG. 12, fluorine on the silicon surface is eliminated as $SiF_x$ when the substrate is heated, and decreased to about $2 \times 10^{14}$ atoms/cm$^2$ at 500° C. On the oxide film, however, fluorine in an amount of about $1 \times 10^{15}$ atoms/cm$^2$ remains even near 500° C.

When an amorphous B-doped silicon film was deposited on a sample etched under the above conditions at a substrate temperature of 500° C., it was confirmed that the film could be selectively deposited on only the silicon surface, as shown in FIG. 13. As described above, in the present invention, since an amorphous film is deposited, no facet having a (111) plane is formed, unlike selective epitaxial growth, and a round end portion is obtained.

Figure 14:
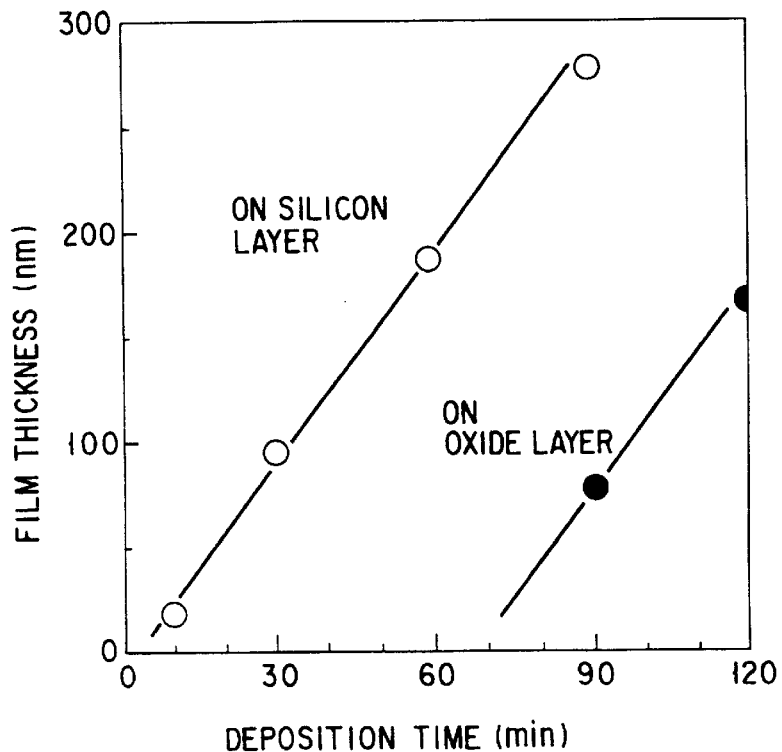
FIG. 14 is a graph showing the dependency of the thickness of an amorphous B-doped silicon film formed on the silicon layer and the oxide film on a deposition time.

FIG. 14 is a graph showing the relationship between the deposition time and the film thickness of amorphous B-doped silicon films formed on a silicon layer and an oxide film, both of which are deposited at 500° C.

As is apparent from FIG. 14, on the oxide film, deposition of the B-doped silicon film is not observed for about one hour after starting to supply $Si_2H_6$ and $B_2H_6$, and an amorphous B-doped silicon film having a thickness of about 200 nm is selectively grown on the silicon layer surface.

Figure 15:
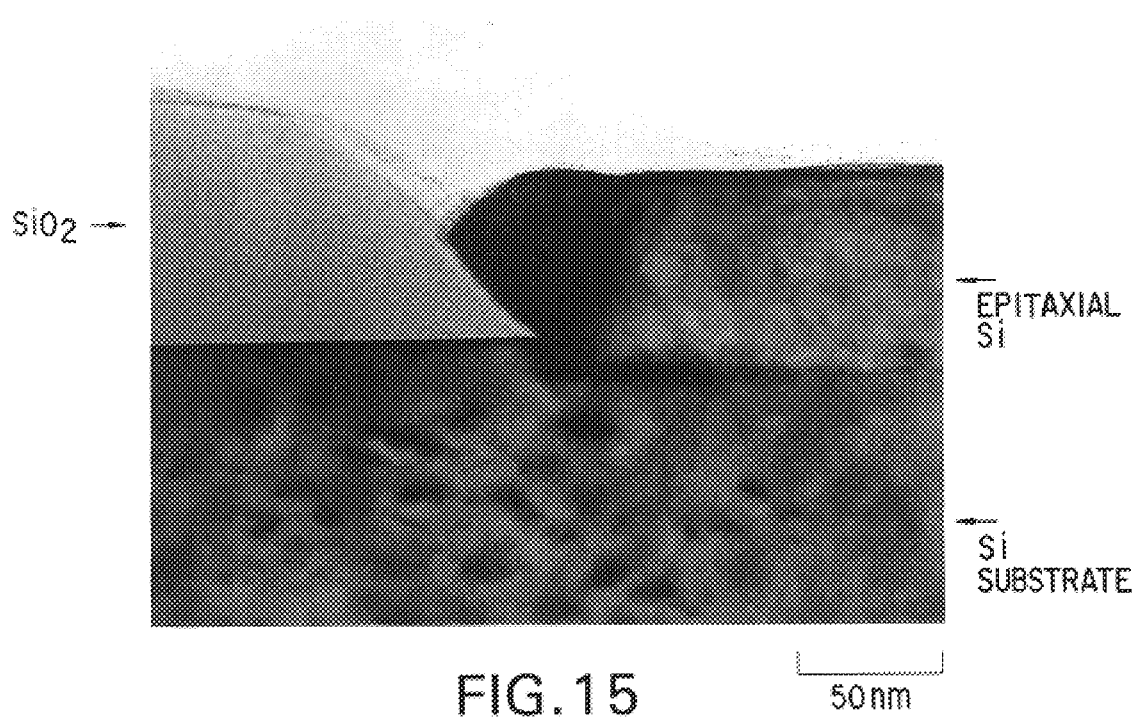
FIG. 15 is another photomicrograph showing the crystal structure of the silicon deposition film formed on the substrate.

When the substrate temperature was increased, and a B-doped silicon film was deposited at 600° C. under the same conditions as described above, the fluorine amount on the oxide film was $8 \times 10^{14}$ atoms/cm$^2$. The deposited film was a selectively grown epitaxial film having a facet formed near the boundary with respect to the oxide film, as shown in the photomicrograph of FIG. 15.

When the substrate temperature was further increased, and particularly, when the temperature was 700° C. or more, the fluorine amount on the oxide film was $7 \times 10^{14}$ atoms/cm$^2$ or less. The selectivity was largely degraded, and a polysilicon layer was deposited even on the oxide film.

Figure 16:
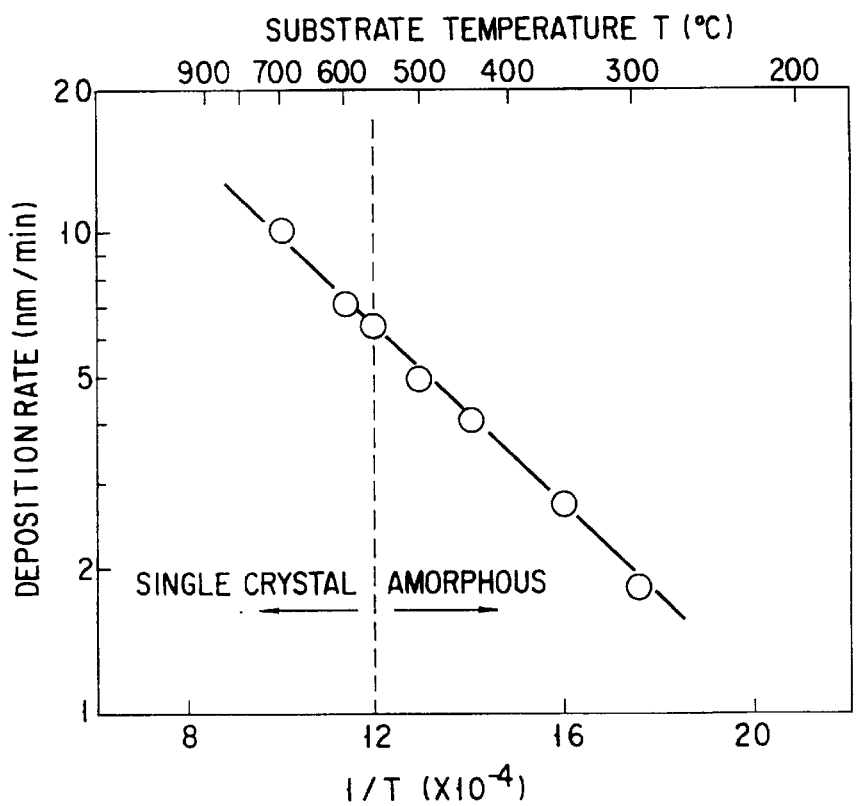
FIG. 16 is a graph showing the relationship between the substrate temperature and the deposition rate of the B-doped silicon film deposited on the silicon substrate.

FIG. 16 is a graph showing the relationship between the substrate temperature and the deposition rate of a B-doped silicon layer deposited on the silicon surface under conditions such as an $Si_2H_6$ flow rate of 100 cc/min, and a $B_2H_6$ (1% He-diluted) flow rate of 5 cc/min.

The crystallinities of samples deposited at the respective substrate temperatures were checked by sectional TEM (Transmission Electron Microscope). An amorphous layer was formed at 500° C. or less. A layer epitaxially grown in some portions was obtained at 550° C. At a higher temperature, a single-crystal silicon film was obtained.

Therefore, it is found that an amorphous silicon film is selectively deposited on only the silicon surface at a temperature of 300° to 550° C., and a single-crystal silicon layer is selectively grown on only the silicon substrate at a temperature of 550° to 700° C. or more.

Figure 17:
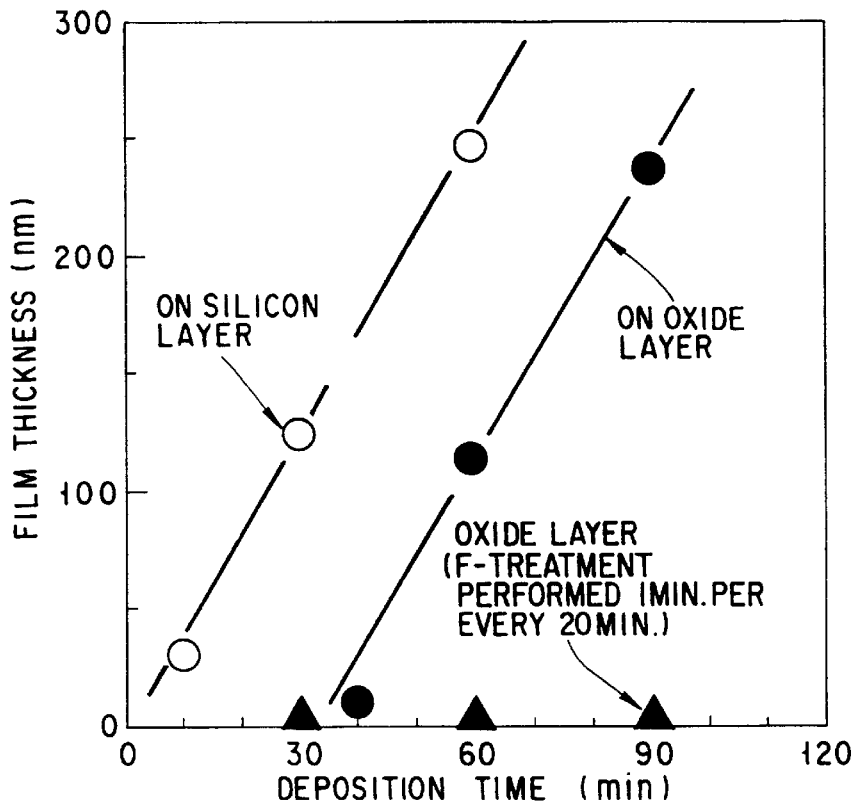
FIG. 17 is a graph showing the relationship between the deposition time and the film thickness for each underlayer for deposition.

FIG. 17 is a graph showing the relationship between the deposition time and the film thickness of an amorphous B-doped silicon film deposited at 550° C. after $CF_4$ downflow etching under the above conditions.

As shown in FIG. 12, fluorine in an amount of about $1 \times 10^{15}$ atoms/cm$^2$ remains on the oxide film. As shown in FIG. 14, the B-doped silicon film is selectively deposited on the silicon film for about 30 minutes after starting to supply $Si_2H_6$ and $B_2H_6$.

Treatment with fluorine radicals is performed for about one minute every 20 minutes before the amorphous silicon is selectively deposited on the oxide film. In this case, deposition on the oxide film can be prevented, as shown in FIG. 17.

Even when a silicon film is deposited on the oxide film, the same effect as described above can be obtained by etching the silicon film on the oxide film by downflow etching. Therefore, satisfactory selective deposition can be achieved.

According to this method, an epitaxially grown silicon layer can be obtained at a substrate temperature of 550° C. to 700° C.

In the above embodiment, $CF_4$ is used as a gas containing fluorine, and an active species is supplied to the substrate by microwave discharge. However, the present invention is not limited to this. Another halogen-based etching gas may be activated by microwave discharge, and halogen radicals may be supplied to the substrate. $SF_6$, $SIF_4$, HF, or the like can be used as another halogen-based etching gas. $BCl_3$ or $BBr_3$ as a liquid material may be gasified and used.

Instead of microwave discharge, a gas containing fluorine, e.g., chlorine trifluoride ($ClF_3$) can also be used to obtain the same effect as described above.

For example, an opening portion is formed in the silicon oxide film by RIE to expose the active silicon surface. Thereafter, the substrate is set in the vacuum reaction apparatus capable of continuously performing etching and deposition and heated to a predetermined temperature of 25° C. to 400° C. after vacuum evacuation.

After the nitrogen gas flow rate is set to an appropriate condition, e.g., 3,000 cc/min and stabilized, chlorine trifluoride gas ($ClF_3$) is supplied at a flow rate of 1 to 1,000 cc/min.

The reason why the nitrogen gas is supplied is that $ClF_3$ is diluted with nitrogen to reduce the etching rate because a quite high reactivity between $ClF_3$ and silicon makes it difficult to control the etching rate. Note that the same effect as described above can be obtained even when an inert gas other than nitrogen is used.

Figure 18:
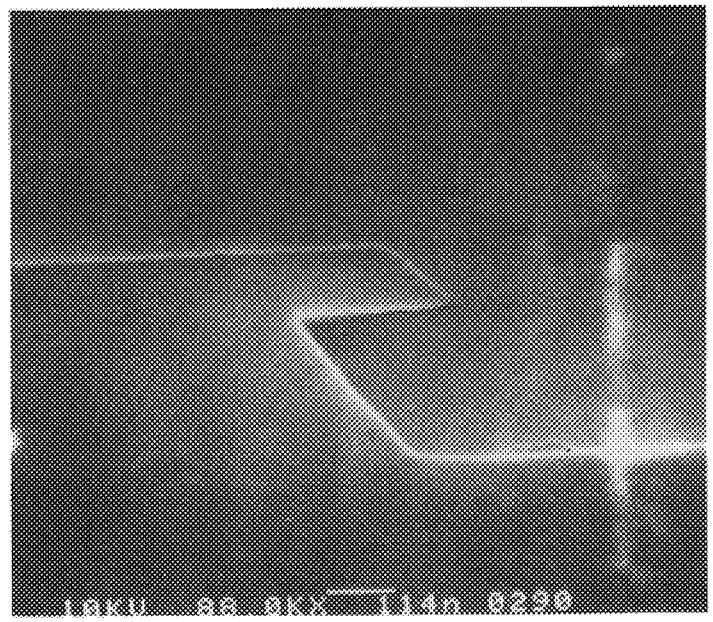
FIG. 18 is a photomicrograph showing the etching state of the substrate surface.

FIG. 18 is a photomicrograph of the SEM image of a sample etched under conditions such as a $ClF_3$ flow rate of 200 cc/min, an $N_2$ flow rate of 3,800 cc/min, a pressure of 1.0 Torr, and a substrate temperature of 300° C. In this case, it is found that a facet having a (111) plane is formed on the etching surface. When the surface of the silicon oxide film of a sample etched under the same conditions as described above was analyzed, it was confirmed that fluorine in an amount of $1\times10^{15}$ atoms/cm$^2$ remained.

After vacuum evacuation, the substrate is heated in the vacuum or in a non-oxidizing gas to a predetermined deposition temperature of 300° C. to 550° C. At this time, as described above, to suppress oxidation of the silicon surface, which is caused by an oxidizing gas containing water or oxygen remaining in the deposition apparatus, to $1\times10^{15}$ atoms/cm$^2$ or less, the oxidizing gas partial pressure in the atmosphere during heating is maintained at $1\times10^{-3}$ Torr.

Subsequently, $Si_2H_6$ is supplied at a flow rate of 10 to 100 cc/min, and $B_2H_6$ is supplied at a flow rate of 0.1 to 100 cc/min. At this time, decomposition and precipitation of $Si_2H_6$ and $B_2H_6$ are suppressed by fluorine remaining on the silicon oxide film, so no B-doped silicon film is deposited. As a result, a B-doped silicon film can be selectively grown on only the silicon surface.

Figure 19:
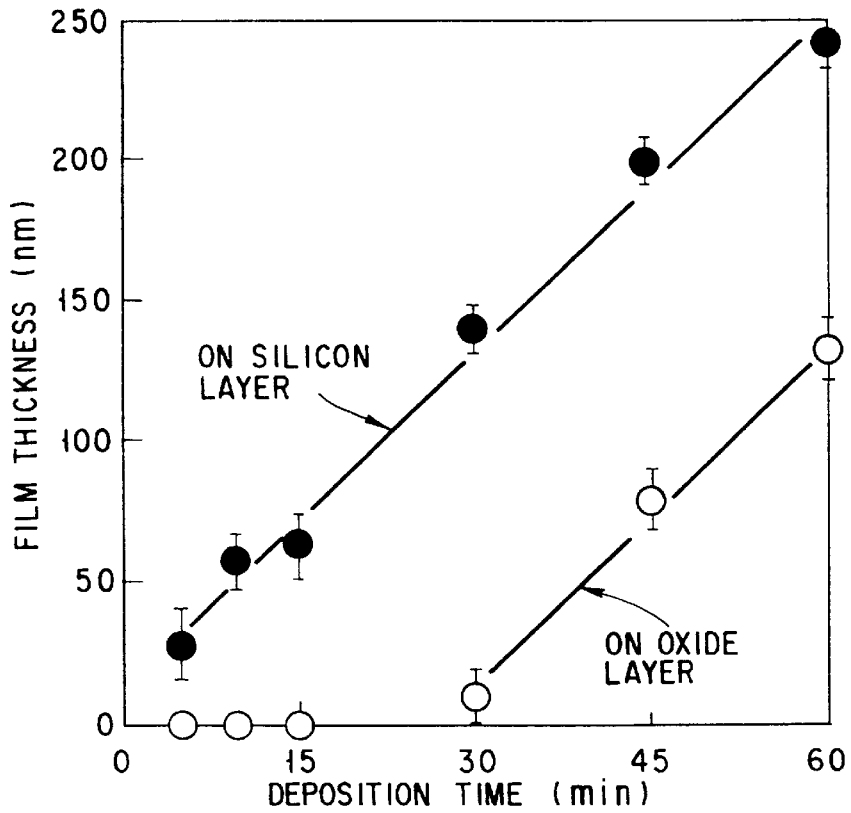
FIG. 19 is a graph showing the relationship between the deposition time and the film thickness under another condition for each underlayer for deposition.

FIG. 19 is a graph showing the relationship between the deposition time and the film thickness, which is observed when a B-doped silicon film is grown under conditions, i.e., a substrate temperature of 350° C., an $Si_2H_6$ flow rate of 100 cc/min, and a $B_2H_6$ (10% He-diluted) flow rate of 200 cc/min after etching under conditions, i.e., a substrate temperature of 300° C., a $ClF_3$ gas flow rate of 200 cc/min, and a nitrogen gas flow rate of 3,800 cc/min.

As is apparent from FIG. 19, no B-doped silicon film is deposited on the silicon oxide film about 30 minutes after starting to supply $Si_2H_6$ and $B_2H_6$, and a B-doped silicon film having a thickness of about 150 nm is selectively grown on the silicon surface.

FIG. 20 is a graph showing the relationship between the film thickness and the deposition time of B-doped silicon films deposited on a silicon surface and a silicon oxide film. The films are formed, after etching is performed under conditions, i.e., a substrate temperature of 300° C., a $ClF_3$ flow rate of 200 cc/min, and an $N_2$ flow rate of 3,800 cc/min, by repeating a process of growing a B-doped silicon film for 15 minutes under conditions, i.e., a substrate temperature of 350° C., an $Si_2H_6$ flow rate of 100 cc/min, a $B_2H_6$ (10% He-diluted) flow rate of 20 cc/min, and a process of supplying $ClF_3$ at a flow rate of 200 cc/min and $N_2$ at a flow rate of 3,800 cc/min for 30 seconds several times. It is found that, under these conditions, growth of the B-doped silicon film on the silicon oxide film can be suppressed.

In this case, $ClF_3$ is used. However, even when another gas containing fluorine is used, the same effect as described above can be obtained.

Disilane ($Si_2H_6$) and diborane ($B_2H_6$) are exemplified as gases for growing a B-doped silicon film. However, the present invention is not limited to these. In addition to silane ($SiH_4$), $SiH_2Cl_2$, $SiCl_4$, $SiF_4$, $Si_2H_4Cl_2$, $SiH_2F2$, $Si_2H_2Cl_4$, $Si_2Cl_6$, $Si_2H_4F_2$, $Si_2H_2F_4$, $Si_2F_6$, $BF_3$, and $BCl_3$ may also be used.

To form an n-type impurity diffused layer, the same effect as described above can be obtained by using phosphine ($PH_3$) or arsine ($AsH_3$), or a halide containing phosphorus or arsenic.

The present invention can also be practiced not only by deposition by simple thermal decomposition but also by a combination of methods for promoting dissociation, e.g., light irradiation.

The oxide film ($SiO_2$) is used as an insulating film. However, the present invention is not limited to this. The same effect as described above can be obtained even when another insulating film as of PSG (phosphosilicate glass), BSG (borosilicate glass), BPSG (borophosphosilicate glass), and $Si_3H_4$.

(Third Embodiment)

FIGS. 21A to 21E are sectional views of a p-channel MOS transistor, which sequentially show a method of manufacturing this transistor according to the third embodiment of the present invention.

Figure 21A:
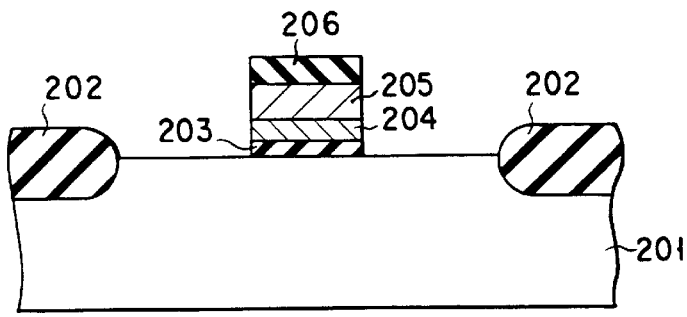
FIGS. 21A to 21E are sectional views of a p-channel MOS transistor, which sequentially show a method of manufacturing this transistor according to the third embodiment of the present invention.

As shown in FIG. 21A, an n-type silicon substrate 201 having a plane orientation (100) and a resistivity of 4 to 6 Ωcm is prepared. An element isolation insulating film 202 having a thickness of about 0.6 μm is formed on the surface of the n-type silicon substrate 201 by normal selective oxidation.

A gate oxide film 203 having a thickness of 10 nm is formed by thermal oxidation. An impurity-doped polysilicon film 204 serving as a gate electrode having a thickness of 100 nm and a tungsten silicide film 205 having a thickness of 300 nm are sequentially formed on the gate oxide film 203.

A silicon oxide film 206 having a thickness of 150 nm is formed on the entire surface by LPCVD (Low-Pressure Chemical Vapor Deposition). Thereafter, the resultant multilayer is etched by reactive ion etching to form a gate portion.

Figure 21B:
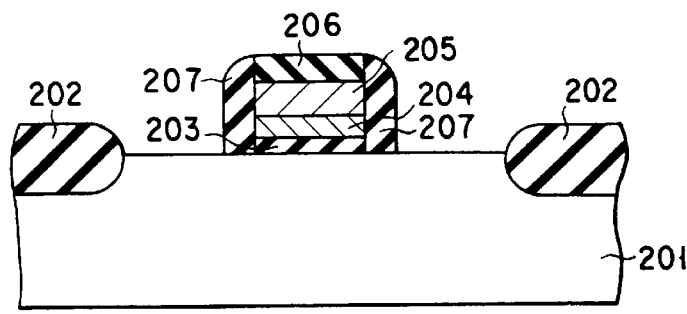

As shown in FIG. 21B, a side-wall gate oxide film 207 consisting of a silicon nitride film having a thickness of about 100 nm is formed on the side wall of the gate portion. The side-wall gate oxide film 207 is obtained by depositing a silicon nitride film having a thickness of 50 nm on the entire surface by CVD, and thereafter, etching the entire surface by anisotropic dry etching.

Figure 21C:
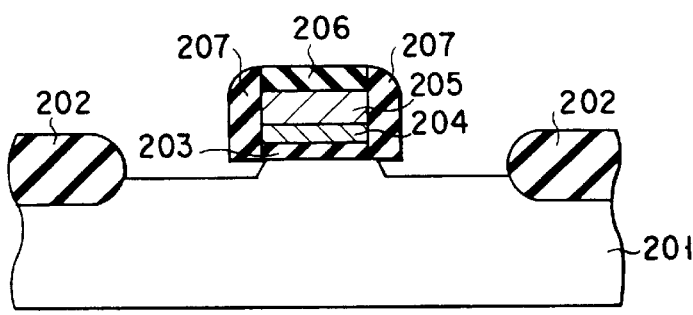

As shown in FIG. 21C, the surface of the silicon substrate 201 on source/drain regions is selectively and isotropically etched to a total etching depth of 50 nm, thereby forming grooves. This etching is performed by causing a gas mixture of, e.g., $CF_4$ and oxygen to perform microwave discharge and supplying the gas mixture onto the sample.

Figure 21D:
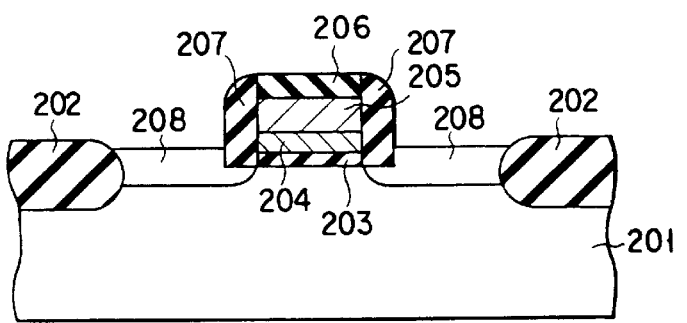

As shown in FIG. 21D, thin silicon films 208 having a thickness of 100 nm and containing 2% of boron are selectively deposited on only the grooves where the surface of the silicon substrate 201 is exposed.

This selective deposition is performed by using a gas mixture of, e.g., $SiH_2Cl_2$ and $BCl_3$ and setting the substrate temperature to 800° C. With this process, heavily doped p-type source/drain diffused layers 209 are formed. The boron concentration in the deposited layers must be at least $10^{19}$ cm$^{-3}$ to form the low-resistance p-type source/drain diffused layers 209.

Figure 21E:
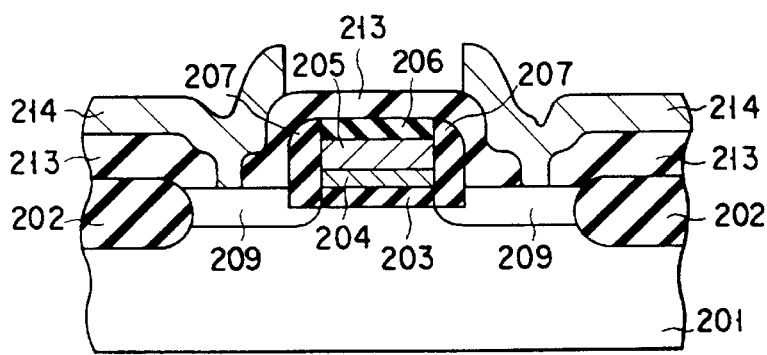

Thereafter, as shown in FIG. 21E, a silicon oxide film 213 having a thickness of 300 nm is deposited on the entire surface by CVD. A contact hole is formed in the silicon oxide film 213 by anisotropic dry etching. An aluminum film having a thickness of 800 nm and containing 0.5% of silicon and 0.5% of copper is deposited and patterned to form source/drain electrodes 214. Thereafter, annealing is performed in a nitrogen atmosphere containing 10% of hydrogen at 450° C. for 15 minutes, thereby completing an MOS transistor.

The characteristics of MOS transistors obtained in the above manner were compared while changing the thickness of the thin silicon film 208 serving as the source/drain layer 209.

FIG. 22 is a graph showing the result obtained when a change in drain current with respect to the drain voltage of a MOS transistor was checked while the deposition thickness of the thin silicon film 208 was set to 50 nm, 100 nm, and 150 nm.

As is apparent from this result, when the deposition thickness is as small as 50 nm, only a drain current value lower than that obtained upon application of an equal drain voltage can be obtained. The reason for this is that the resistance component acts as a series resistance to decrease the drain current value because of the small deposition thickness, i.e., the thin source/drain layer.

When the deposition thickness is as large as 100 nm or more, the series resistance value is determined by an element other than the deposition thickness, so the drain current value does not so largely change.

The value required as the deposition thickness is so large as to exceed the level of the surface of the silicon substrate before etching, though it changes depending on the structure of the transistor. More specifically, when a thin silicon film having a thickness larger than the etching depth is deposited, the parasitic resistance can be decreased.

This is because the sectional area (area of a section perpendicular to the substrate surface) of the source/drain layer is effectively increased, and a lower resistance value than that obtained by doping in ion implantation can be obtained.

In this embodiment, to form a p-channel MOS transistor, silicon containing boron is deposited. To form an n-type MOS transistor, silicon containing phosphorus or arsenic instead of boron must be deposited. In addition, by combining these transistors, a CMOS transistor can be formed, as will be described later.

(Fourth Embodiment)

FIGS. 23A to 23C are sectional views of a p-channel MOS transistor, which sequentially show a method of manufacturing this transistor according to the fourth embodiment of the present invention.

First of all, the manufacturing steps in FIGS. 21A to 21D of the third embodiment are performed. Subsequently, as shown in FIG. 23A, a thin titanium film 210 having a thickness of 25 nm and a thin titanium nitride film 211 having a thickness of 50 nm are sequentially deposited on the entire surface by sputtering.

As shown in FIG. 23B, the resultant structure is annealed in a nitrogen atmosphere at 700° C. for one minute. With this process, the entire thin titanium film 210 reacts with a silicon substrate 201, thereby forming titanium silicide films 212 on only the source/drain regions. Thereafter, the titanium nitride film 211 and the unreacted thin titanium film 210 on an element isolation insulating film 202 are selectively removed by, e.g., an aqueous solution of hydrofluoric acid and a solution mixture of sulfuric acid and hydrogen peroxide.

As shown in FIG. 23C, a silicon oxide film 213 having a thickness of 300 nm is deposited on the entire surface by CVD. Thereafter, a contact hole is formed in the silicon oxide film 213 by anisotropic dry etching. An aluminum film having a thickness of 800 nm and containing 0.5% of silicon and 0.5% of copper is deposited and patterned, thereby forming source/drain electrodes 214. Thereafter, the resultant structure is annealed in a nitrogen atmosphere containing 10% of hydrogen at 450° C. for 15 minutes.

The characteristics of obtained MOS transistors were compared while changing the deposition thickness of the thin silicon film deposited to form the source/drain layers.

FIG. 24 is a graph showing a result obtained when a change in drain current with respect to the drain voltage of a MOS transistor was checked while the deposition thickness of the thin silicon film was set to 50 nm, 100 nm, and 150 nm.

As is apparent from FIG. 24, when the deposition thickness is as small as 50 nm, the drain current value is higher than that obtained when the deposition thickness is larger (100 nm and 150 nm) even without application of a gate voltage (gate voltage: 0 V). The drain voltage is 3.3 V.

FIG. 25 is a graph showing the relationship between the thickness of the deposited silicon layer (source/drain layer) and the drain current. This result is obtained when the thickness of the thin titanium film 210 is 25 nm, the gate voltage is 0 V, and the drain voltage is 3.3 V.

As is apparent from FIG. 25, to suppress the drain current to a low value, a certain deposition thickness (75 nm in this example) is required. This is because silicon on the substrate surface is consumed upon reaction between titanium and silicon. Generally, silicon having a thickness about 2.2 times that of titanium is consumed.

A small deposition thickness causes an increase in leakage current. The reason for this is that the position of junction depth of the source/drain layer becomes close to the boundary between the source/drain layer and the silicide film, and a leakage path is partially formed by three-dimensional patterns at the boundary, or a recombination center is formed upon diffusion of Ti from the boundary into the substrate.

When the deposition thickness is as large as 100 nm or more, some distance can be ensured between the position of junction depth and the boundary between the source/drain layer and the silicide film. For this reason, the leakage current value can be suppressed small.

In this embodiment, titanium is used as a metal for forming a silicide film. However, even when another metal such as nickel, cobalt, platinum, vanadium, or palladium is used, the same effect as described above can be obtained.

However, since the thickness of silicon consumed upon formation of a silicide film changes depending on the types of metals, attention must be paid to the thickness of the silicon film serving as a source/drain layer and the thickness of the metal film serving as a silicide film to suppress leakage of the drain current. The silicon film must be at least thicker than the silicon film to be consumed upon formation of a silicide film.

It is also confirmed that, according to the above third and fourth embodiments in which the source/drain layer is buried, a shallow, low-resistance source/drain layer required for micropatterning of a MOS integrated circuit can be formed.

As for the number of manufacturing steps, in the fourth embodiment, only two steps such as (1) etching of the source/drain region and (2) deposition of a doped silicon film having a thickness larger than the etching depth must be performed from formation of the side-wall gate oxide film to formation of the silicide film. However, in the prior art, four steps such as (1) ion implantation before formation of the side-wall gate oxide film, (2) ion implantation after formation of the side-wall gate oxide film, (3) annealing for restoring defects generated upon ion implantation, and (4) deposition of the silicon film must be performed. Therefore, it is found that the structure of the present invention (buried source/drain layer) has an advantage in decreasing the number of manufacturing steps. More specifically, according to this structure, a shallow, heavily doped source/drain layer can be easily formed.

(Fifth Embodiment)

Figure 26A:
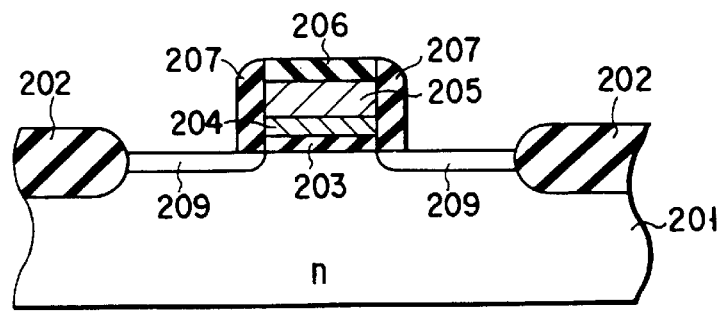
FIGS. 26A to 26C are sectional views of an elevated source/drain type MOS transistor, which sequentially show a method of manufacturing this transistor according to the fifth embodiment of the present invention.
Figure 26B:
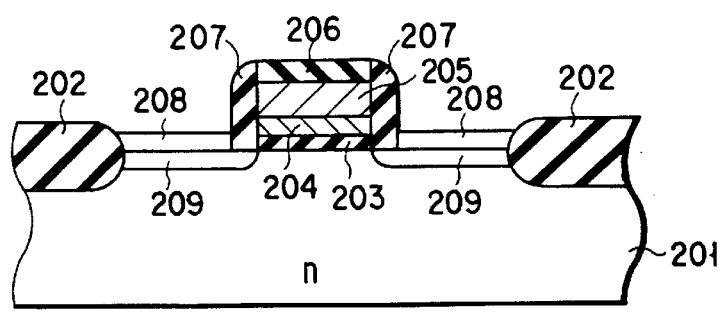
Figure 26C:
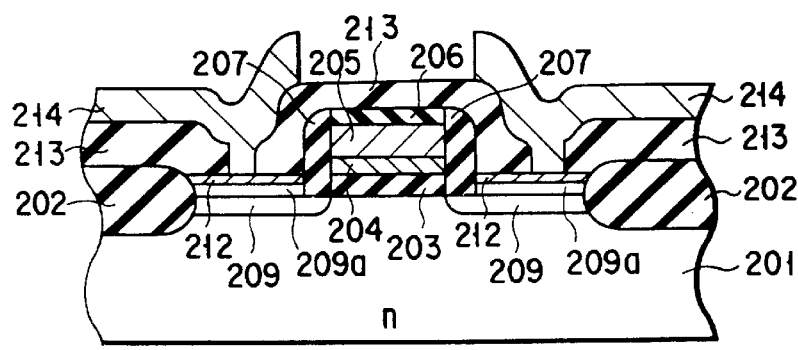

FIGS. 26A to 26C are sectional views of a p-channel MOS transistor, which sequentially show a method of manufacturing this transistor according to the fifth embodiment of the present invention. This embodiment is related to an elevated source/drain technique in which an amorphous silicon layer is deposited on a thin diffused layer.

First of all, the steps in FIGS. 21A and 21B of the third embodiment are performed. Subsequently, as shown in FIG. 26A, the gate electrode is used as a mask to implant $BF_2^+$ ions. The implanted $BF_2^+$ ions are distributed in a silicon substrate 201 around the peak depth depending on the acceleration energy. Thereafter, annealing is performed at 900° C. for 30 seconds to diffuse boron into the silicon substrate 201 and activate the boron, thereby forming diffused layers 209 serving as source/drain regions.

A native oxide film on the silicon surface is removed by a dilute hydrofluoric acid solution or the like. The substrate 201 is conveyed into a vacuum reaction chamber where an active species generated upon microwave discharge of carbon tetrafluoride ($CF_4$) gas is supplied onto the substrate surface. With this process, a large amount of fluorine remains on the surface of the insulating film.

The substrate is shifted to the silicon film deposition process in a vacuum or in a non-oxidizing gas atmosphere. Disilane ($Si_2H_6$) is supplied at a flow rate of 100 SCCM at 500° C. Disilane is decomposed on only the silicon surface, and amorphous silicon films 208 are selectively deposited. $BF_2^+$ ions are implanted into the amorphous silicon films 208, and annealing is performed at 600° C. for two hours, thereby forming an elevated source/drain structure having a low resistance (FIG. 26B).

A thin titanium film having a thickness of 25 nm and a thin titanium nitride film having a thickness of 50 nm are sequentially deposited on the entire surface by sputtering. Annealing is performed in a nitrogen atmosphere at 700° C. for one minute to cause the thin titanium film to react with the amorphous silicon films 208, thereby forming titanium silicide films 212 on only the upper surfaces of the amorphous silicon layers 208 (FIG. 26C). The remaining amorphous silicon films 208 are crystallized while keeping the shape and converted into source/drain layers 209a. That is, each source/drain layer is formed by two layers 209 and 209a.

Thereafter, the titanium nitride film and the unreacted thin titanium film on the insulating film are selectively removed by, e.g., an aqueous solution of hydrofluoric acid and a solution mixture of sulfuric acid and hydrogen peroxide. In addition, a silicon oxide film having a thickness of 300 nm is deposited on the entire surface by CVD, and a contact hole is formed in a silicon oxide film 213 by anisotropic dry etching (FIG. 26C).

An aluminum film having a thickness of 800 nm and containing 0.5% of silicon and 0.5% of copper is formed and patterned, thereby forming source/drain electrodes 214. Thereafter, the resultant structure is annealed in a nitrogen atmosphere containing 10% of hydrogen at 450° C. for 15 minutes, thereby completing a transistor (FIG. 26C).

FIG. 27 is a graph showing a result obtained when the relationship between the gate voltage and the drain current was checked for a transistor having an elevated source/drain structure formed by selectively grown epitaxial silicon film and a transistor formed by the selectively grown amorphous silicon film of the present invention. As is apparent from FIG. 27, when the selectively grown epitaxial silicon film is used for the elevated source/drain structure, a high drain current flows even without application of the gate voltage.

In the transistor formed by the selectively grown amorphous silicon film, the drain current value is lower than the measurement limit when the gate voltage is 0.2 V or less, and it is found that the characteristics are improved. When the selectively grown epitaxial film is used, different facets are formed at the end portions of the growth surface, so the effective thickness is not so increased. The reason for this is as follows. If a silicide film is formed by reaction between a metal and silicon, the metal (titanium in this case) is diffused from this end portion into the substrate, thereby forming carrier generation/recombination center which partially forms a leakage path. To the contrary, when the selectively grown amorphous silicon film is used, no different facet is formed, and a flat amorphous film is deposited. For this reason, the boundary between the source/drain layer and the silicide film can be separated from the p-n junction boundary, thereby preventing titanium from being diffused into the substrate.

In this embodiment, titanium is used as a metal for forming the silicide film. However, even when another metal such as nickel, cobalt, platinum, vanadium, or palladium is used, the same effect as described above can be obtained. However, the elevated thin silicon film must have a thickness larger than that of the metal layer because the thickness of silicon to be consumed upon formation of the silicide film changes depending on the type and thickness of a metal layer.

FIG. 28 is a graph showing a result obtained when the dependency of the threshold voltage on the gate length was checked for the transistor having an elevated source/drain structure formed by the selectively grown epitaxial silicon film and the transistor having an elevated source/drain structure formed by the selectively grown amorphous silicon film of the present invention. Referring to FIG. 25, when the elevated source/drain structure is formed by the selectively grown epitaxial silicon film, and $BF_2^+$ ions as in the source/drain region are implanted (indicated by Δ in FIG. 28), the threshold voltage decreases as the gate length becomes smaller. On the other hand, when the elevated source/drain structure is formed by the selectively grown amorphous silicon film, no decrease in voltage is observed.

Figure 29A:
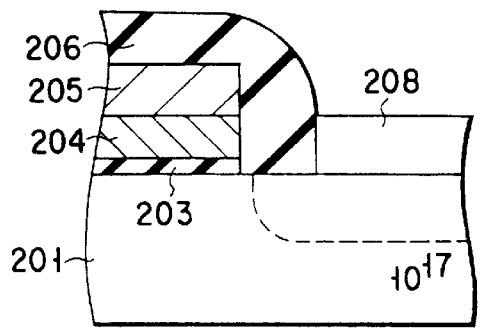

The reason for this will be described with reference to FIGS. 29A and 29B. FIG. 29A is a view showing the concentration distribution (indicated by a dotted line) of an ion-implanted impurity, which is obtained when the selectively grown amorphous silicon film 208 formed in accordance with the method of the present invention is used. It is found that a shallow diffused layer is uniformly formed. A number in FIG. 29A represents a concentration, and its unit is $cm^{-3}$.

Figure 29B:
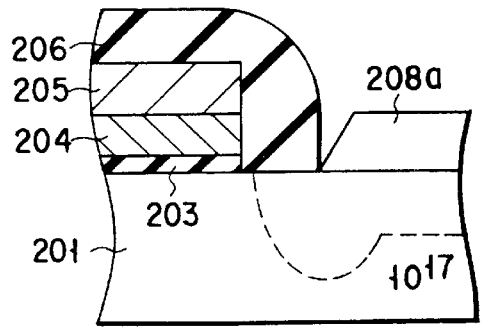

FIG. 29B is a view showing the impurity concentration distribution of a comparative example in which a selectively grown epitaxial silicon layer 208a is used as a selectively deposited layer. In this case, a taper portion is formed by different facets at the end portions of the growth surface. If ion implantation is performed in this state, the ions reach the deep portion of the substrate to change the impurity distribution in the source/drain layer, thereby causing the short channel effect.

To the contrary, when the deposited layer 208 is formed by the amorphous silicon film (represented by ○ in FIG. 28), the different facets are not formed. For this reason, even when ion implantation is performed, the impurity profile in the source/drain layer does not change, and the short channel effect can be prevented.

In this case, when the thin silicon film is to be deposited, a B-doped amorphous silicon film can be obtained by simultaneously supplying diborane ($B_2H_6$) as a doping gas at a flow rate of 2 SCCM. This thin silicon film can be deposited at a low temperature of 300° C. The thin silicon film is crystallized and converted into a B-doped silicon film having a low resistivity of 0.3 Ωcm. For this reason, ion implantation becomes unnecessary. Even when a selectively grown B-doped epitaxial silicon film is used, a film having a low resistivity can be obtained without performing ion implantation. However, as shown in FIG. 27, a high drain current flows because of facets at the end portions of the growth surface even when no gate voltage is applied.

A PMOS has been exemplified above. For an NMOS, a deposited film doped with a Group V element such as P or As can be formed by supplying $AsH_3$ or $PH_3$ together with silane.

In this embodiment, a normal silicon substrate is used as a semiconductor substrate. However, an SOI substrate or a SIMOX wafer may also be used.

The preprocessing halogen gas for selective deposition or the gas for depositing the amorphous silicon film can be replaced with various gases described in the second embodiment.

Even when the diffused layer in the substrate is formed by ion implantation, and only the elevated layer is formed by selective deposition of an amorphous silicon film, as in this embodiment, the desired effect can be obtained.

(Sixth Embodiment)

FIGS. 30A to 30E are sectional views of a MOS transistor, which sequentially show a method of manufacturing this transistor using an SOI (Semiconductor On Insulator) substrate according to the sixth embodiment of the present invention.

In the sixth to 11th embodiments, a silicon oxide film and a silicon film are used as an SOI insulating film and an SOI semiconductor film, respectively. However, another insulating film and another semiconductor film may also be used.

Figure 30A:
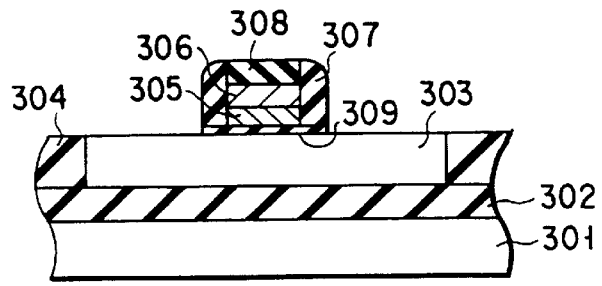
FIGS. 30A to 30E are sectional views of a MOS transistor, which sequentially show a method of manufacturing this transistor using an SOI substrate according to the sixth embodiment of the present invention.

As shown in FIG. 30A, an SOI substrate in which a silicon oxide film (SOI insulating film) 302 and an n-type silicon layer (SOI semiconductor film) 303 are sequentially formed on a silicon base plate 301 is prepared. The n-type silicon layer 303 has, e.g., a plane orientation (100), a resistivity of 4 to 6 Ωcm, and a thickness of 50 nm.

A trench is formed in the n-type silicon layer 303 by RIE, and the silicon oxide film is buried with an organic silicon compound such as TEOS (tetraethylorthosilicate). Annealing is performed at a high temperature, thereby forming a normal buried element isolation insulating film 304.

Subsequently, a gate oxide film 309 having a thickness of 10 nm is formed by thermal oxidation. An impurity-doped polysilicon film 305 serving as a gate electrode having a thickness of 70 nm and a tungsten silicide film 306 having a thickness of 20 nm are sequentially formed on the gate oxide film 309. A silicon oxide film 308 having a thickness of 10 nm is formed on the surface by LPCVD. The resultant multilayer is etched by RIE, thereby forming a gate portion.

After a silicon nitride film serving as a sidewall gate oxide film 307 having a thickness of 50 nm is deposited on the entire surface by CVD, the entire surface of this silicon nitride film is etched by anisotropic dry etching, thereby forming the side-wall gate oxide film 307.

Figure 30B:
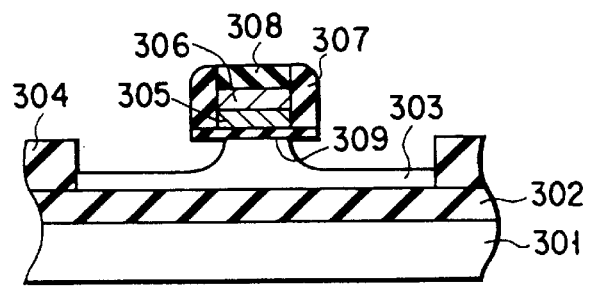

As shown in FIG. 30B, the surface of the n-type silicon layer 303 on the source/drain regions is selectively etched by isotropic etching to an etching depth of 40 nm.

This etching is performed by supplying fluorine radicals obtained by microwave discharge of, e.g., $CF_4$ gas onto the substrate. The etching is performed not to expose the underlying silicon oxide film 302.

Figure 30C:
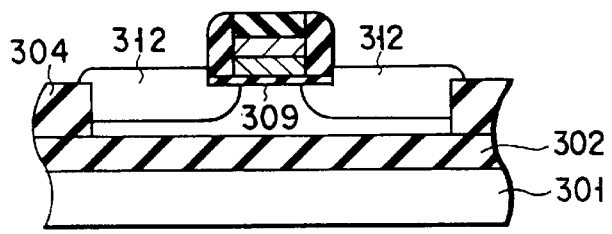

As shown in FIG. 30C, silicon films serving as p-type source/drain layers 312 containing boron as a p-type impurity are selectively deposited on only the exposed silicon surfaces to a thickness of 50 nm. This process is performed in a continuous vacuum process without exposing the substrate to air.

This selective deposition is performed by using a gas mixture of, e.g., $Si_2H_6$ and $B_2H_6$ and setting the substrate temperature to 300° C. The silicon film deposited under these conditions is in an amorphous state, so no facet is formed.

When the substrate temperature during deposition is set to 550° C. or more, the silicon film is obtained as a selectively grown epitaxial film. To form a source/drain layer having a low resistivity, the concentration of boron contained in this silicon film must be at least $1 \times 10^{19}$ atoms/cm$^{-3}$. A silicon film having such a concentration can be obtained by controlling the mixing ratio of $Si_2H_6$ to $B_2H_6$.

Figure 30D:
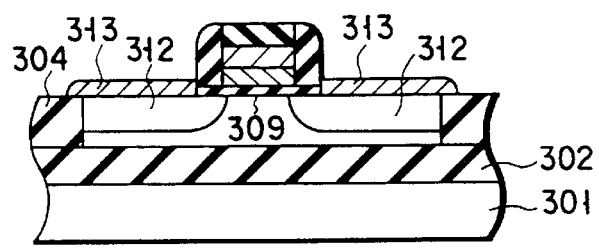

As shown in FIG. 30D, a titanium film having a thickness of 30 nm and a thin titanium nitride film having a thickness of 50 nm are sequentially formed on the entire surface by sputtering. Thereafter, annealing is performed in a nitrogen atmosphere at 700° C. for one minute to cause the entire titanium film to react with the silicon layer, thereby forming a titanium silicide film 313 on only the source/drain regions.

Thereafter, only the thin titanium nitride film and the unreacted thin titanium film on the insulating film are selectively removed by, e.g., an aqueous solution of hydrofluoric acid and a solution mixture of sulfuric acid and hydrogen peroxide.

Figure 30E:
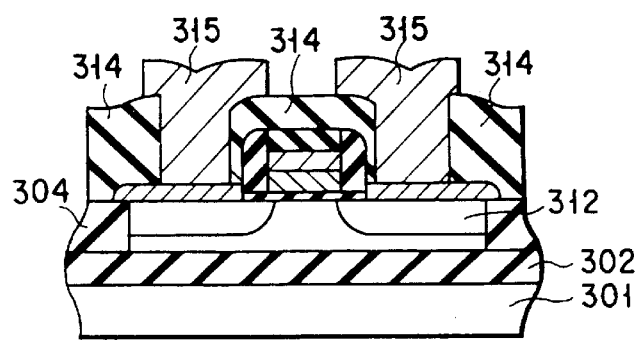

As shown in FIG. 30E, a silicon oxide film 314 having a thickness of 300 nm is deposited on the entire surface by CVD, and thereafter, a contact hole is formed in the silicon oxide film 314 by anisotropic dry etching. An aluminum film having a thickness of 800 nm and containing 0.5% of silicon and 0.5% of copper is deposited and patterned, thereby forming source/drain electrodes 315. Annealing is performed in a nitrogen atmosphere containing 10% of hydrogen at 450° C. for 15 minutes, thereby completing a transistor.

In this embodiment as well, the shallow, heavily doped source/drain layer can be formed by burying the source/drain layer even when elements become finer, as in the fourth embodiment. Therefore, the short channel effect can be effectively prevented.

(Seventh Embodiment)

FIGS. 31A to 31F are sectional views of a MOS transistor, which sequentially show a method of manufacturing this transistor using an SOI substrate according to the seventh embodiment of the present invention.

As shown in FIG. 31A, an SOI substrate consisting of an n-type silicon layer 303 having a plane orientation (100), a resistivity of 4 to 6 Ωcm, and a thickness of 50 nm is used to form an element isolation insulating film 304 and a gate portion, as in the sixth embodiment.

As shown in FIG. 31B, $CF_4$ gas is caused for microwave discharge to supply fluorine radicals onto the substrate. Etching is performed to a depth larger than the thickness of the n-type silicon layer 303, thereby exposing a silicon oxide film 302. When such deep etching is performed, the substrate can be etched to a portion near the gate edge as compared to the fifth embodiment.

As shown in FIG. 31C, a p-type silicon layer 312a containing boron as a p-type impurity at a desired concentration and having a thickness of 50 nm is deposited on the entire surface. This process is continuously performed from the preceding etching process without exposing the substrate to air.

This deposition is performed by using a gas mixture of, e.g., $Si_2H_6$ and $B_2H_6$ and setting the substrate temperature to 300° C. The silicon film deposited under these conditions is in an amorphous state and uniformly deposited on the entire surface.

As shown in FIG. 31D, the entire surface of the silicon film 312a is etched by anisotropic dry etching, thereby selectively leaving the silicon film 312a on the side wall of the gate portion and at the end portions of the element isolation insulating film 302.

As shown in FIG. 31E, a thin titanium film having a thickness of 30 nm and a thin titanium nitride film having a thickness of 50 nm are sequentially deposited on the entire surface by sputtering. Thereafter, annealing is performed in a nitrogen atmosphere at 700° C. for one minute, thereby causing the entire thin titanium film to react with the n-type silicon layer. With this process, titanium silicide films 313 are formed on only the source/drain regions.

The thin titanium nitride film and the unreacted thin titanium film on the insulating film are selectively removed by, e.g., an aqueous solution of hydrofluoric acid and a solution mixture of sulfuric acid and hydrogen peroxide.

As shown in FIG. 31F, a silicon oxide film 314 having a thickness of 300 nm is deposited on the entire surface by CVD. A contact hole is formed in the silicon oxide film 314 by anisotropic dry etching. An aluminum film having a thickness of 800 nm and containing 0.5% of silicon and 0.5% of copper is deposited and patterned, thereby forming source/drain electrodes 315. Thereafter, annealing is performed in a nitrogen atmosphere containing 10% of hydrogen at 450° C. for 15 minutes, thereby completing a transistor.

In this embodiment, after the amorphous silicon layer 312a is deposited on the entire surface, anisotropic dry etching is performed to a depth reaching the silicon oxide film 302, thereby forming the source/drain layers. Even with such a forming method, a MOS transistor coping with micropatterning can be formed.

(Eighth Embodiment)

FIGS. 32A to 32G are sectional views of a MOS transistor, which sequentially show a method of manufacturing this transistor using an SOI substrate according to the eighth embodiment of the present invention.

Steps in FIGS. 32A to 32D are performed as in FIGS. 31A to 31D of the seventh embodiment.

Figure 32A:
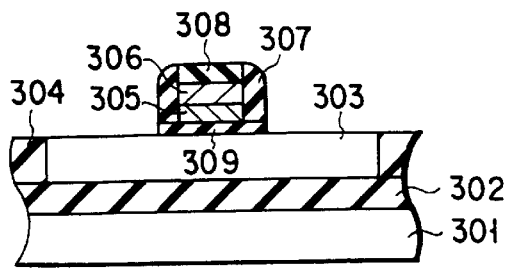
FIGS. 32A to 32G are sectional views of a MOS transistor, which sequentially show a method of manufacturing this transistor using an SOI substrate according to the eighth embodiment of the present invention.
Figure 32B:
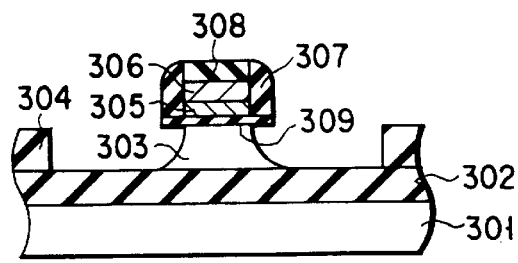
Figure 32C:
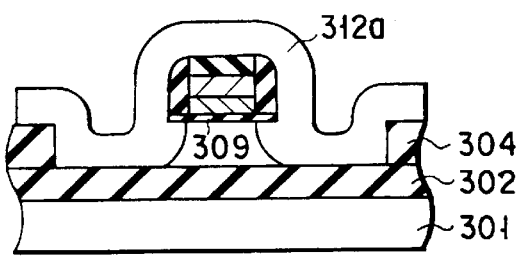
Figure 32D:
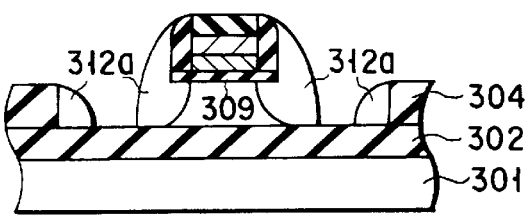
Figure 32E:
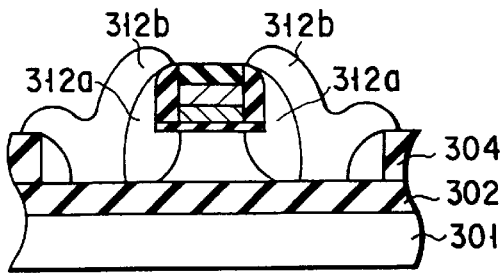
Figure 32F:
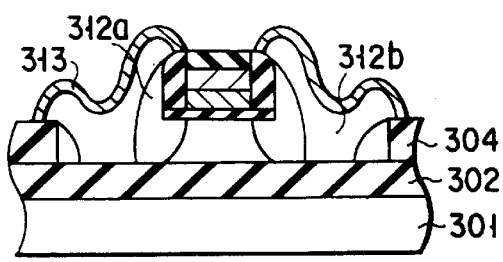
Figure 32G:
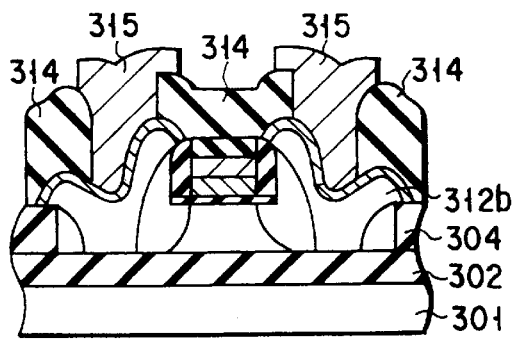

As shown in FIG. 32E, after $CF_4$ gas is caused for microwave discharge to supply fluorine radicals onto the substrate, silicon films 312a containing boron at a desired concentration are selectively deposited on silicon films 312a. This process is continuously performed from the preceding etching process without exposing the substrate to air.

This deposition is performed by using a gas mixture of, e.g., $Si_2H_6$ and $B_2H_6$ and setting the substrate temperature to 300° C. The silicon film deposited under these conditions is in an amorphous state.

As shown in FIG. 31F, a thin titanium film having a thickness of 30 nm and a thin titanium nitride film having a thickness of 50 nm are sequentially deposited on the entire surface by sputtering. Thereafter, annealing is performed in a nitrogen atmosphere at 700° C. for one minute, thereby causing the entire thin titanium film to react with the n-type silicon layer. With this process, titanium silicide films 313 are selectively formed on the source/drain regions. The thin titanium nitride film and the unreacted thin titanium film on the insulating film are selectively removed by, e.g., an aqueous solution of hydrofluoric acid and a solution mixture of sulfuric acid and hydrogen peroxide.

The electrode forming process in FIG. 23G is performed as in FIG. 31F of the seventh embodiment, thereby completing the transistor.

In this embodiment, the process of selectively forming the source/drain layer of amorphous silicon is added to the seventh embodiment. With this process, electrodes 315 can be more properly connected.

(Ninth Embodiment)

FIGS. 33A to 33E are sectional views of a MOS transistor, which sequentially show a method of manufacturing this transistor using an SOI substrate according to the ninth embodiment of the present invention.

Figure 33A:
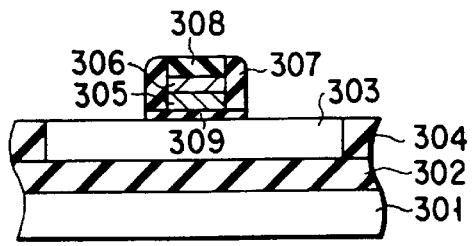
FIGS. 33A to 33E are sectional views of a MOS transistor, which sequentially show a method of manufacturing this transistor using an SOI substrate according to the ninth embodiment of the present invention.
Figure 33B:
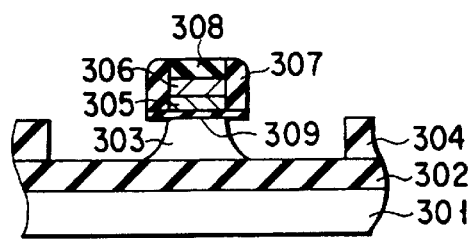

Steps in FIGS. 33A and 33B are performed as in the seventh embodiment.

Figure 33C:
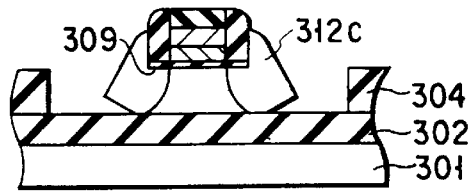

As shown in FIG. 33C, silicon films 312c containing boron as a p-type impurity at a desired concentration are selectively deposited on an n-type silicon layer without exposing the substrate to air.

When this selective deposition is performed by using a gas mixture of, e.g., $Si_2H_6$ and $B_2H_6$ and setting the a substrate temperature to 550° C. or more, the silicon film 312c is obtained as a selectively grown epitaxial layer having facets formed at end portions separated from the gate electrode.

Figure 33D:
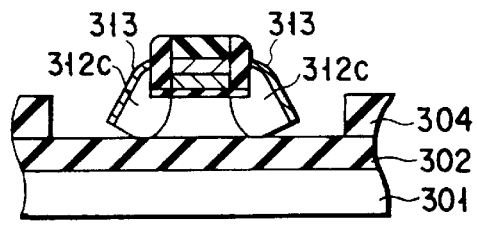

As shown in FIG. 33D, a thin titanium film having a thickness of 30 nm and a thin titanium nitride film having a thickness of 50 nm are sequentially deposited on the entire surface by sputtering. Thereafter, annealing is performed in a nitrogen atmosphere at 700° C. for one minute, thereby causing the entire thin titanium film to react with the n-type silicon film. With this process, titanium silicide films 313 are selectively formed on the source/drain regions. The thin titanium nitride film and the unreacted thin titanium film on the insulating film are selectively removed by, e.g., an aqueous solution of hydrofluoric acid and a solution mixture of sulfuric acid and hydrogen peroxide.

Figure 33E:
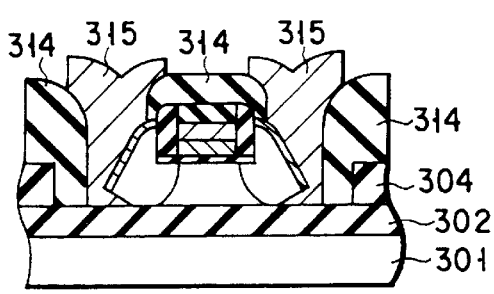

The electrode forming process in FIG. 33E is performed as in the process of FIG. 31F of the seventh embodiment, thereby completing a MOS transistor.

According to this embodiment, a MOS transistor coping with micropatterning can be formed by selectively forming the source/drain layers by epitaxially grown layers.

(10th Embodiment)

FIGS. 34A to 34E are sectional views of a MOS transistor, which sequentially show a method of manufacturing this transistor using an SOI substrate according to the 10th embodiment of the present invention.

Figure 34A:
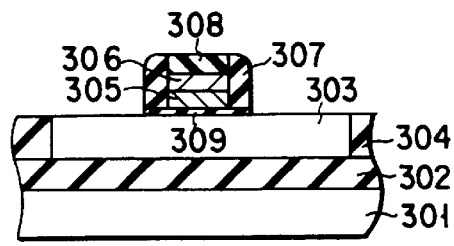
FIGS. 34A to 34E are sectional views of a MOS transistor, which sequentially show a method of manufacturing this transistor using an SOI substrate according to the 10th embodiment of the present invention.
Figure 34B:
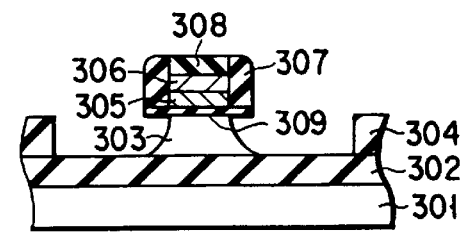
Figure 34C:
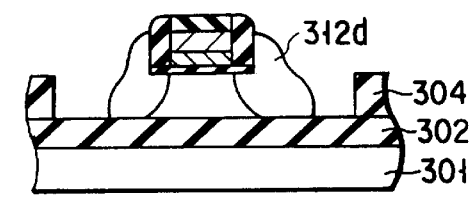

This embodiment is a modification of the ninth embodiment, and steps in FIGS. 34A and 34B are performed as in the seventh embodiment. As shown in FIG. 34C, silicon layers 312d containing boron as a p-type impurity at a desired concentration are selectively deposited on the surface of an n-type silicon layer without exposing the substrate to air. This selective deposition is performed by using a gas mixture of, e.g., $Si_2H_6$ and $B_2H_6$ and setting the substrate temperature to 330° C. The silicon film deposited under these conditions is in an amorphous state.

Figure 34D:
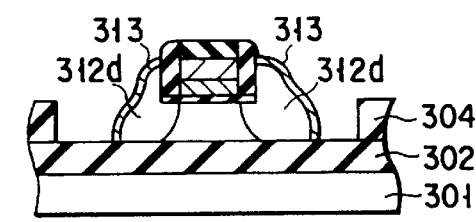
Figure 34E:
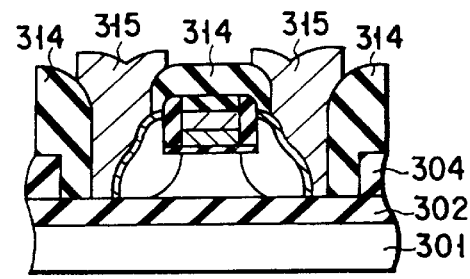

Processes in FIGS. 34D and 34E are the same as those in the ninth embodiment. According to this embodiment, a MOS transistor coping with micro-patterning can be formed by selectively forming the source/drain layers by amorphous silicon.

Figure 35:
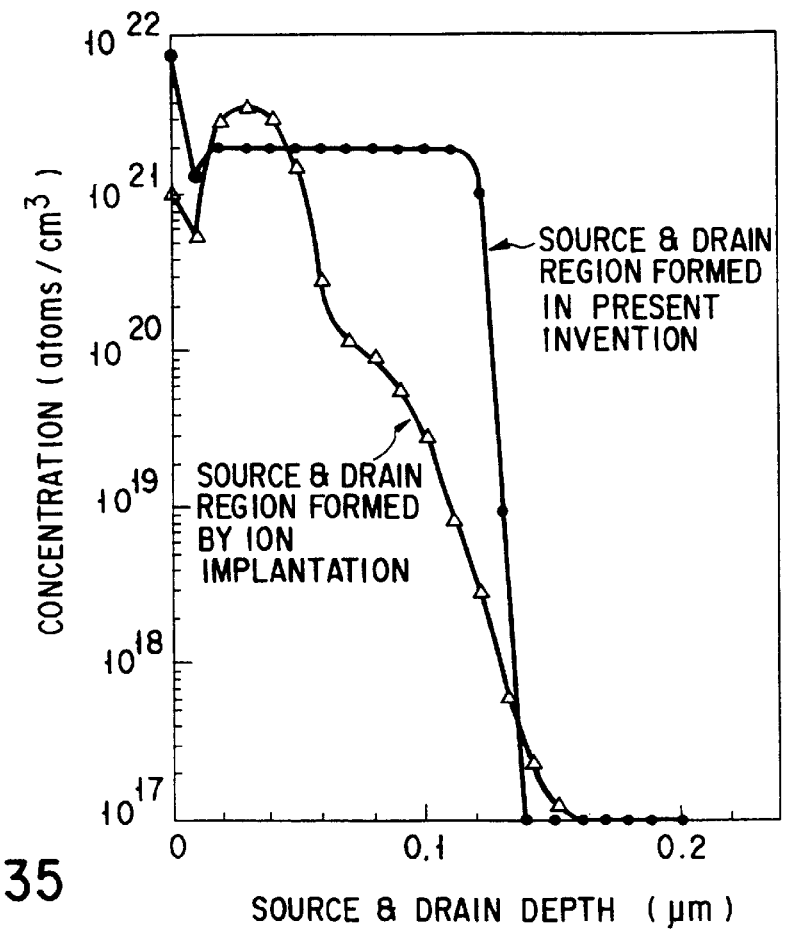
FIG. 35 is a graph showing the impurity concentration distributions in the direction of depth of source/drain regions formed according to the present invention and the prior art.

FIG. 35 is a graph showing distributions of the impurity (boron) concentrations in the direction of depth of the source/drain regions formed by the deposition method of the present invention and the conventional ion implantation method.

As is apparent from FIG. 35, for the concentration distribution of the present invention, a profile representing a steep change in concentration near the junction position (0.14 $\mu$m in this case) can be obtained as compared with the prior art.

Therefore, even with the same junction depth as in the prior art, the source/drain region formed according to the present invention has a lower resistance. For this reason, the parasitic resistance which affects the driving capability of the MOS transistor can be reduced.

Figure 36:
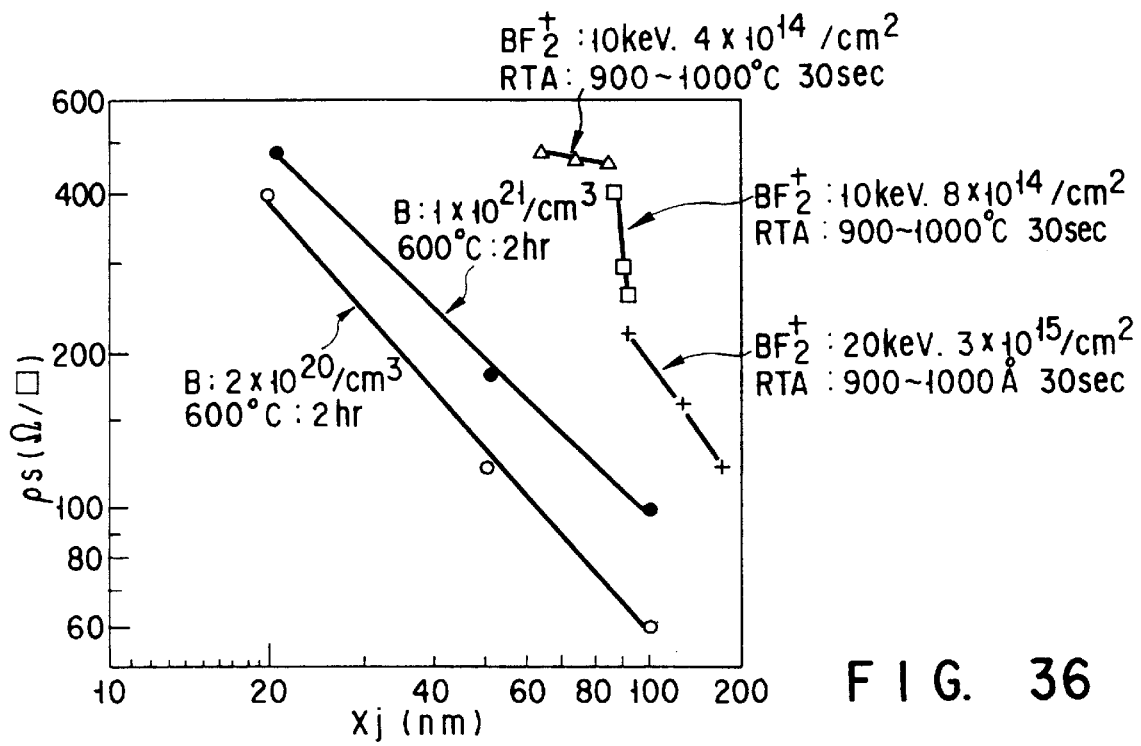
FIG. 36 is a graph showing the relationship between the depth of the source/drain regions formed according to the present invention and the prior art and a sheet resistance.

FIG. 36 is a graph showing the dependency of a sheet resistance ρs on a source/drain depth xj. According to the present invention (represented by ● and ○), the sheet resistance ρs is inversely proportional to the source/drain depth xj. When the boron concentration is $1\times10^{21}/cm^3$, the sheet resistance is about 500 Ω/□ even when the source/drain depth xj is 200 nm. The source/drain region formed by ion implantation of the prior art (represented by Δ, □, and +) can hardly realize the source/drain depth xj of 100 nm or less. The sheet resistance ρs exhibits a higher value than that of the present invention even with the same source/drain depth xj as in the present invention.

Figure 37:
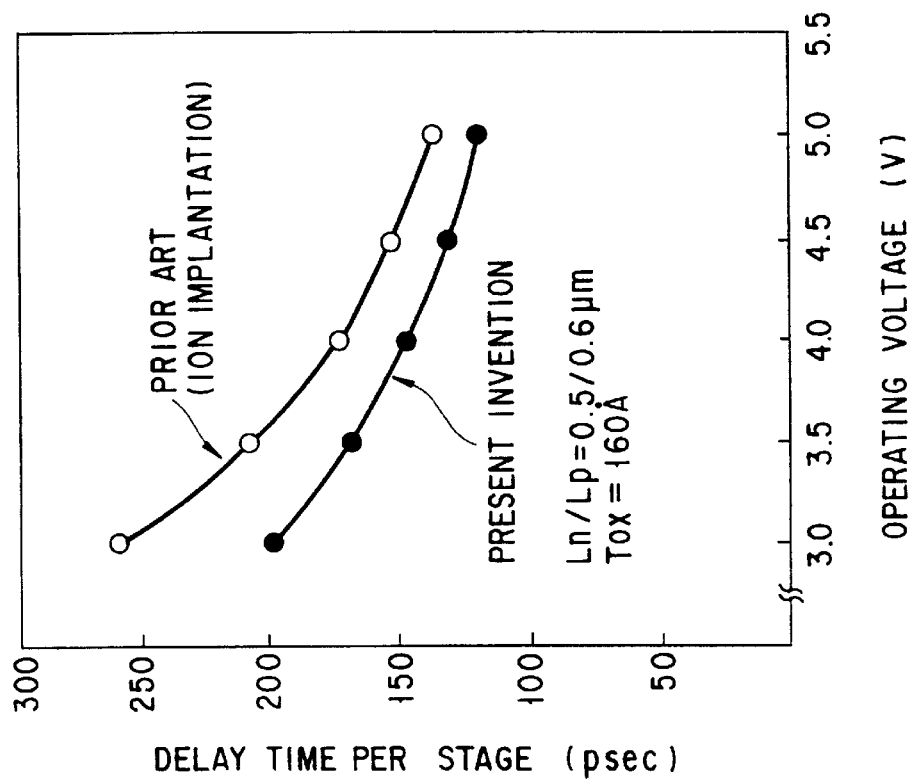
FIG. 37 is a graph showing the dependency of the delay time of ring oscillators manufactured according to the present invention and the prior art on a power supply voltage.

To prove the effect of the present invention, a CMOS inverter having source/drain regions according to the present invention was used to constitute a ring oscillator, and a delay time per stage was measured. FIG. 37 is a graph showing the dependency of the delay time on the power supply voltage. For comparison, FIG. 37 also shows the result of similar measurement for a CMOS transistor having source/drain regions formed by the conventional ion implantation. When the delay time according to the present invention is compared with that according to the prior art, it is 10 to 20% smaller than that of the prior art at the same power supply voltage.

The present invention uses a method in which the SOI semiconductor film is etched until the surface of the SOI insulating film is exposed. For this reason, the effective junction depth corresponds to the thickness of the source/drain layer. On the other hand, according to the prior art, ion implantation of an impurity is performed under a condition for forming the junction boundary at a deeper portion beyond the thickness of the SOI semiconductor film.

As shown in FIG. 35, the source/drain layer formed according to the present invention has a concentration profile representing a steep change near the junction boundary as compared to the prior art. For this reason, the parasitic resistance (sheet resistance ρs) for degrading the driving capability of the transistor can be decreased even at the same junction depth. With this structure, when a CMOS inverter is formed by the present invention, the delay time can be shortened.

(11th Embodiment)

This embodiment is a modification of the ninth embodiment and can use the FIGS. 33A to 33E since only the material of the selectively deposited layer 312c is different.

Steps in FIGS. 33A and 33B are performed as in the seventh embodiment.

SiGe films 312c containing boron as a p-type impurity at a desired concentration are selectively formed on only the surface of an n-type silicon layer. This process is continuously performed from the etching process without exposing the substrate to air (FIG. 33C).

When this selective deposition is performed by using a gas mixture of, e.g., $Si_2H_6$, $GeH_4$, and $AsH_4$ and setting the substrate temperature to 550° C. or more, the SiGe film is obtained as a selectively grown epitaxial layer having a facet on a surface contacting an insulating film 302, as shown in FIG. 33C. When the substrate temperature during deposition is set to 300° C., the deposited film is in an amorphous state and has the same shape as that in the 10th embodiment (FIG. 34C).

Steps in FIGS. 33D and 33E are performed as in the ninth embodiment, and a MOS transistor having the SiGe layers as source/drain regions is completed.

Figure 38B:
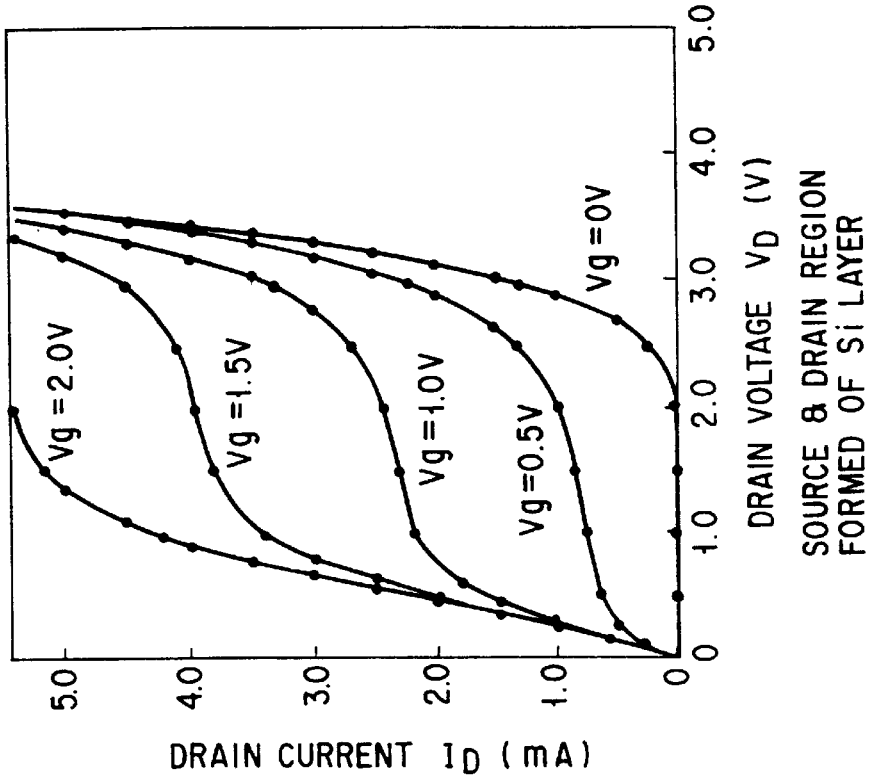
FIGS. 38A and 38B are graphs respectively showing the ID-VD characteristics of a MOS transistor having a source/drain layer consisting of SiGe according to the 11th embodiment of the present invention and those of a MOS transistor having the conventional source/drain layer consisting of Si.
Figure 38A:
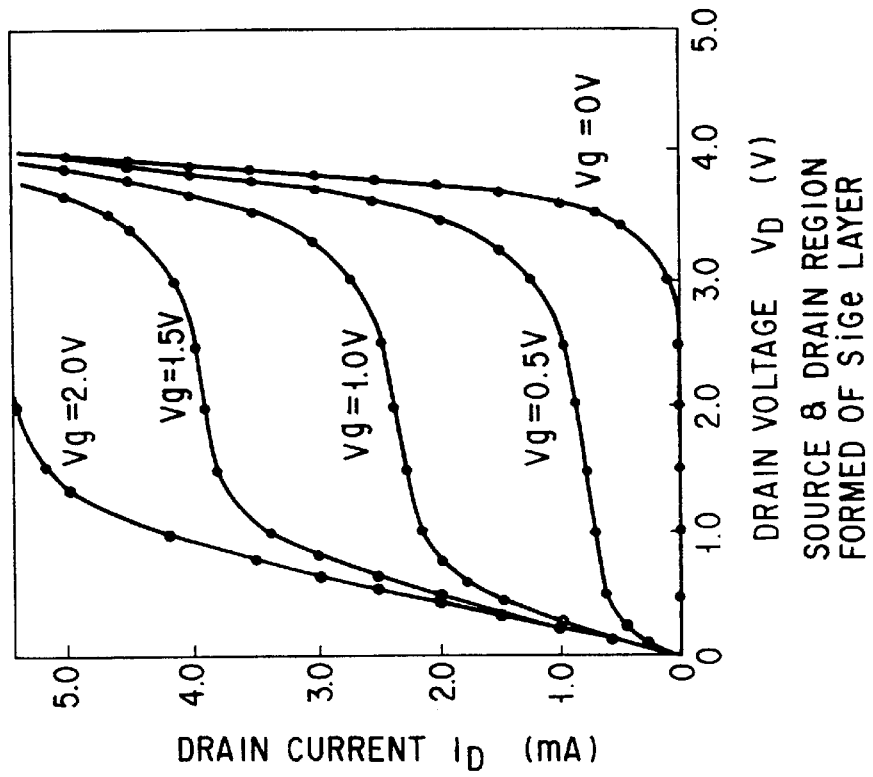

FIGS. 38A and 38B are graphs showing the $I_D$-$V_D$ characteristics of the MOS transistor of this embodiment, which has source/drain layers consisting of SiGe films containing an impurity, and a MOS transistor, which has source/drain layers consisting of silicon films containing an impurity, respectively.

As is apparent from FIG. 38B, when the source/drain layer is formed of a silicon layer, the breakdown voltage is low. Even when a drain voltage $V_D$ is 3 V, a drain current flows even with a gate voltage of 0 V.

To the contrary, when the source/drain layer is formed of an SiGe film, the breakdown voltage is increased, as shown in FIG. 38A. When the drain voltage $V_D$ is 3 V, no drain current flows with a gate voltage of 0 V.

The reason for this can be considered as follows. That is, holes generated upon impact ionization move to the source side without being accumulated at the lower portion of the channel. The above effect can be obtained even when only the source side is formed of an SiGe film.

In the sixth to 11th embodiments, $CF_4$ is used as an etching gas. However, even another etching gas other than $CF_4$, e.g., $ClF_3$ can be used to obtain the same effect as described above.

In the sixth to 11th embodiments, a gas mixture of $Si_2H_6$ and $B_2H_6$ is used as a gas for forming the silicon film containing boron, and a gas mixture of $GeH_4$ and $B_2H_6$ is used as a gas for forming the SiGe film containing boron. However, the usable gases are not limited to these.

More specifically, $SiH_4$, $SiH_2Cl_2$, $SiCl_4$, $SiF_4$, $Si_2H_4Cl_2$, $SiH_2F_2$, $Si_2H_2Cl_4$, $Si_2Cl_5$, $Si_3H_4F_2$, $Si_2H_2F_4$, $Si_2F_6$, or polysilane having four or more hydrogen atoms may also be used as a source gas containing silicon.

Even when poly-germane having four or more hydrogen atoms is used in place of $GeH_4$ as a gas containing germanium, the same effect as described above can be obtained.

When a p-type source/drain layer is to be formed, $BF_3$ or $BCl_3$ may also be used in place of $B_2H_6$.

When an n-type source/drain layer is to be formed, the same effect can be obtained by using $PH_3$ or $AsH$, or a halide containing phosphorus or arsenic.

(12th Embodiment)

Figure 39A:
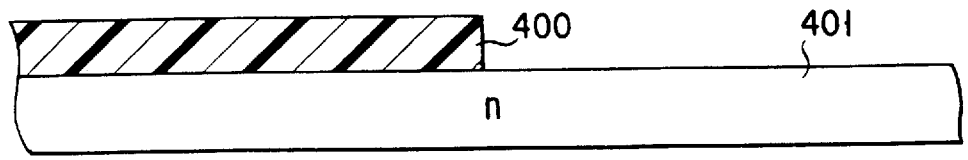
FIGS. 39A to 39R (FIGS. 39I and 39O exclusive) are sectional views of a CMOS transistor, which sequentially show a method of manufacturing this transistor according to the 12th embodiment of the present invention.
Figure 39B:
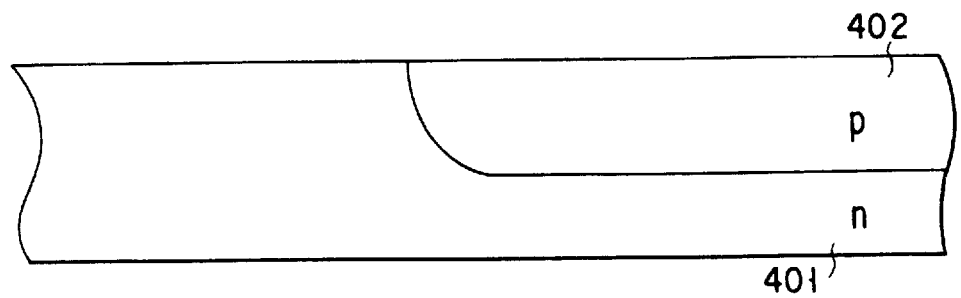
Figure 39C:
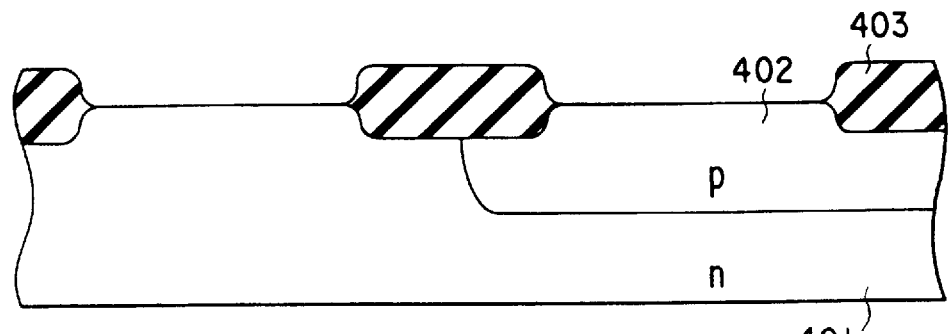
Figure 39D:
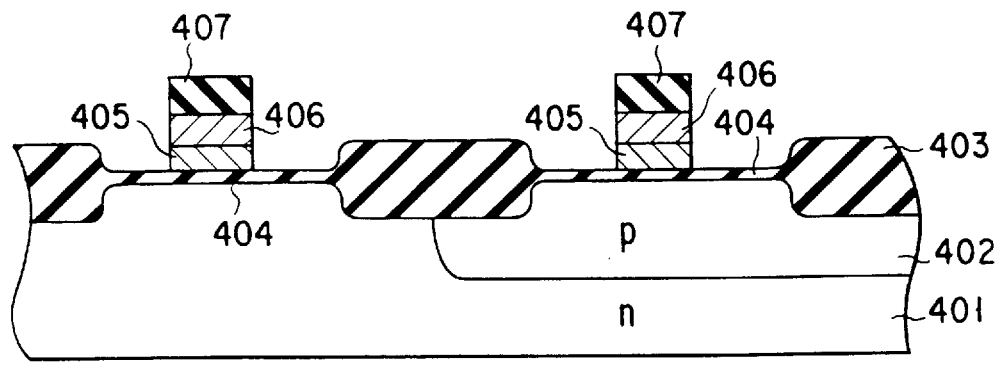
Figure 39E:
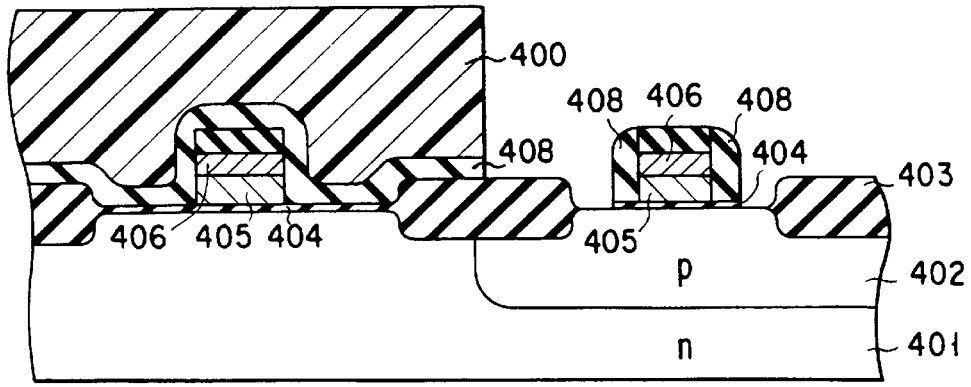
Figure 39F:
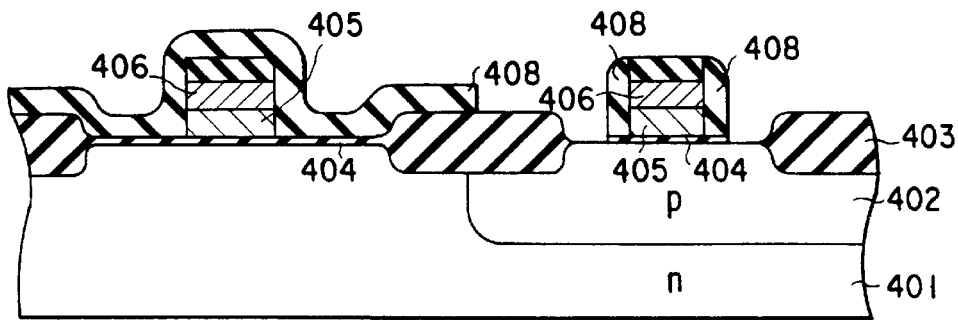
Figure 39G:
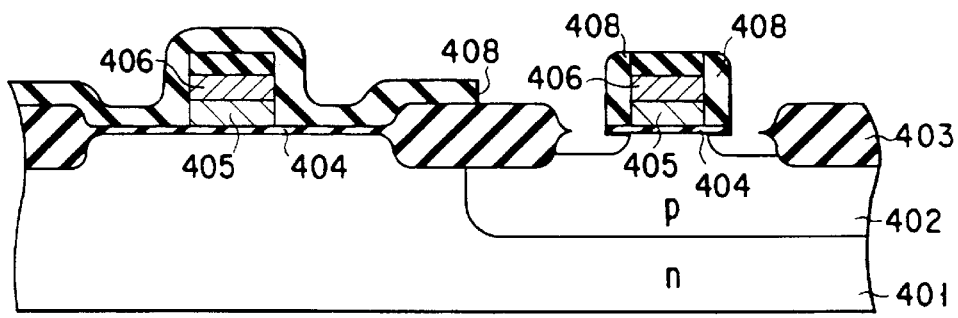
Figure 39H:
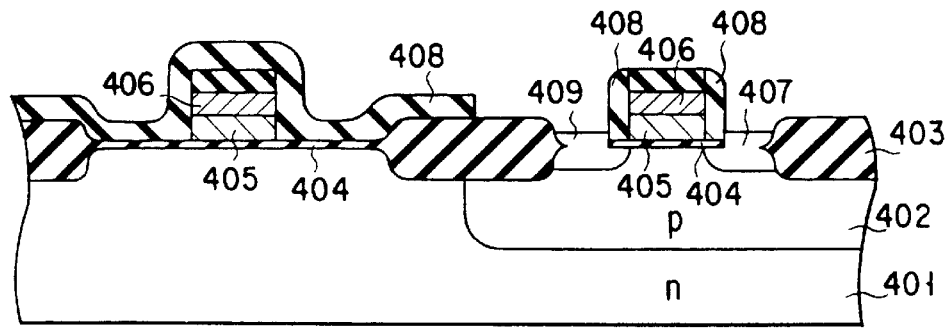
Figure 39J:
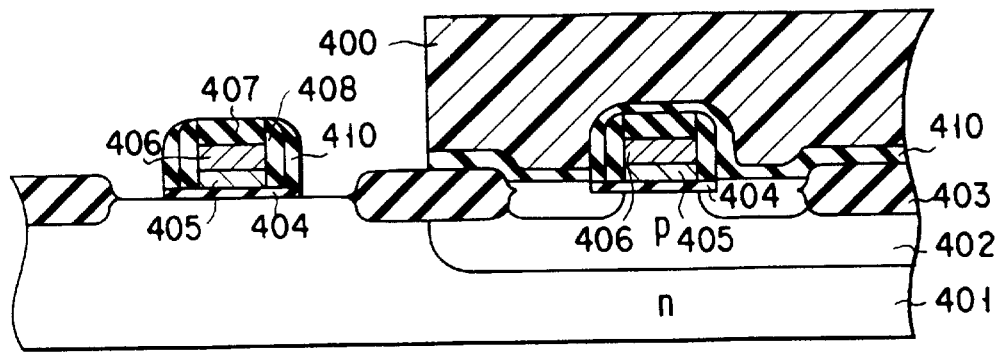
Figure 39K:
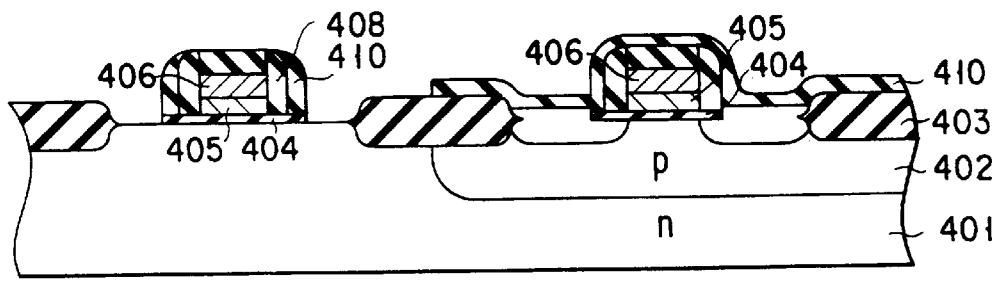
Figure 39L:
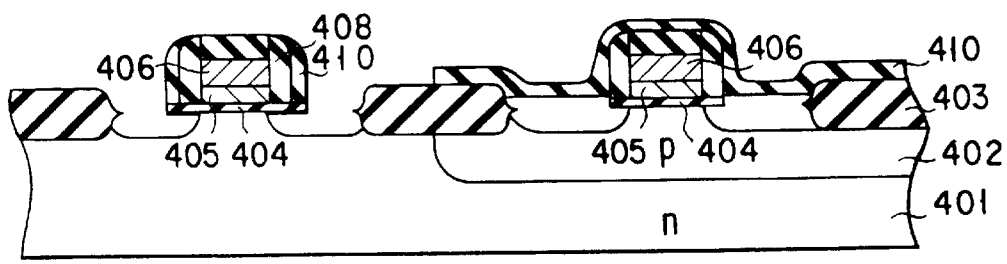
Figure 39M:
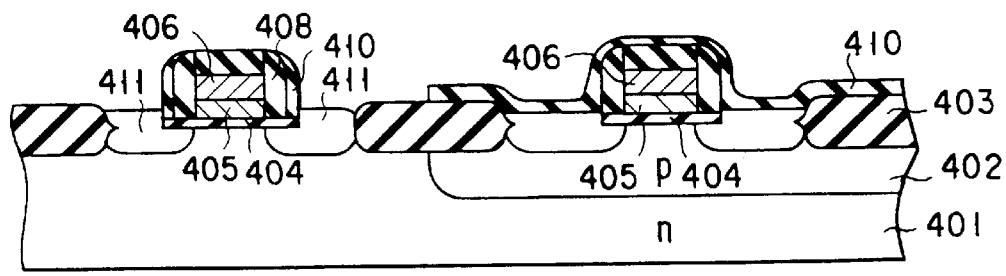
Figure 39N:
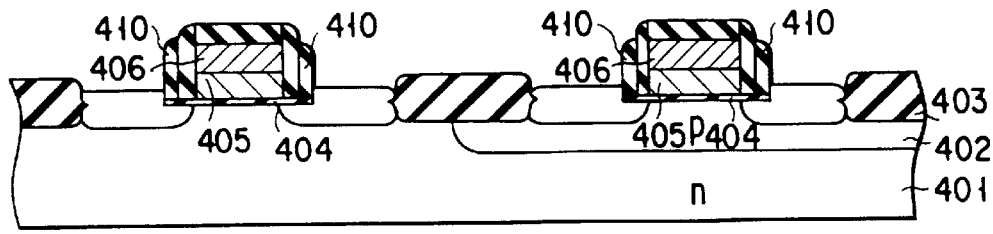
Figure 39P:
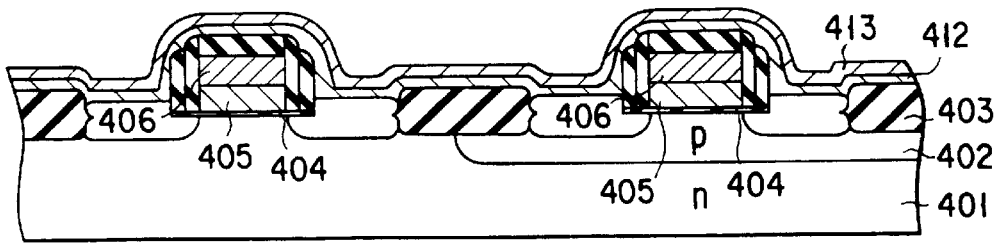
Figure 39Q:
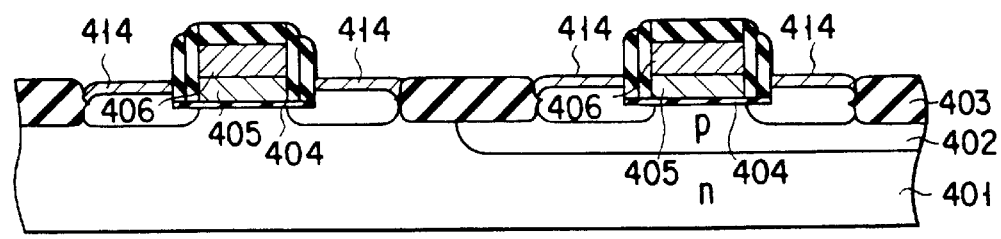
Figure 39R:
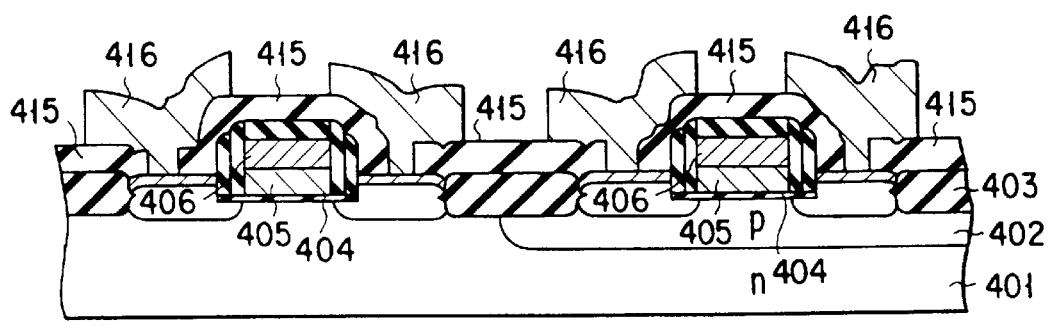

FIGS. 39A to 39R are sectional views of a CMOS transistor, which sequentially show a method of manufacturing this transistor according to the 12th embodiment of the present invention.

As shown in FIG. 39A, an n-type silicon substrate 401 having a plane orientation (100) and a resistivity of 4 to 6 Ωcm is prepared. The n-MOS transistor region is masked by a resist 400 to perform ion implantation of boron in only a region where a p-type well layer is formed, under conditions, i.e., an acceleration voltage of 220 kV and a dose of $5\times10^{13}$ cm$^{-2}$. Thereafter, annealing is performed in a nitrogen atmosphere at 1,150° C. for six hours, thereby forming a p-type well layer 402, as shown in FIG. 39B.

As shown in FIG. 39C, element isolation insulating films 403 having a thickness of about 0.6 μm are formed by normal selective oxidation.

As shown in FIG. 39D, gate oxide films 404 having a thickness of 10 nm are formed by thermal oxidation. An impurity-doped polysilicon film 405 serving as a gate electrode having a thickness of 70 nm and a tungsten silicide film 406 having a thickness of 200 nm are sequentially formed. A silicon oxide film 407 having a thickness of 100 nm is formed on the surface by LPCVD.

As shown in FIG. 39E, the resultant multilayer is etched by reactive ion etching to form a gate portion. Thereafter, a silicon nitride film 408 having a thickness of 40 nm is deposited on the entire surface by CVD.

A region where a p-channel MOS transistor is to be formed is covered with the resist 400 by photolithography, and thereafter, the entire surface of the silicon nitride film 408 is etched by anisotropic dry etching, thereby leaving the silicon nitride film 408 on the side wall of the gate portion of an n-channel MOS transistor. The silicon nitride film 408 serves as a side-wall gate oxide film of the n-channel MOS transistor. Thereafter, the resist 400 is removed, as shown in FIG. 39F.

As shown in FIG. 39G, the surface of the p-type well layer 402 is isotropically etched such that the total etching depth becomes 40 nm.

This etching is performed by causing a gas mixture of, e.g., $CF_4$ and oxygen to generate microwave discharge to supply fluorine radicals onto the substrate.

As shown in FIG. 39H, a thin silicon film 409 having a thickness of 100 nm and containing 2% of arsenic is selectively deposited on the source/drain region where the surface of the p-type well layer 402 is exposed.

This selective deposition is performed by using a gas mixture of, e.g., $SiH_2C_2$ and $AsH_3$ and setting the substrate temperature to 750° C. The thin silicon film 409 serves as a shallow, heavily doped n-type source/drain layer in the n-channel MOS transistor. The arsenic concentration in the deposited layer must be at least $10^{19}$ cm$^{-3}$ to form a low-resistance source/drain region.

As shown in FIG. 39J, a silicon nitride film 410 having a thickness of 40 nm is deposited on the entire surface by CVD. Thereafter, the resist 400 covering the n-channel MOS transistor region is formed by photolithography.

The entire surfaces of the silicon nitride films 410 and 408 are etched by anisotropic dry etching, thereby leaving the silicon nitride films 410 and 408 on the side wall of the gate portion of the p-channel MOS transistor. The silicon nitride films 410 and 408 serve as a side-wall gate oxide film of the p-channel MOS transistor. Thereafter, the resist 400 is removed, as shown in FIG. 39K.

As shown in FIG. 39L, the surface of the n-type silicon substrate 401 on the p-channel MOS transistor region is isotropically etched such that the total etching depth becomes 80 nm.

This etching is performed by causing a gas mixture of, e.g., $CF_4$ and oxygen to generate microwave discharge to supply fluorine radicals onto the substrate.

As shown in FIG. 39M, thin silicon films 411 having a thickness of 100 nm and containing 2% of boron are selectively deposited on the source/drain regions where the surface of the n-type silicon substrate is exposed.

This selective deposition is performed by using a gas mixture of, e.g., $SiH_2Cl_2$ and $BCl_3$ and setting the substrate temperature to 800° C. The thin silicon film 411 serves as a shallow, heavily doped p-type source/drain layer in the p-channel transistor. The boron concentration in the deposited layer must be at least $10^{19}$ cm$^{-3}$ to form a low-resistance n-type source/drain layer.

As shown in FIG. 39N, the silicon nitride film 410 on the n-type source/drain layer in the n-channel MOS transistor region is removed by anisotropic etching. More specifically, the silicon nitride film 410 is left on the side wall of the gate portion.

As shown in FIG. 39P, a thin titanium film 412 having a thickness of 30 nm and a thin titanium nitride film 413 having a thickness of 50 nm are sequentially deposited on the entire surface by sputtering. Thereafter, annealing is performed in a nitrogen atmosphere at 700° C. for one minute, thereby causing the entire thin titanium film 412 to react with the silicon substrate. With this process, titanium silicide films 414 are formed on only the n-type source/drain layers, a shown in FIG. 39Q.

The thin titanium nitride film 413 and the unreacted thin titanium film 412 on the insulating film are selectively removed by, e.g., an aqueous solution of hydrofluoric acid and a solution mixture of sulfuric acid and hydrogen peroxide.

As shown in FIG. 39R, a silicon oxide film 415 having a thickness of 300 nm is deposited on the entire surface by CVD. Thereafter, contact holes are formed in the silicon oxide film 415 by anisotropic dry etching. An aluminum film having a thickness of 300 nm and containing 0.5% of silicon and 0.5% of copper is deposited and patterned, thereby forming source/drain electrodes 416. Thereafter, annealing is performed in a nitrogen atmosphere containing 10% of hydrogen at 450° C. for 15 minutes, thereby completing a transistor.

Figure 40:
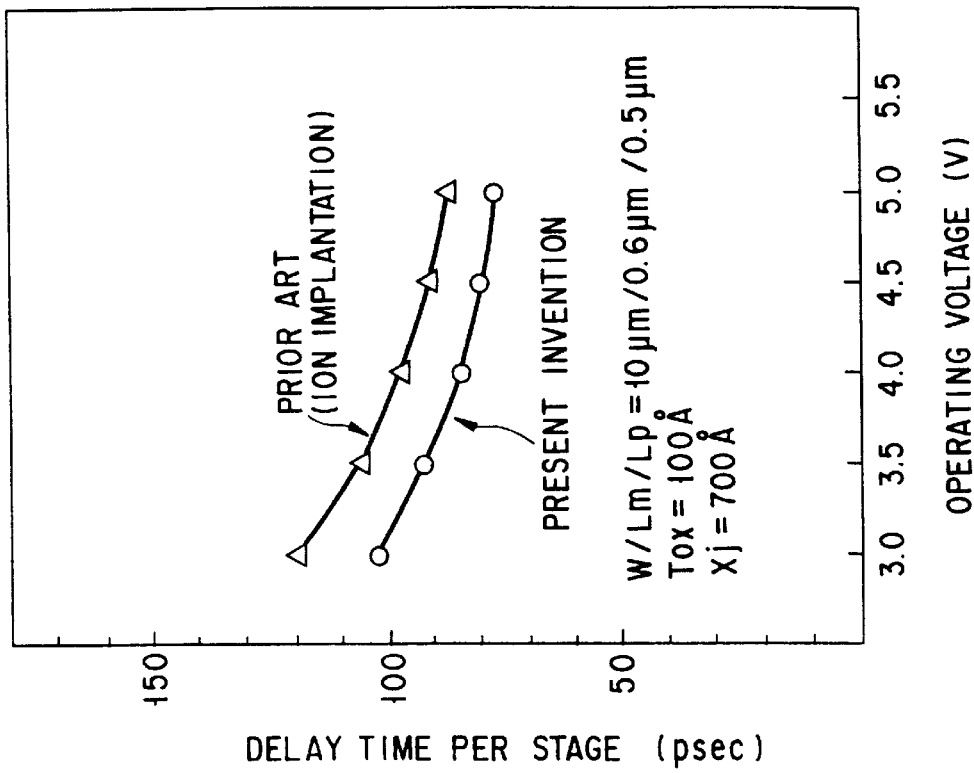
FIG. 40 is a graph showing the dependency of the delay time of ring oscillators manufactured according to the present invention and the prior art on the power supply voltage.

A CMOS inverter formed by this method was used to arrange a ring oscillator, and a delay time per stage was measured. FIG. 40 is a graph showing the dependency of the delay time on the operation voltage. For comparison, FIG. 40 also shows the result obtained when the source/drain diffused layer is formed by ion implantation. The junction depth is equal to 70 nm (700 Å) in both the cases. More specifically, for the method using the present invention, the etching depth of silicon, which determined the junction depth, was set to 70 nm. For the prior art, the junction depth of the LDD region was set to 70 nm. As is apparent from FIG. 40, the delay time in the present invention is shorter independently of the operation voltage.

Figure 41A:
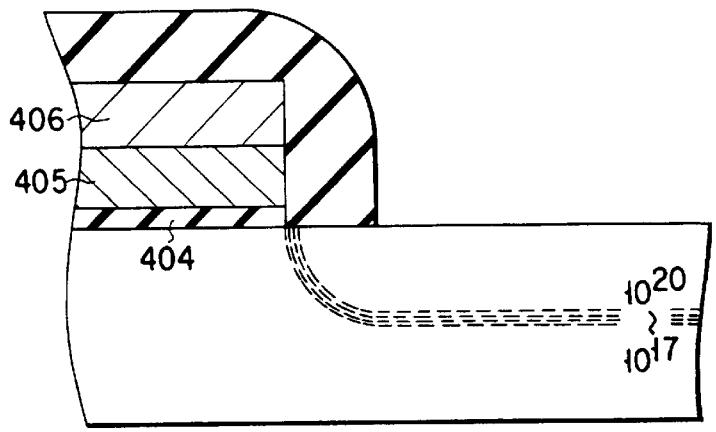
FIGS. 41A and 41B are views showing the two-dimensional impurity distributions in the source/drain regions formed according to the present invention and the prior art.
Figure 41B:
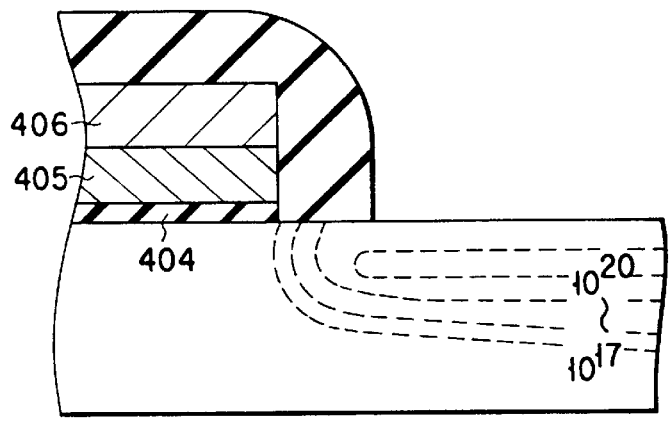

FIGS. 41A and 41B are views showing the two-dimensional impurity distributions for source/drain regions formed by selective deposition according to the present invention and the conventional ion implantation, respectively. The impurity is indicated by dotted lines, and the unit of the impurity concentration is cm$^{-3}$.

According to the method of the present invention (FIG. 41A), a concentration profile representing a steeper change than that in the prior art (FIG. 41B) can be obtained near the p-n junction position. The sheet resistance of the source/drain region, which serves as a parasitic resistance for the operation of the MOS transistor, can be decreased according to the present invention, as compared to the prior art even at the same junction depth. Therefore, when a CMOS inverter is formed using the present invention, the delay time can be shortened, as shown in FIG. 40.

In this embodiment, after the n-type source/drain layer is formed, the p-type source/drain layer is formed. However, the order is not limited to this and can also be reversed.

The MOS transistor of one channel type may be formed by burying an impurity-doped silicon film, and the MOS transistor of the other channel type may be formed by ion implantation of the prior art, as needed.

Additionally, it is confirmed that the method of this embodiment can be effectively used to form a shallow, low-resistance source/drain layer required for micropatterning of a CMOS integrated circuit and increase the operation speed.

As for the number of manufacturing steps in masking process, only two steps must be performed according to the method of the present invention. However, in the prior art, for each of the n- and p-channel MOS transistors, ion implantation for forming the LDD region before formation of the side-wall gate oxide film and ion implantation after formation of the side-wall gate oxide film are required, resulting in a total of four steps. For this reason, the structure of the present invention (buried source/drain layer) is advantageous to reduce the number of manufacturing steps. More specifically, according to this structure, a shallow, heavily doped source/drain layer can be easily formed.

As has been described above in detail, according to the first aspect of the present invention, the silicon film can be selectively formed on the exposed surface of the silicon region. Therefore, a semiconductor device using a satisfactory direct contact or buried diffused layer can be realized.

(13th Embodiment)

FIGS. 42A to 42F are sectional views of a MOS transistor, which sequentially show a method of manufacturing this transistor according to the 13th embodiment of the present invention.

Figure 42A:
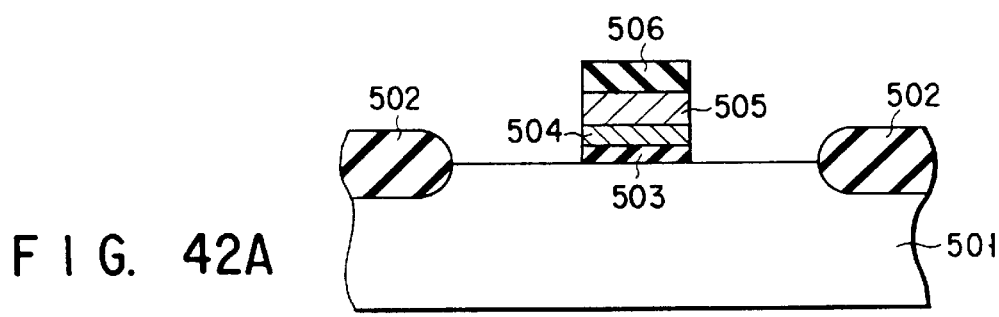
FIGS. 42A to 42G are sectional views of a CMOS transistor, which sequentially show a method of manufacturing this transistor according to the 13th is embodiment of the present invention.

As shown in FIG. 42A, a semiconductor substrate, e.g., an n-type silicon substrate 501 having a plane orientation (100) and a resistivity of 4 to 6 Ωcm is used to form an element isolation insulating film 502 having a thickness of about 0.6 $\mu$m by normal selective oxidation. A gate oxide film 503 having a thickness of 10 nm is formed thermal oxidation. An impurity-doped polysilicon film 504 having a thickness of 100 nm and a tungsten silicide film 505 having a thickness of 300 nm are sequentially formed, and a silicon oxide film 506 having a thickness of 150 nm is formed on the surface of the resultant structure by CVD. Thereafter, the resultant multilayer is etched by reactive ion etching to form a gate portion.

Figure 42B:
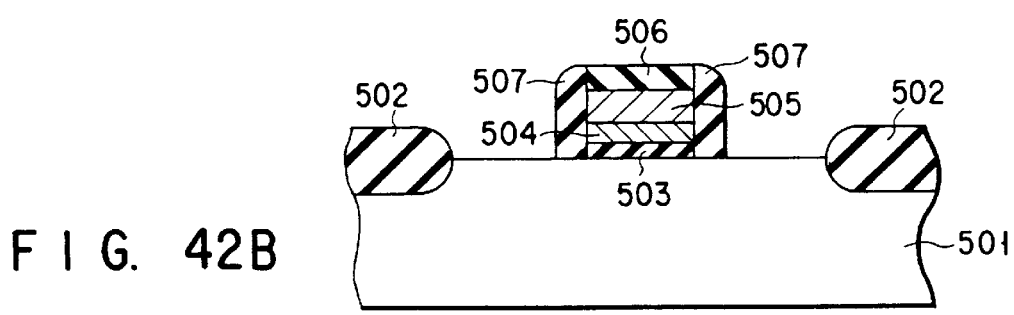

As shown in FIG. 42B, a silicon oxide film 507 having a thickness of about 100 nm is formed on the side wall of the gate portion. This silicon oxide film 507 is obtained by depositing a silicon oxide film having a thickness of 150 nm on the entire surface by CVD and etching the entire surface by anisotropic dry etching.

A process of isotropically etching the silicon and a process of anisotropically etching the silicon are combined, thereby forming grooves in source/drain regions while controlling the etching shape.

Figure 42C:
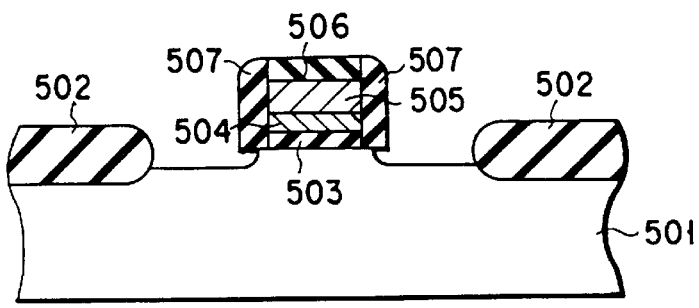

Anisotropic etching is performed using $ClF_3$ gas to an etching depth of 30 nm. FIG. 42C shows the etching shape at this time. In FIG. 42C, a plane (plane orientation (100)) where etching progresses in the vertical direction with respect to the substrate and a plane (plane orientation (111)) for entering a portion under the side wall of the gate portion are formed.

Figure 42D:
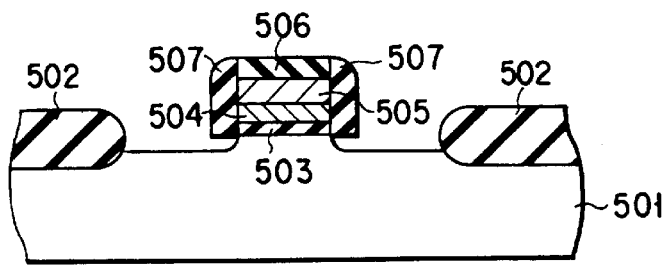

Isotropic etching is performed such that the total etching depth becomes as small as 50 nm. This etching is performed by causing a gas mixture of $CF_4$ and oxygen to generate microwave discharge and supplying the gas onto the sample. FIG. 42D shows the etching shape at this time.

Figure 42E:
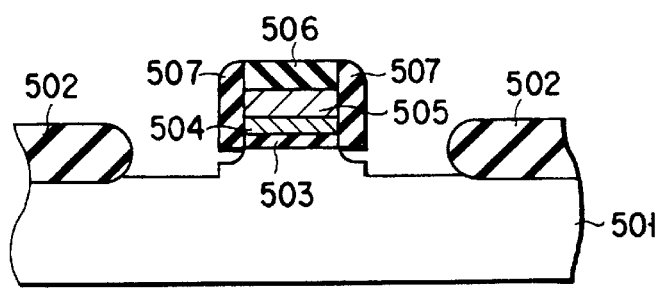

As shown in FIG. 42E, the substrate is etched to a depth of 50 nm by RIE. This RIE is performed using a gas mixture of HBr and oxygen.

Figure 42F:
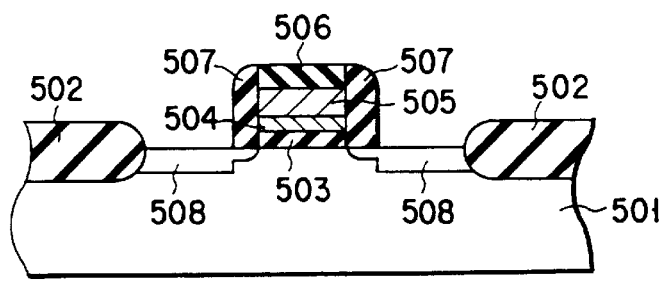

As shown in FIG. 42F, thin silicon films 508 containing boron are selectively deposited on the source/drain regions (grooves) formed in the above process. The boron concentration is preferably at least $10^{19}$ $cm^{-3}$ to form low-resistance diffused layers.

Figure 42G:
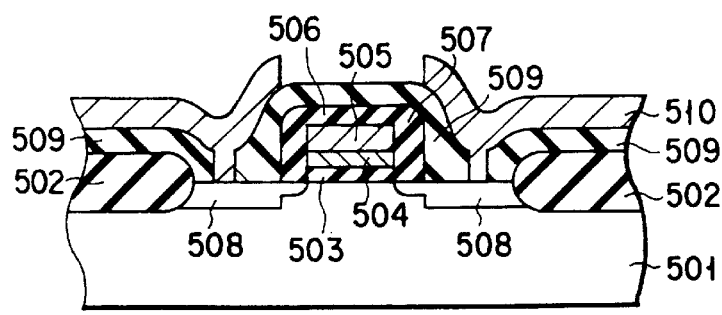

A silicon oxide film 509 having a thickness of 300 nm is deposited on the entire surface by CVD. Thereafter, as shown in FIG. 42G, contact holes are formed in the silicon oxide film 509 by anisotropic dry etching. An aluminum film 510 having a thickness of 800 nm and containing 0.5% of silicon and 0.5% of copper is deposited. This aluminum film is patterned as electrodes, and annealing is performed in a nitrogen atmosphere containing 10% of hydrogen at 450° C. for 15 minutes, thereby completing a transistor.

For this MOS transistor forming process, the characteristics of MOS transistors obtained when both anisotropic etching using $ClF_3$ and isotropic etching using a gas mixture of $CF_4$ and oxygen are performed, when only anisotropic etching using $ClF_3$ is performed, and when only etching using a gas mixture of $CF_4$ and oxygen is performed were compared with each other. More specifically, the gate length was used as a parameter to check a change in threshold of the MOS transistor.

As shown in FIG. 43, when only isotropic etching was performed represented by $\Delta$), the threshold voltage was decreased as the gate length became smaller. To the contrary, when only anisotropic etching was performed (represented by $\square$), or when both anisotropic etching and isotropic etching were performed (represented by $\bigcirc$), the threshold voltage was not decreased. Therefore, it is found that anisotropic etching has an effect against the short channel effect. The reason for this can be considered as follows. That is, when only etching using a gas mixture of $CF_4$ and oxygen is performed, the distance to each heavily doped region becomes smaller in the deep region under the gate as a result of isotropic etching.

FIG. 44 is a graph showing the static characteristics of drain voltage vs. drain current of the transistor. The characteristics obtained when only anisotropic etching using $ClF_3$ are represented by a curve a, characteristics obtained when only isotropic etching is performed are represented by a curve b, and characteristics obtained when RIE is performed after anisotropic etching and isotropic etching are continuously performed are represented by a curve c. In a low drain voltage region, not so large difference in drain current is observed among the curves a to c. This means that, even when only anisotropic etching is performed (curve b), and a heavily doped region is deeply formed in a region close to the channel, the parasitic resistance cannot be decreased although the heavily doped region in the diffused layer can be increased.

When anisotropic etching and isotropic etching are performed, a curve similar to the curve b is observed. However, when only anisotropic etching using $ClF_3$ is performed (curve a), it is found that, as the drain voltage increases, the drain current also increases. The reason for this can be considered as follows. That is, since a portion having a very small radius of curvature is formed by anisotropic etching, and the field intensity of this region is largely increased, the current value is increased due to breakdown.

When RIE is continuously performed from anisotropic etching and isotropic etching (curve c), the drain current rises steeply. This means that a heavily doped region can be formed in the direction of depth of the diffused layer by RIE, and the parasitic resistance is decreased.

From this result, it is confirmed that a process of the present invention, in which silicon containing an impurity at a high concentration is deposited and diffused after anisotropic etching and isotropic etching, can be effectively used to prevent the short channel effect and form a transistor having a high drain breakdown voltage, and at the same time, it can be effectively used to form a shallow diffused layer required for micropatterning of a MOS integrated circuit.

When a silicon substrate having different plane orientations is used, the etching shape can be precisely controlled. Therefore, an optimum shape of a diffused layer can be formed for each transistor.

In this embodiment, silicon containing boron is used to form a p-type MOS transistor. To form an n-type MOS transistor, a silicon film containing phosphorus or arsenic in place of boron must be formed.

In this embodiment, anisotropic etching in which etching progresses in different plane orientations is performed using $ClF_3$ gas. However, a gas containing Cl or a plasma gas can also be used. Wet etching as of KOH or the like may also be performed.

Isotropic etching is performed using a gas mixture of $CF_4$ and oxygen. However, only $CF_4$ may be used. Alternatively, a gas containing a halogen other than Cl, e.g., fluorine, such as F or $NF_3$ gas may also be used. Wet etching based on fluoronitric acid may also be performed.

In this embodiment, after anisotropic etching in different plane orientations is performed, isotropic etching is performed. However, the order of etching processes may be reversed in accordance with the shape of a desired diffused layer.

As has been described above, according to the second aspect of the present invention, a shallow, heavily doped source/drain layer can be realized by a combination of isotropic etching and anisotropic etching. Therefore, even when elements become finer, the short channel effect of the MOS transistor can be effectively prevented.

(14th Embodiment)

FIGS. 45A to 45D are sectional views of a transistor, which sequentially show a method of manufacturing a semiconductor device according to the 14th embodiment of the present invention.

As in the prior art, in an element region isolated by forming an element isolation insulating film 602 (insulating region) on the surface (conductive region) of an n-type silicon substrate 601 having a resistivity of 4 to 5 Ωcm, a polysilicon film 604 is formed through a silicon oxide film serving as a gate oxide film 603. The polysilicon film 604 is doped with an impurity by thermal diffusion or the like. A silicon oxide film 608 is deposited on the entire surface, and the silicon oxide film 608 and the polysilicon film 604 are patterned by RIE while leaving only the channel region, thereby forming the gate electrode 604.

The silicon oxide film 608 is further deposited on the upper layer and etched back by RIE to leave a silicon oxide film 608S on only the side wall of the gate electrode. The gate oxide film 603 on the diffused layer regions serving as source/drain regions is removed. The sample is dipped in an HF solution and washed in pure water with a dissolved oxygen amount of 10 ppm or less, thereby exposing a chemically active silicon surface (FIG. 45A).

If pure water with a large dissolved oxygen amount is used for washing, a native oxide film is undesirably formed on the silicon surface during washing and subsequent drying process. For this reason, the deposited film cannot be uniformly grown, resulting in difficulty in diffusion of a dopant using the deposited layer as a diffusion source. Therefore, it is preferable to use pure water with a small dissolved oxygen amount of 10 ppm or less.

Thereafter, the substrate is set in a vacuum CVD apparatus of a normal diffusion furnace type, hydrogen is supplied at a flow rate of 100 to 3,000 cc/min, and the substrate is heated to a predetermined temperature of 180° to 400° C. After the flow rate of the hydrogen gas is set to an appropriate deposition condition, e.g., 1,000 cc/min and stabilized, silane gas ($SiH_4$) is supplied at a flow rate of 1 to 100 cc/min. At this time, no phenomenon, such that silane was decomposed in the above temperature range and silicon was deposited on the substrate, was observed. This is because the substrate temperature is sufficiently lower than that causing normal selective growth of silicon, and decomposition of the silane gas is prevented by supplying the hydrogen gas.

In this manner, boron trichloride gas is additionally supplied at a flow rate of 0.1 to 100 cc/min while keeping supplying the hydrogen gas and the silane gas. Boron trichloride is adsorbed by the silicon surface as a conductive portion and reduced upon reception of electrons. Chlorine generated upon reduction reacts with silane or other chlorine and is eliminated from the silicon surface. As a result, as shown in FIG. 45B, a boron deposited film is selectively formed on only the silicon surface where the source/drain regions are exposed. The deposition rate at this time was 1 to 50 nm/min.

FIG. 46 is a graph showing an example wherein the boron deposited film is selectively grown under conditions, i.e., a substrate temperature of 370° C., a boron trichloride gas flow rate of 50 sccm, a silane gas flow rate of 50 sccm, and a hydrogen gas flow rate of 1,000 sccm. As shown in FIG. 46, no layer was grown on the silicon oxide film about 20 minutes after the start of supplying the boron trichloride gas and the silane gas, and a boron deposited film having a thickness of about 300 nm was grown on the silicon surface.

When the silane gas flow rate was 1 to 100 cc/min, the boron trichloride gas flow rate was 0.1 to 50 cc/min, and the substrate temperature was 400° C. to 800° C., decomposition of silane gas was induced, and a B-doped silicon film was selectively formed on only the silicon surface. At this time, the boron concentration of the deposited B-doped silicon surface can be set to a desired concentration of $1 \times 10^{19}$ $cm^{-3}$ to $1 \times 10^{22}$ $cm^{-3}$ in accordance with the flow rate ratio of silane gas to boron trichloride gas.

When annealing is performed in a nitrogen atmosphere at 1,000° C. for twenty seconds, boron atoms are received by the silicon substrate from the boron deposited film or B-doped silicon film formed in the above manner. With this process, diffused layers 605 are formed, as shown in FIG. 45C. When a B-doped silicon film containing boron at a concentration of $3 \times 10^{20}$ $cm^{-3}$ and having a thickness of 50 nm was grown, the junction depth and the sheet resistance of the diffused layer were 75 nm and 120 Ω/□, respectively. In this manner, a shallow diffused layer could be formed at high controllability and selectivity.

As shown in FIG. 45D, titanium is sputtered on the diffused layer, and annealing is performed at 700° C. for 30 seconds, thereby forming silicide layers 609. A silicon oxide film 610 is deposited by CVD, contact holes are patterned by RIE, and aluminum films 611 serving as electrodes are deposited therein. At this time, boron is diffused into the silicide layer. However, since the boron concentration in the boron deposited film or B-doped silicon film formed in FIG. 45C is sufficiently high, the boron concentration in the diffused layer serving as a source/drain layer is not so largely influenced even when boron is diffused into the silicide layer. In this case, a titanium silicide layer is formed on the diffused layer. However, the present invention is not limited to this. Even when a nickel or cobalt silicide layer is formed, the same effect as described above can be obtained.

In this embodiment, hydrogen gas is mixed with silane gas as the second gas. However, hydrogen may be omitted. Boron trichloride is exemplified as a halide of boron. However, the present invention is not limited to this, and another halide such as boron trifluoride ($BF_3$) or boron tribromide ($BBr_3$) may also be used. Monosilane is exemplified as a silane-based gas. However, disilane ($Si_2H_6$), $SiH_2Cl_2$, $SiCl_4$, $SiF_4$, $Si_2H_4Cl_2$, $SiH_2F_2$, $Si_2H_2Cl_4$, $Si_2Cl_6$, $Si_2H_4F_2$, $Si_2H_2F_4$, or $Si_2F_6$ may also be used.

Decomposition of the gas can be executed not only by simple thermal decomposition but also by a combination with a method for promoting dissociation, e.g., light irradiation.

To cause the silicon crystal to receive the boron atoms in the deposited boron layer or B-doped silicon film, a thermal energy is applied. However, light, ions, or an electron beam energy may also be used to cause silicon to receive the boron atoms such that UV light is irradiated from the surface. Of these methods, the method of irradiating UV light from the surface can apply the energy to only the silicon surface. For this reason, the boron can be received by a portion near the surface without changing the impurity state except for the surface of the silicon substrate.

(15th Embodiment)

FIGS. 47A to 47D are sectional views of a MOS transistor, which sequentially show a method of manufacturing this transistor according to the 15th embodiment of the present invention.

As in the prior art, in an element region isolated by forming an element isolation insulating film 602 (insulating region) on the surface (conductive region) of an n-type silicon substrate 601 having a resistivity of 4 to 5 Ωcm, a polysilicon film 604 is formed through a silicon oxide film serving as a gate oxide film 603. Subsequently, the polysilicon film 604 is doped with an impurity by thermal diffusion or the like. A silicon oxide film 608 is deposited on the entire surface, and the silicon oxide film 608 and the polysilicon film 604 are patterned by RIE while leaving only the channel region, thereby forming the gate electrode 604.

The silicon oxide film 608 is further deposited on the upper layer and etched back by RIE to leave a silicon oxide film 608S on only the side wall of the gate electrode. Subsequently, the gate oxide film 603 on the diffused layer regions serving as source/drain regions is removed. Thereafter, the sample is dipped in an HF solution and washed in pure water with a dissolved oxygen amount of 10 ppm or less, thereby exposing a chemically active silicon surface (FIG. 47A).

If pure water with a large dissolved oxygen amount is used, a native oxide film is undesirably formed on the silicon surface during washing and subsequent drying processes. For this reason, etching cannot be uniformly performed, and no smooth etching surface can be obtained. Therefore, it is preferable to use pure water with a small dissolved oxygen amount of 10 ppm or less.

Thereafter, the sample is set in a vacuum apparatus constituted by connecting an etching chamber with a CVD chamber, which are connected to each other. First of all, the substrate is cooled or heated to a predetermined temperature of −196° to 300° C. in the etching chamber. At this time, to prevent formation of a native oxide film on the silicon surface, this process is performed in the vacuum at 0.1 Torr or less, or in an atmosphere supplied with argon at a flow rate of 100 to 5,000 cc/min. In this case, argon is used as a non-oxidizing gas. However, even when another non-oxidizing gas is used, the same effect as in argon gas can be obtained.

Carbon tetrafluoride ($CF_4$) is supplied at a flow rate of 1 to 500 cc/min. After the flow rate and the pressure are stabilized, carbon tetrafluoride is activated by microwave discharge, and generated radicals are supplied onto the sample. Silicon and fluorine radicals mainly react with each other on the silicon surface and eliminated from the silicon surface in a form of silicon tetrafluoride ($SiF_4$), and etching progresses. At this time, the etching rate was 1 to 20 nm/min (FIG. 47B).

In this manner, etching is performed to a desired depth. Thereafter, the sample is conveyed to the CVD chamber while being kept in the vacuum state. The substrate is heated to a predetermined deposition temperature of 300° to 800° C. while suppressing the oxidizing gas partial pressure to 0.1 Torr or less.

Dichlorosilane ($SiH_2Cl_2$) gas is supplied at a flow rate of 10 to 100 cc/min, and boron trichloride ($BCl_3$) is supplied at a flow rate of 0.1 to 100 cc/min. The dichlorosilane and boron trichloride are thermally decomposed on only the silicon surface, and a B-doped silicon film is selectively deposited (FIG. 47C). At this time, the deposition rate was 1 to 10 nm/min. The boron concentration in the deposited B-doped silicon film can be set to a desired concentration of $1 \times 10^{19}$ to $1 \times 10^{22}$ $cm^{-3}$ in accordance with the flow rate ratio of the dichlorosilane gas to the boron trichloride gas.

In this manner, deposition is continuously performed from etching. The oxygen amount adsorbed by the boundary between the silicon substrate and the B-doped silicon film changes in accordance with an atmosphere to which the silicon substrate is exposed. If the substrate is temporarily exposed to air, or if the sample is heated in an atmosphere with a large amount of an oxidizing gas such as oxygen and water, water or oxygen molecules are adsorbed by the etched silicon surface to promote oxidation.

FIG. 48 is a graph showing an analysis result of an oxygen concentration in a region including the boundary between the silicon substrate and the B-doped silicon film by SIMS (Secondary-Ion Mass Spectroscopy). When the silicon surface is oxidized during etching and deposition, a large amount of oxygen is detected at the boundary.

FIG. 49 is a graph showing the relationship between the oxygen partial pressure in the vacuum apparatus at 350° C. and the oxygen amount at the boundary between the silicon substrate and the B-doped silicon film after exposing the sample to the atmosphere for one hour. Referring to FIG. 49, when the oxygen partial pressure is 0.1 Torr or more, oxidation of the silicon surface progresses, and oxygen in an amount of $1 \times 10^{15}$ $cm^{-2}$ or more is detected.

Figure 50A:
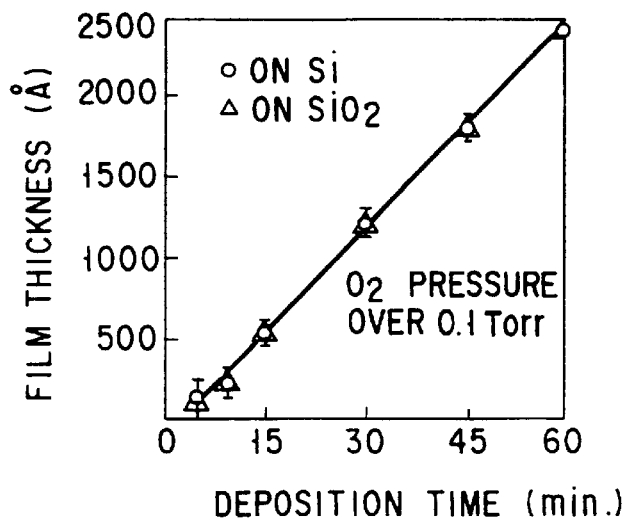

As described above, when the B-doped silicon film is grown on the oxidized silicon surface, not only no satisfactory selectivity can be obtained, as shown in FIG. 50A, but also the crystal of the B-doped silicon film on the silicon substrate becomes polycrystal. In addition, when such a native oxide film is present, diffusion of boron from the B-doped silicon film is impeded, resulting in a difficulty in impurity diffusion at a high controllability.

Figure 50B:
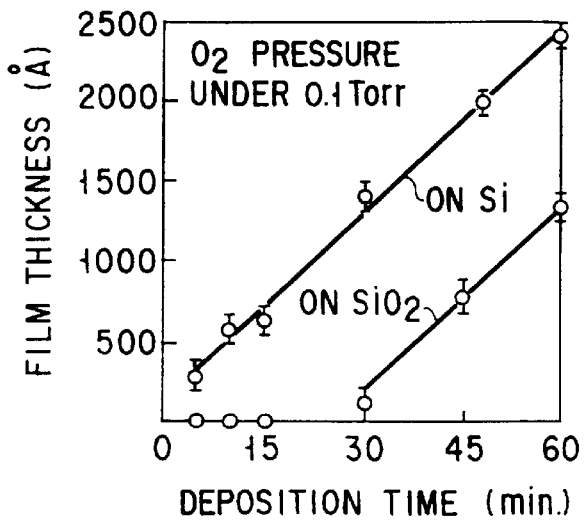

On the other hand, when the oxygen partial pressure is decreased to 0.1 Torr or less, oxidation of the silicon surface is suppressed to allow selective growth, as shown in FIG. 50B.

Particularly, when the oxygen amount at the boundary between the silicon substrate and the B-doped silicon film can be suppressed to $4 \times 10^{14}$ $cm^{-2}$ or less, the B-doped silicon film on the silicon substrate is epitaxially grown.

Figure 51:
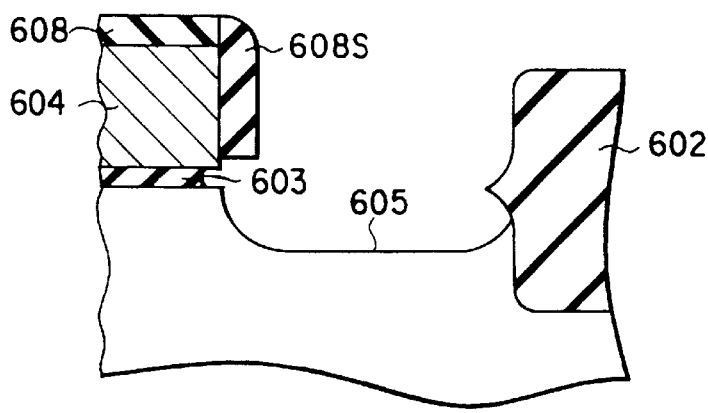
FIG. 51 is a view for explaining a defect which can occur when a surface oxide film is removed by etching.

Even for a silicon substrate whose surface is oxidized after etching, the oxygen amount adsorbed by the silicon substrate can be decreased to $4 \times 10^{14}$ $cm^{-2}$ by dipping the silicon substrate in an HF solution, rinsing the sample in pure water with a dissolved oxygen amount of 10 ppm or less, and performing deposition in the CVD apparatus. In this case, however, the gate oxide film 603 is also etched, as shown in FIG. 51. Therefore, etching and deposition are preferably continuously performed in the connected vacuum apparatus while suppressing the oxygen partial pressure to 0.1 Torr or less.

B-doped silicon films 607 deposited in this manner directly form diffused layers, as shown in FIG. 47C. When the etching depth was 50 nm, and a B-doped silicon film having boron at a concentration of $3 \times 10^{20}$ $cm^{-3}$ was grown to a thickness of 50 nm, the sheet resistance of the diffused layer was measured to be 120 Ω/□. For this sample, when the depth direction of boron was analyzed by SIMS, the junction depth coincided with the etching depth. In addition, it was confirmed that the boron concentration was abruptly decreased at the p-n junction boundary, and a concentration profile representing a steep change was obtained. According to this embodiment, oxidation and contamination of the silicon surface can be prevented, and a shallow, heavily doped diffused layer can be formed at a high controllability and selectivity.

The description of the manufacturing steps of a transistor will be continued. As shown in FIG. 47D, titanium is sputtered on the diffused layer, and annealing is performed at 700° C. for 30 seconds, thereby forming silicide layers 609. A silicon oxide film 610 is deposited by CVD, contact holes are formed by RIE, and aluminum films 611 serving as electrodes are deposited therein.

At this time, boron is diffused in the silicide layer during formation of the silicide layer. However, since the boron concentration of the B-doped silicon film 607 formed in FIG. 47C is sufficiently high, the boron concentration in the diffused layer serving as a source/drain layer is not so largely influenced even when boron is diffused into the silicide layer. In this case, a titanium silicide layer is formed on the diffused layer. However, the present invention is not limited to this. Even when a nickel or cobalt silicide layer is formed, the same effect as described above can be obtained.

In this embodiment, carbon tetrafluoride is used as an etching gas, and etching is performed using fluorine radicals generated upon microwave discharge. However, the present invention is not limited to this. A halogen-based etching gas such as a chlorine trifluoride ($ClF_3$), sulfur hexafluoride ($SF_6$), fluorine ($F_2$), and chlorine ($Cl_2$) may also be used.

Dichlorosilane ($SiH_2Cl_2$) is exemplified as a gas containing at least hydrogen and silicon for growing the B-doped silicon film. However, silane ($SiH_4$), $Si_2H_6$, $SiCl_4$, $Si_2F_4Cl_2$, $Si_2H_4Cl_2$, $SiH_2F_2$, $Si_2H_2Cl_4$, $Si_2Cl_6$, $Si_2H_4F_2$, $Si_2H_2F_4$, or $Si_2F_6$ may also be used. Boron trichloride ($BCl_3$) is exemplified as a gas containing a halide of a Group III element or a Group V element. However, $B_2H_6$ or BF may also be used. To form an n-type impurity diffused layer, the same effect as described above can be obtained by using $PH_3$ or $AsH_3$, or a halide containing phosphorus or arsenic.

Decomposition can also be executed not only by simple thermal decomposition but also by a combination with a method for promoting dissociation, e.g., light irradiation.

As has been described above, according to the third aspect of the present invention, an impurity deposited film or a silicon film containing an impurity at a desired concentration can be grown on only the conductive region of a sample at a high selectivity. In addition, a semiconductor layer serving as a shallow, low-resistance, heavily doped diffused layer can be formed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, comprising:

a substrate having a surface region comprising silicon, a gate insulating film formed on said surface region, a gate electrode formed on said gate insulating film, and source/drain regions formed by depositing doped silicon in grooves on opposite sides of said gate electrode, wherein said deposited doped silicon at a bottom of said grooves has a dopant concentration of $1 \times 10^{19}$ to $1 \times 10^{22}$ atoms/$cm^3$.

2. The device of claim 1, further comprising a side-wall insulating film on said opposite sides of said gate electrode, wherein a first edge portion of each of said grooves is immediately below said side-wall insulating film.

3. The device of claim 2, wherein said first edge portion of said grooves has a depth smaller than a second edge portion opposite said first edge portion of each of said grooves.

4. The device of claim 1, wherein the dopant concentration along the depth of said deposited doped silicon is substantially constant.

5. The device of claim 1, wherein said surface region comprising silicon has a dopant concentration of less than $1 \times 10^{17}$ atoms/$cm^3$.

\* \* \* \* \*